（12）United States Patent
Sano et al.

(10) Patent No.: US 11,973,026 B2
(45) Date of Patent: Apr. 30, 2024

(54) THREE-DIMENSIONAL MEMORY DEVICE INCLUDING STAIRLESS WORD LINE CONTACT STRUCTURES AND METHOD OF MAKING THE SAME

(71) Applicant: SANDISK TECHNOLOGIES LLC, Addison, TX (US)

(72) Inventors: Michiaki Sano, Yokkaichi (JP); Koichi Ito, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 315 days.

(21) Appl. No.: 17/684,922

(22) Filed: Mar. 2, 2022

(65) Prior Publication Data

US 2022/0189872 A1    Jun. 16, 2022

Related U.S. Application Data

(63) Continuation-in-part of application No. 16/918,463, filed on Jul. 1, 2020, now Pat. No. 11,495,612.

(51) Int. Cl.
*H10B 41/27*    (2023.01)
*H01L 23/522*   (2006.01)
(Continued)

(52) U.S. Cl.
CPC ...... *H01L 23/5226* (2013.01); *H01L 23/5283* (2013.01); *H10B 41/10* (2023.02);
(Continued)

(58) Field of Classification Search
None
See application file for complete search history.

(56) References Cited

U.S. PATENT DOCUMENTS 5,915,167 A    6/1999 Leedy
9,236,392 B1   1/2016 Izumi et al.
(Continued)

FOREIGN PATENT DOCUMENTS

WO    WO 2022/005681 A1    1/2022

OTHER PUBLICATIONS

USPTO Office Communication, Non-Final Office Action for U.S. Appl. No. 16/918,463, dated Mar. 17, 2022, 22 pages.
(Continued)

*Primary Examiner* — Hsien Ming Lee
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, memory openings located in a memory array region and vertically extending through the alternating stack, memory opening fill structures located in the memory openings, and laterally-isolated contact via assemblies located in a contact region. Each of the laterally-isolated contact via assemblies includes a contact via structure contacting a top surface of a respective one of the electrically conductive layers and an insulating spacer laterally surrounding the contact via structure and having an outer surface having a corrugated vertical cross-sectional profile in which first portions of the insulating spacer located at levels of the electrically conductive layers laterally protrude outward relative to second portions of the insulating spacer located at levels of the insulating layers.

20 Claims, 83 Drawing Sheets

(51) Int. Cl.
  *H01L 23/528*     (2006.01)
  *H10B 41/10*      (2023.01)
  *H10B 41/35*      (2023.01)
  *H10B 43/10*      (2023.01)
  *H10B 43/27*      (2023.01)
  *H10B 43/35*      (2023.01)

(52) U.S. Cl.
  CPC ............. *H10B 41/27* (2023.02); *H10B 41/35* (2023.02); *H10B 43/10* (2023.02); *H10B 43/27* (2023.02); *H10B 43/35* (2023.02)

(56) References Cited

U.S. PATENT DOCUMENTS

| | | | |
|---|---|---|---|
| 9,601,502 | B2 | 3/2017 | Sano et al. |
| 9,754,963 | B1 | 9/2017 | Kawamura et al. |
| 9,853,038 | B1 | 12/2017 | Cui |
| 9,905,573 | B1 | 2/2018 | Mada et al. |
| 9,960,181 | B2 | 5/2018 | Cui et al. |
| 10,181,442 | B1 | 1/2019 | Watanabe et al. |
| 10,192,877 | B2 | 1/2019 | Norizuki et al. |
| 10,211,215 | B1 | 2/2019 | Ishii et al. |
| 10,217,746 | B1 | 2/2019 | Kim et al. |
| 10,256,245 | B2 | 4/2019 | Ariyoshi |
| 10,304,852 | B1 | 5/2019 | Cui et al. |
| 10,937,801 | B2 | 3/2021 | Otsu et al. |
| 11,049,876 | B2 | 6/2021 | Kaminaga et al. |
| 2016/0307912 | A1* | 10/2016 | Izumi ................ H01L 21/76897 |
| 2016/0322374 | A1 | 11/2016 | Sano et al. |
| 2018/0061850 | A1 | 3/2018 | Mada et al. |
| 2018/0261611 | A1 | 9/2018 | Norizuki et al. |
| 2018/0261613 | A1 | 9/2018 | Ariyoshi |
| 2019/0088672 | A1 | 3/2019 | Tomimatsu et al. |
| 2019/0229125 | A1 | 7/2019 | Zhou et al. |
| 2019/0252396 | A1 | 8/2019 | Mushiga et al. |
| 2019/0252403 | A1 | 8/2019 | Kaminaga et al. |
| 2019/0252404 | A1 | 8/2019 | Kaminaga et al. |
| 2020/0035694 | A1 | 1/2020 | Kaminaga |
| 2020/0127005 | A1 | 4/2020 | Otsu et al. |
| 2020/0312865 | A1 | 10/2020 | Ge et al. |
| 2021/0210424 | A1 | 7/2021 | Otsu et al. |
| 2021/0366920 | A1 | 11/2021 | Tokita et al. |
| 2021/0366924 | A1 | 11/2021 | Tokita et al. |
| 2022/0005818 | A1 | 1/2022 | Tanaka et al. |
| 2022/0005824 | A1 | 1/2022 | Tanaka et al. |

OTHER PUBLICATIONS

Endoh, T. et al., "Novel Ultra High-Density Flash Memory with A Stacked-Surrounding Gate Transistor (S-GT) Structured Cell," IEDM Proc., pp. 33-36, (2001).
Notification of Transmittal of the International Search Report and the Written Opinion of the International Searching Authority for International Patent Application No. PCT/US2021/035466, dated Sep. 13, 2021, 14 pages.
U.S. Appl. No. 17/081,458, filed Oct. 27, 2020, SanDisk Technologies LLC.
U.S. Appl. No. 17/244,258, filed Apr. 29, 2021, SanDisk Technologies LLC.
U.S. Appl. No. 17/244,311, filed Apr. 29, 2021, SanDisk Technologies LLC.
U.S. Appl. No. 17/328,302, filed May 24, 2021, SanDisk Technologies LLC.
U.S. Appl. No. 17/355,883, filed Jun. 23, 2021, SanDisk Technologies LLC.
U.S. Appl. No. 17/462,446, filed Aug. 31, 2021, SanDisk Technologies LLC.

* cited by examiner

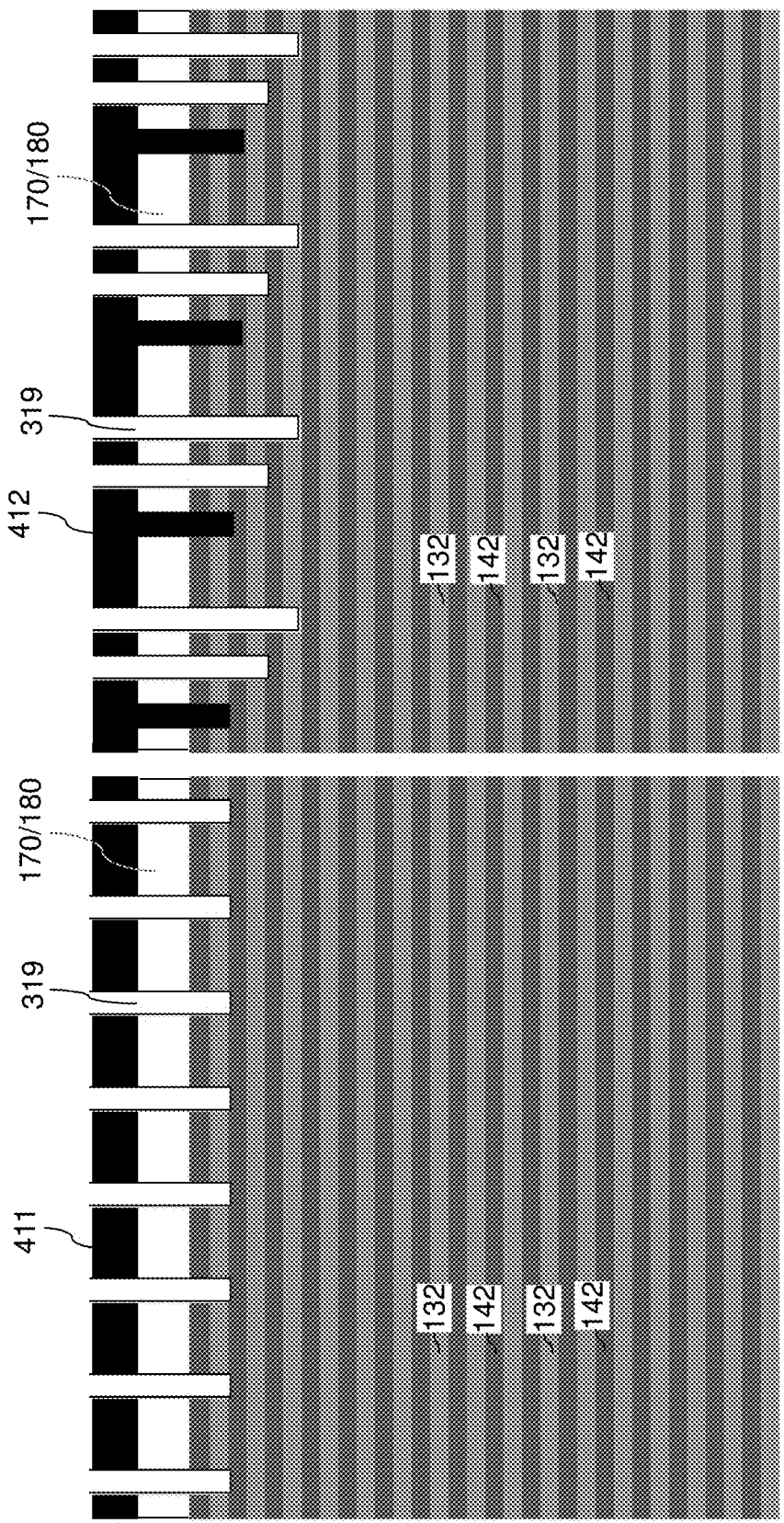

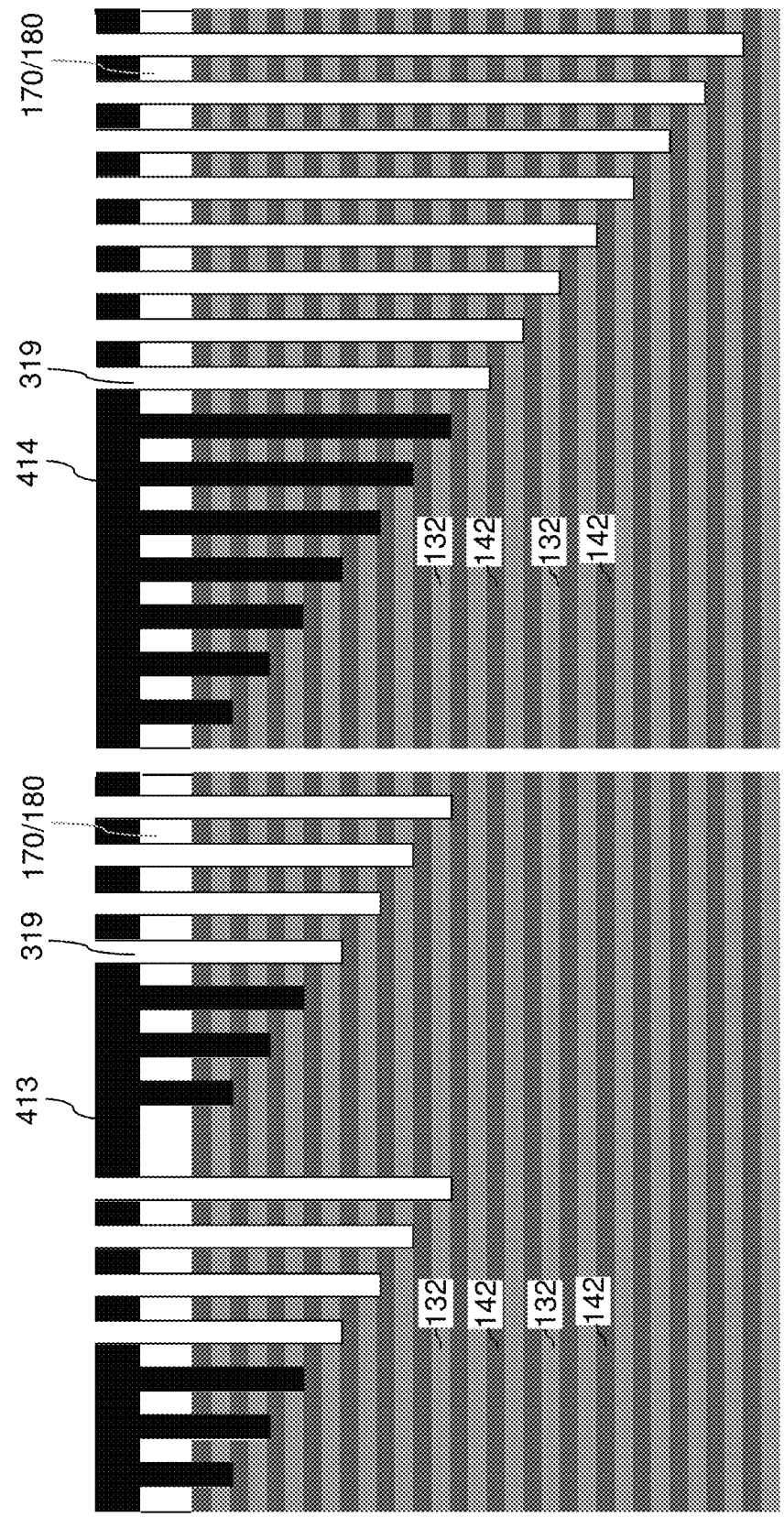

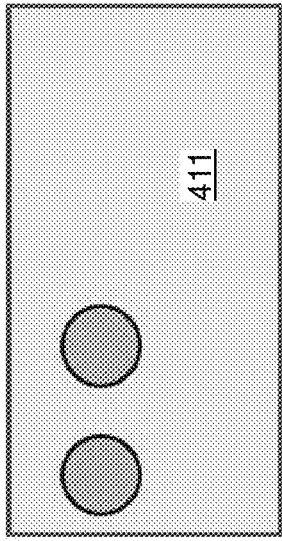
FIG. 6A
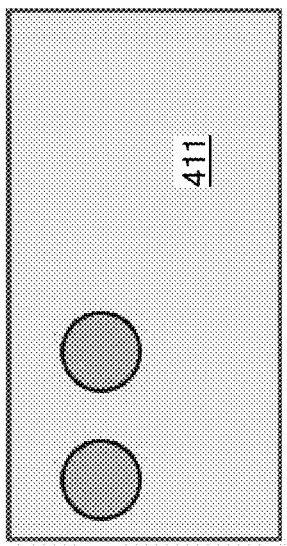
FIG. 7A
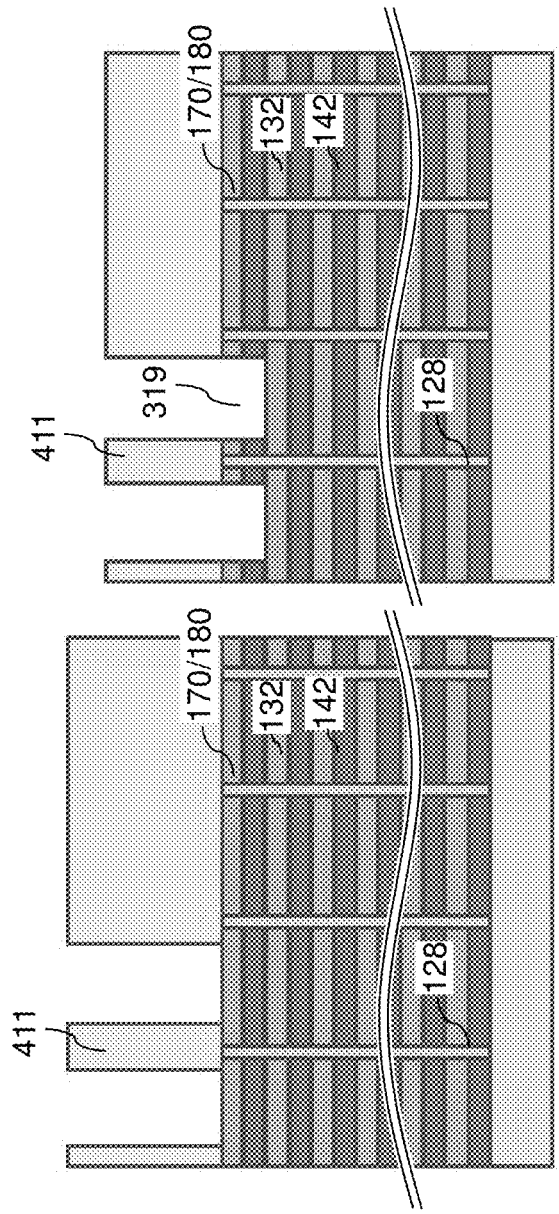

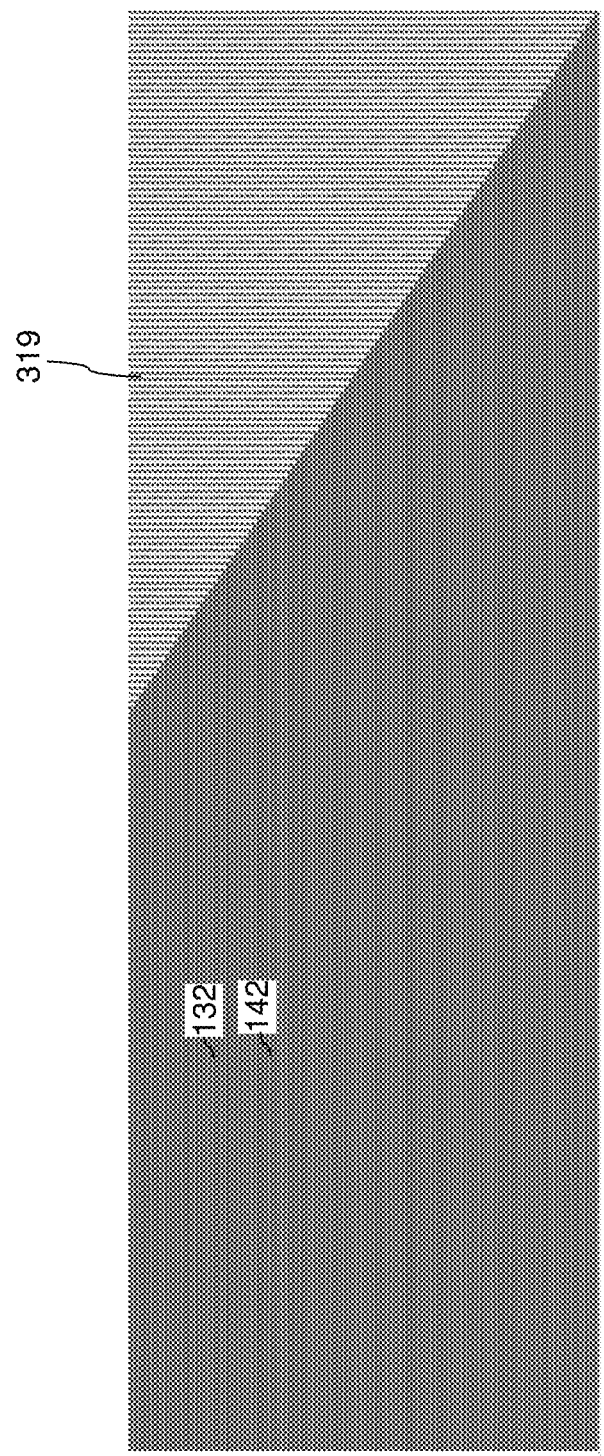

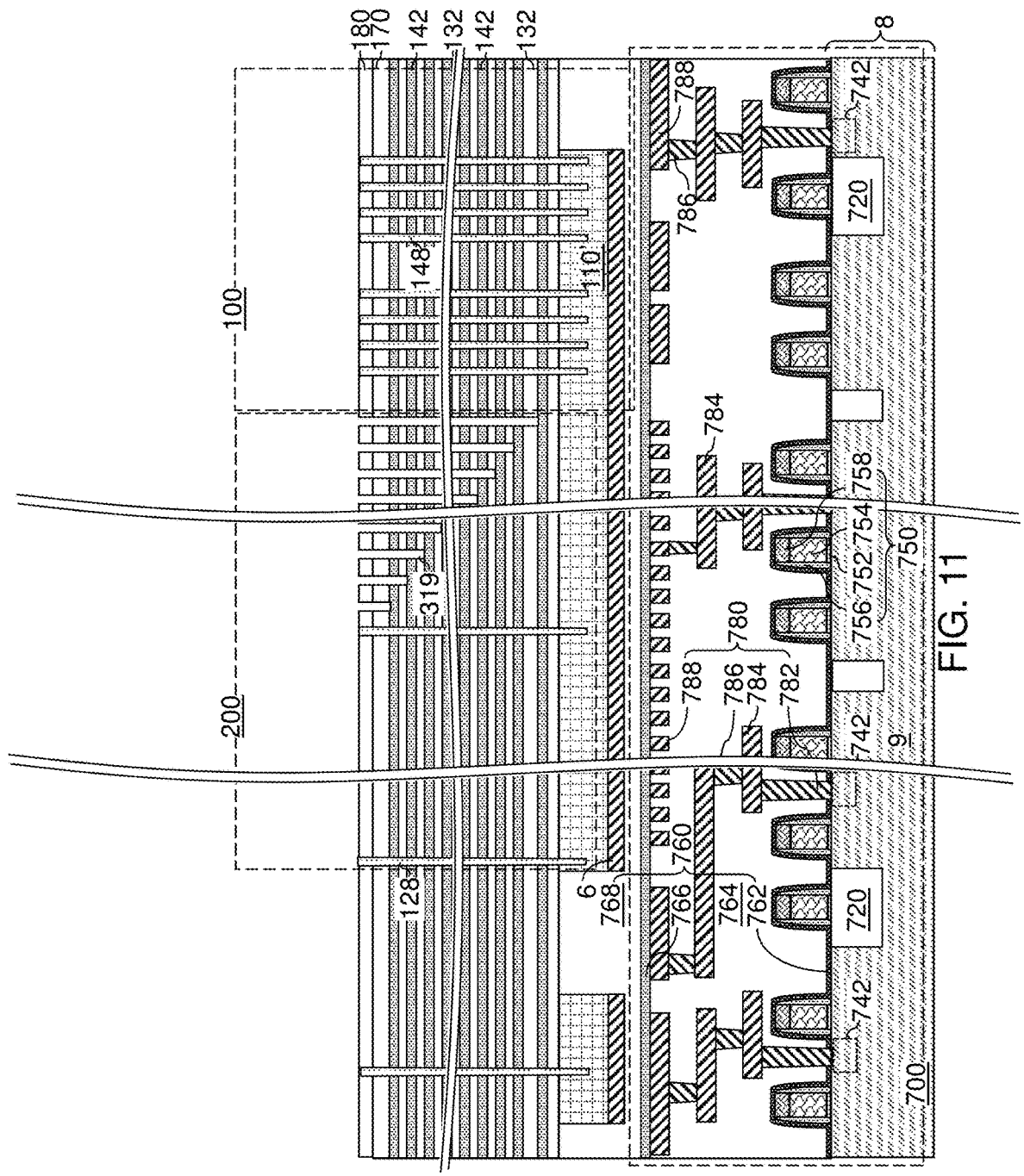

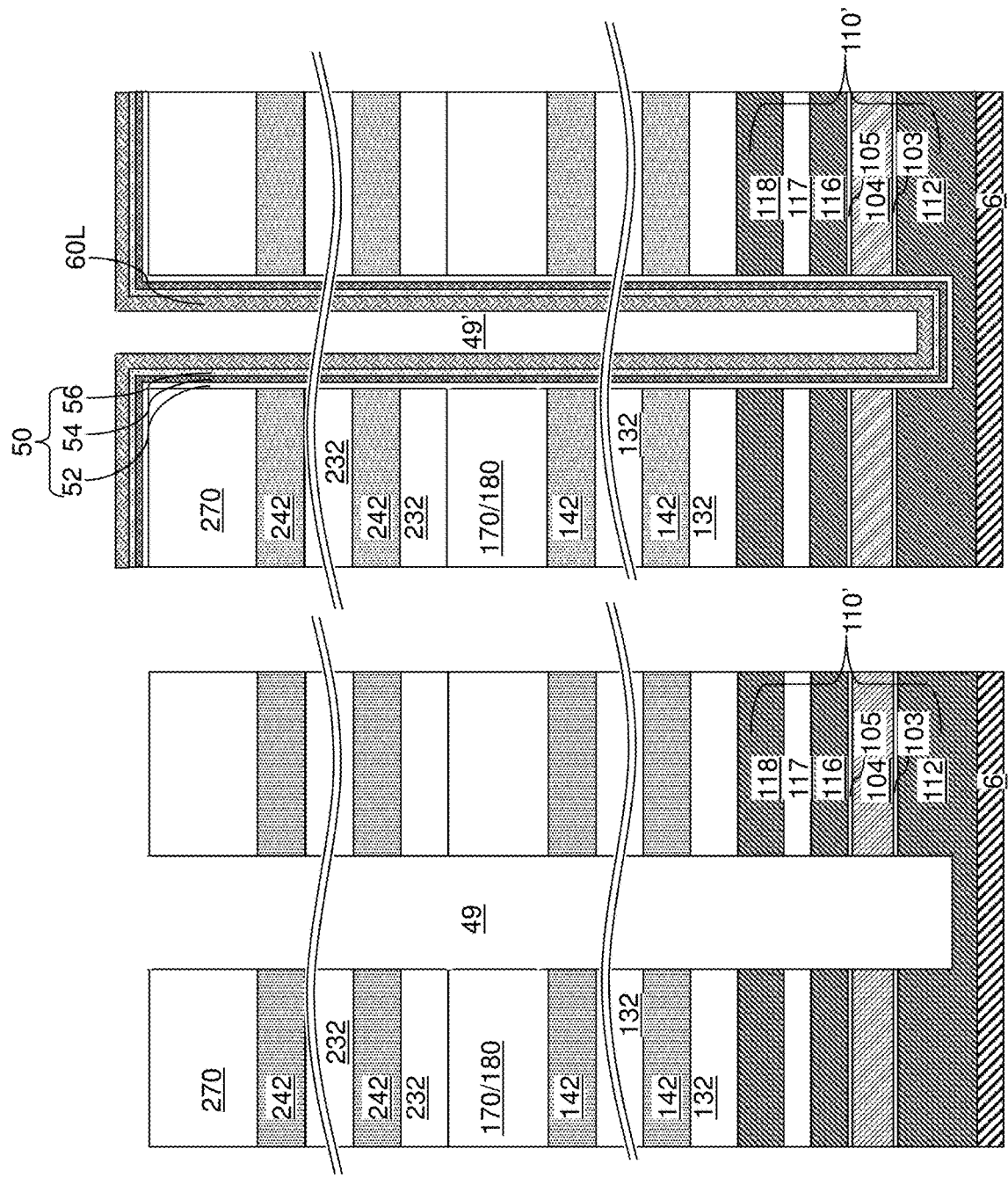

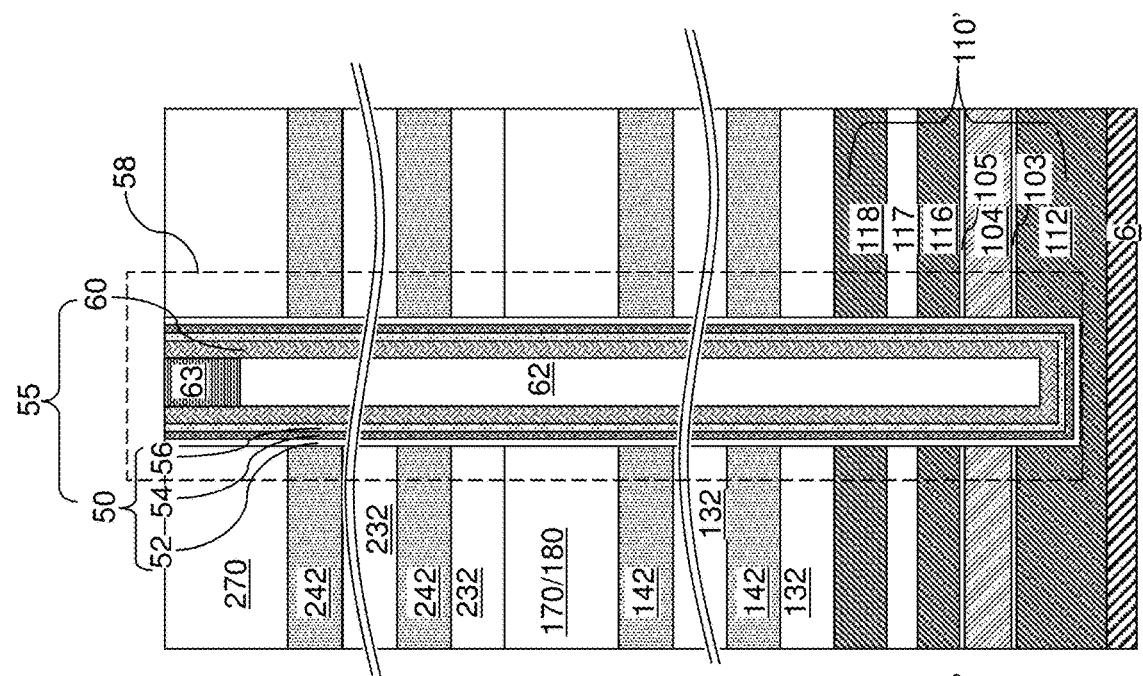
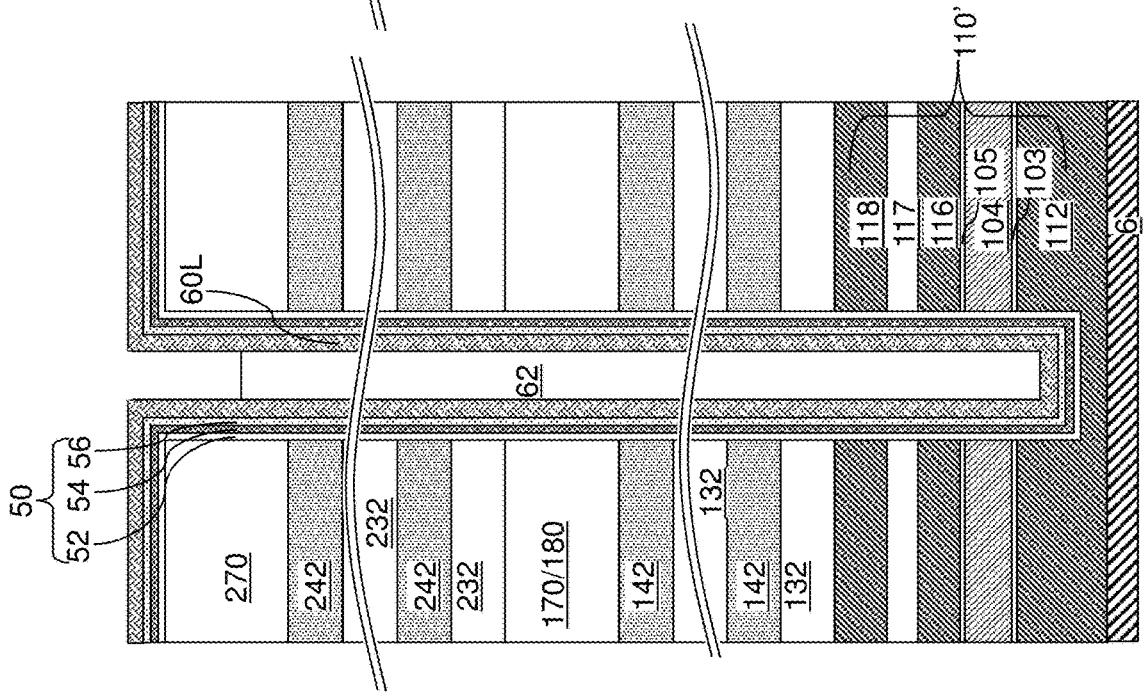

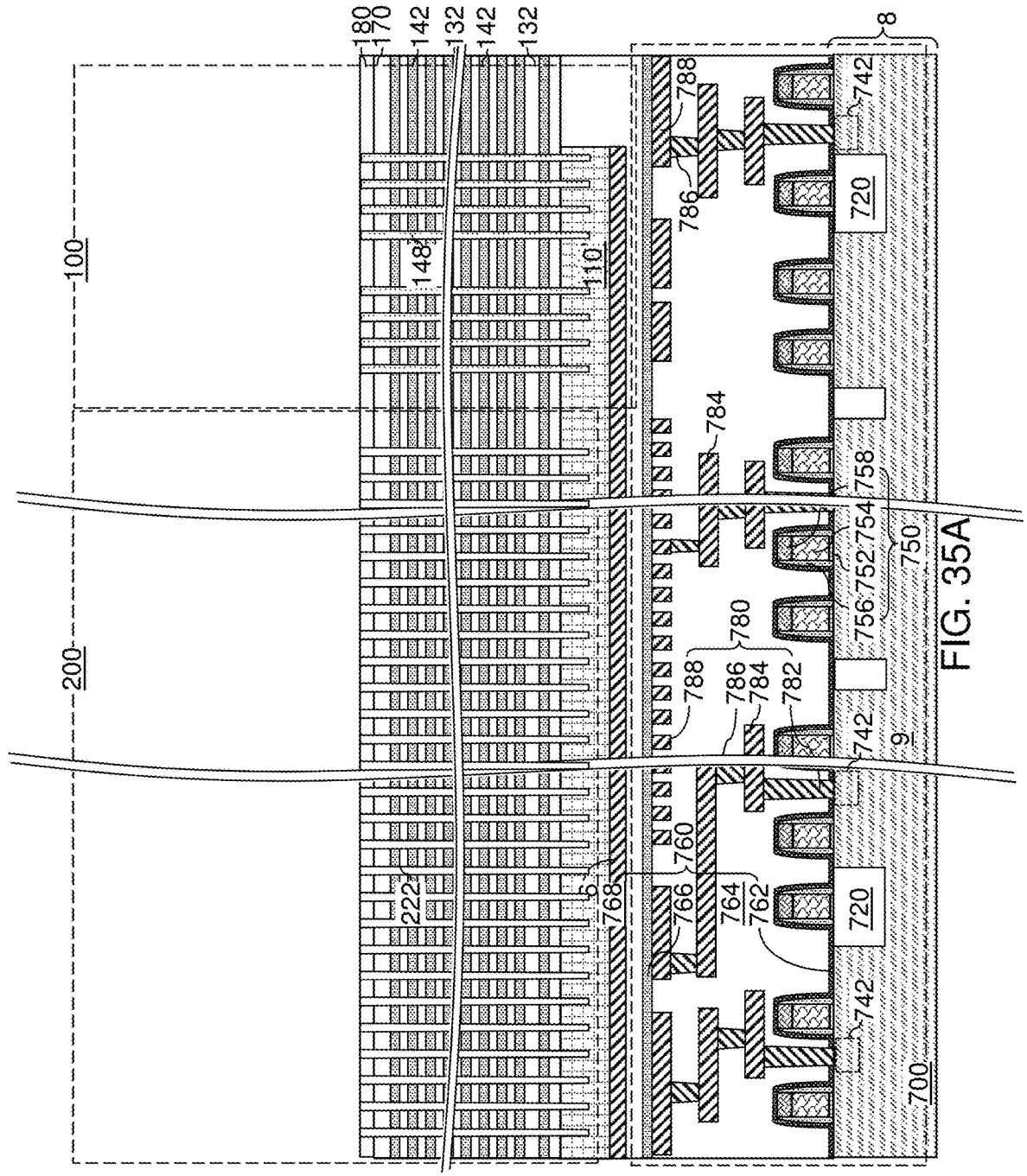

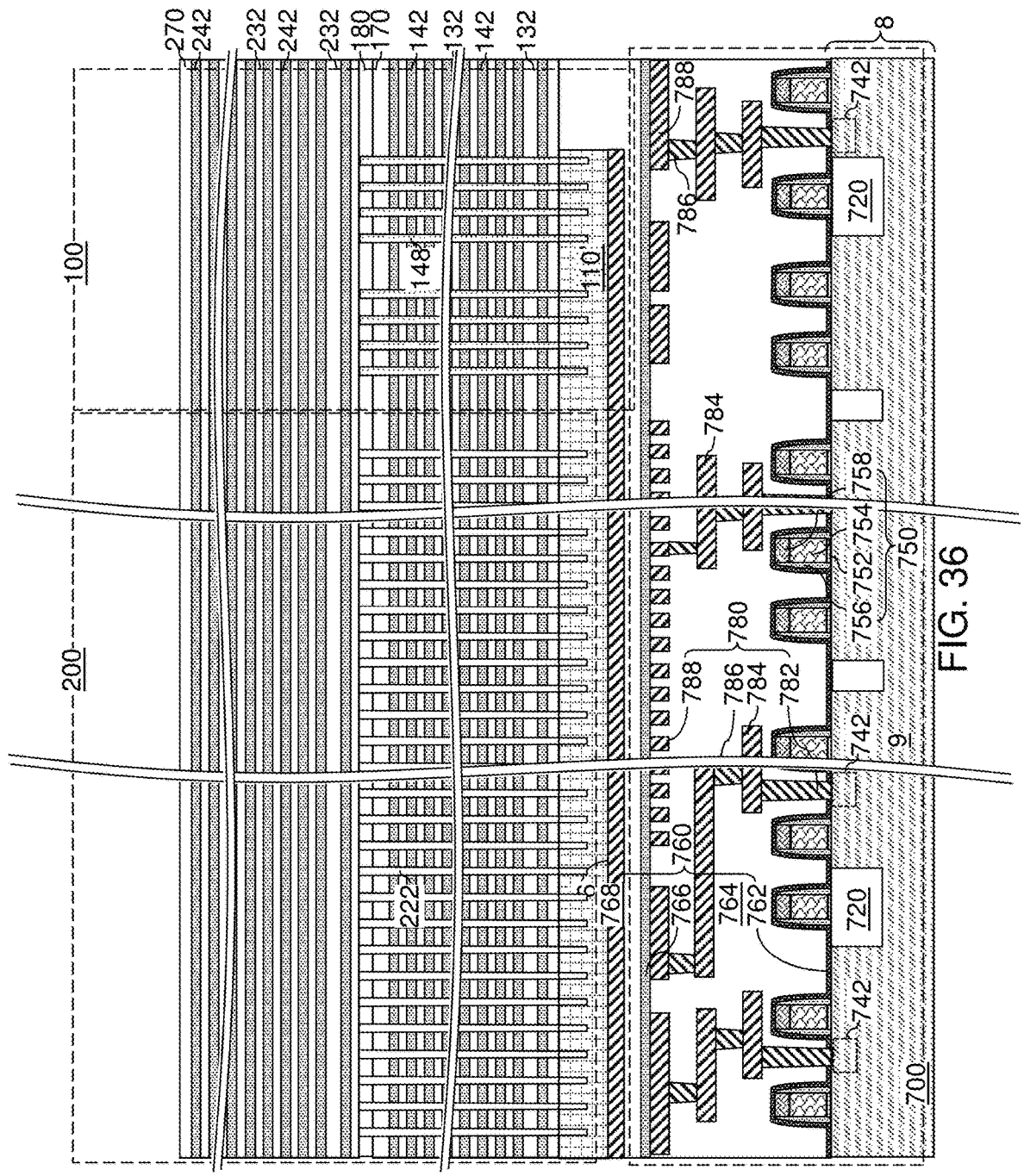

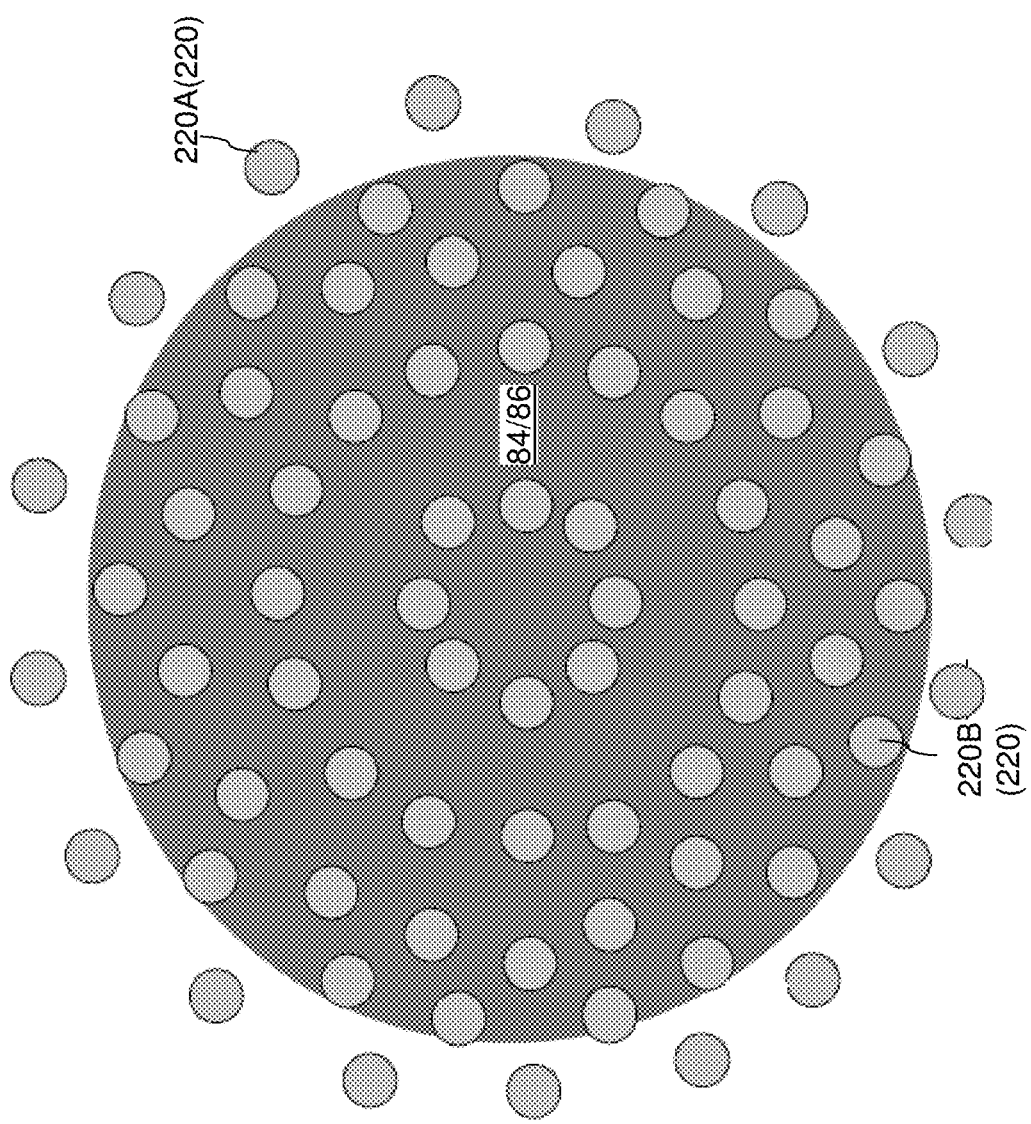

THREE-DIMENSIONAL MEMORY DEVICE INCLUDING STAIRLESS WORD LINE CONTACT STRUCTURES AND METHOD OF MAKING THE SAME

RELATED APPLICATIONS

This application is a continuation-in-part (CIP) application of the U.S. application Ser. No. 16/918,463 filed on Jul. 1, 2020, the entire contents of which are incorporated herein by reference.

FIELD

The present disclosure relates generally to the field of semiconductor devices, and particularly to a three-dimensional memory device including stairless word line contact structures and methods of manufacturing and move the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory openings located in a memory array region and vertically extending through the alternating stack; memory opening fill structures located in the memory openings; and laterally-isolated contact via assemblies located in a contact region, wherein each of the laterally-isolated contact via assemblies comprises a contact via structure contacting a top surface of a respective one of the electrically conductive layers and a dielectric spacer laterally surrounding the contact via structure and having an outer surface having a corrugated vertical cross-sectional profile in which first portions of the dielectric spacer located at levels of the electrically conductive layers laterally protrude outward relative to second portions of the dielectric spacer located at levels of the insulating layers.

According to another aspect of the present disclosure, a method of forming a three-dimensional memory device is provided, which comprises: forming an alternating stack of insulating layers and sacrificial material layers over a substrate; forming memory openings through the alternating stack in a memory array region; forming memory opening fill structures comprising a memory film and a vertical semiconductor channel in the memory openings; forming via cavities in a contact region through a respective subset of layers within the alternating stack by performing anisotropic etch processes; forming via cavity fill structures in the via cavities, wherein each of the via cavity fill structures comprises a dielectric spacer and a sacrificial via fill material portion embedded within the dielectric spacer which completely fill the via cavities; replacing the sacrificial material layers with electrically conductive layers while the via cavities are completely filled with the via cavity fill structures; removing the sacrificial via fill material portions selective to the dielectric spacers; and forming contact via structures vertically extending through a bottom portion of a respective one of the dielectric spacers to a top surface of a respective underlying one of the electrically conductive layers.

According to an embodiment of the present disclosure, a method of forming a semiconductor device is provided, which comprises: forming an alternating stack of insulating layers and sacrificial material layers over a substrate; forming memory openings through the alternating stack; forming memory opening fill structures in the memory openings; forming via cavities vertically extending through the alternating stack without forming any stepped surfaces in the alternating stack; forming sacrificial via fill structures in the via cavities; replacing the sacrificial material layers with electrically conductive layers; forming voids in volumes of the via cavities by removing the sacrificial via fill structures; forming tubular dielectric spacers on sidewalls of the via cavities; and forming contact via structures in remaining volumes of the via cavities on an inner sidewall of a respective one of the tubular dielectric spacers and directly on a top surface of a respective one of the electrically conductive layers.

According to another embodiment of the present disclosure, a three-dimensional memory device is provided, which comprises: an alternating stack of insulating layers and electrically conductive layers located over a substrate; memory openings located in a memory array region and vertically extending through the alternating stack and including memory opening fill structures therein; laterally-isolated contact via assemblies located in a contact region that is located adjacent to the memory array region, wherein each of the laterally-isolated contact via assemblies comprises a contact via structure contacting a top surface of a respective one of the electrically conductive layers and a tubular dielectric spacer laterally surrounding the contact via structure, wherein each contact via structure other than a contact via structure contacting a topmost one of the electrically conductive layers extends through and is laterally surrounded by each electrically conductive layer that overlies the respective electrically conductive layer, and wherein the alternating stack is free of stepped surfaces within the contact region.

According to yet another aspect of the present disclosure, a three-dimensional memory device is provided, which comprises: an alternating stack of insulating layers and electrically conductive layers located over a substrate; memory openings located in a memory array region and vertically extending through the alternating stack; memory opening fill structures located in the memory openings, vertically extending through the alternating stack, and comprising a dielectric material; and laterally-isolated contact via assemblies located in the contact region, wherein each of the laterally-isolated contact via assemblies comprises a contact via structure contacting a top surface of a respective one of the electrically conductive layers and a tubular dielectric spacer laterally surrounding the contact via structure, wherein the support pillar structures comprise: first support pillar structures that vertically extend through each layer within the alternating stack; and second support pillar structures that are shorter than the first support pillar structures and contacting a respective one of the laterally-isolated contact via assemblies.

According to still another aspect of the present disclosure, a method of forming a three-dimensional memory device is provided, which comprises: forming an alternating stack of insulating layers and sacrificial material layers over a substrate; forming memory openings through the alternating stack in a memory array region; forming memory opening fill structures in the memory openings; forming support pillar structures through the alternating stack in a contact region; forming via cavities in the contact region by performing anisotropic etch processes, wherein first support pillar structures of the support pillar structures are not etched by the anisotropic etch processes, and top portions of the second support pillar structures of the support pillar structures are etched by the anisotropic etch processes; forming sacrificial via fill structures in the via cavities; replacing the sacrificial material layers with electrically conductive layers; forming voids in volumes of the via cavities by removing the sacrificial via fill structures; forming tubular dielectric spacers on sidewalls of the via cavities; and forming contact via structures in remaining volumes of the via cavities on an inner sidewall of a respective one of the tubular dielectric spacers and directly on a top surface of a respective one of the electrically conductive layers.

BRIEF DESCRIPTION OF THE DRAWINGS

FIGS. 5A-5D illustrate vertical cross-sectional views of a contact region in the first exemplary structure during formation of first via cavities according to the first embodiment of the present disclosure.

FIG. 6A is a top-down view of a portion of the contact region after patterning a first photoresist layer according to an embodiment of the present disclosure.

FIG. 6B is a vertical cross-sectional view of the structure of FIG. 6A.

FIG. 7A is a top-down view of a portion of the contact region after a first anisotropic etch process according to an embodiment of the present disclosure.

FIG. 7B is a vertical cross-sectional view of the structure of FIG. 7A.

FIG. 10 is a vertical cross-sectional view of the contact region of the first exemplary structure after formation of first via cavities according to the first embodiment of the present disclosure.

FIG. 11 is a vertical cross-sectional view of the first exemplary structure after formation of the first via cavities according to the first embodiment of the present disclosure.

FIGS. 16A-16D illustrate sequential vertical cross-sectional views of a memory opening during formation of a memory opening fill structure according to the first embodiment of the present disclosure.

FIG. 35A is a vertical cross-sectional view of the second exemplary structure after formation of first-tier support pillar structures according to the second embodiment of the present disclosure.

FIG. 36 is a vertical cross-sectional view of the second exemplary structure after formation of a second-tier alternating stack of second insulating layers and second spacer material layers according to the second embodiment of the present disclosure.

FIG. 49 is a see-through top-down view of a contact via structure and support pillar structures in a second alternative configuration of the second exemplary structure according to the second embodiment of the present disclosure.

DETAILED DESCRIPTION

Figure 1A:
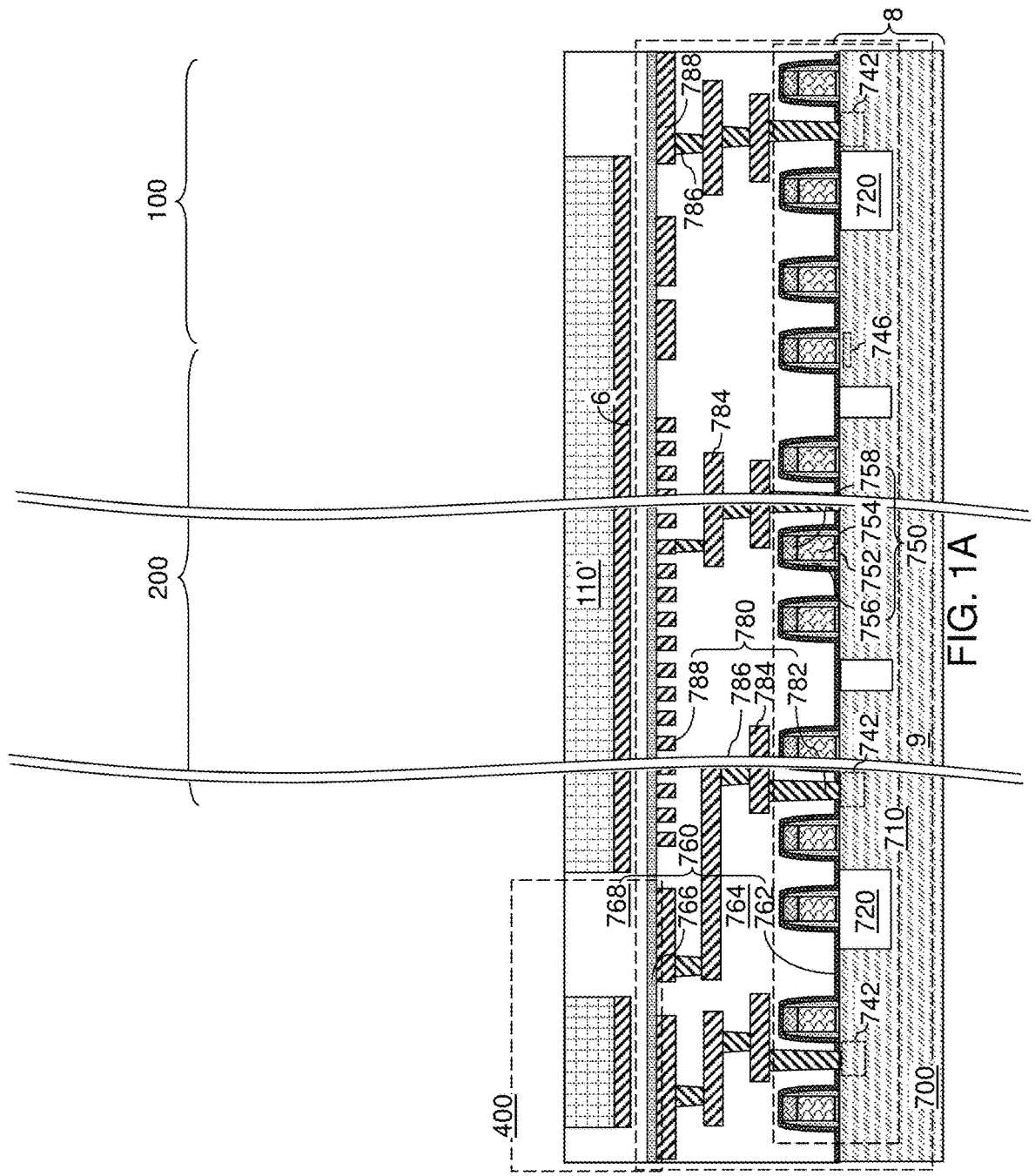
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

Embodiments of the present disclosure are directed to three-dimensional memory devices including stairless word line contact structures and methods of manufacturing the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
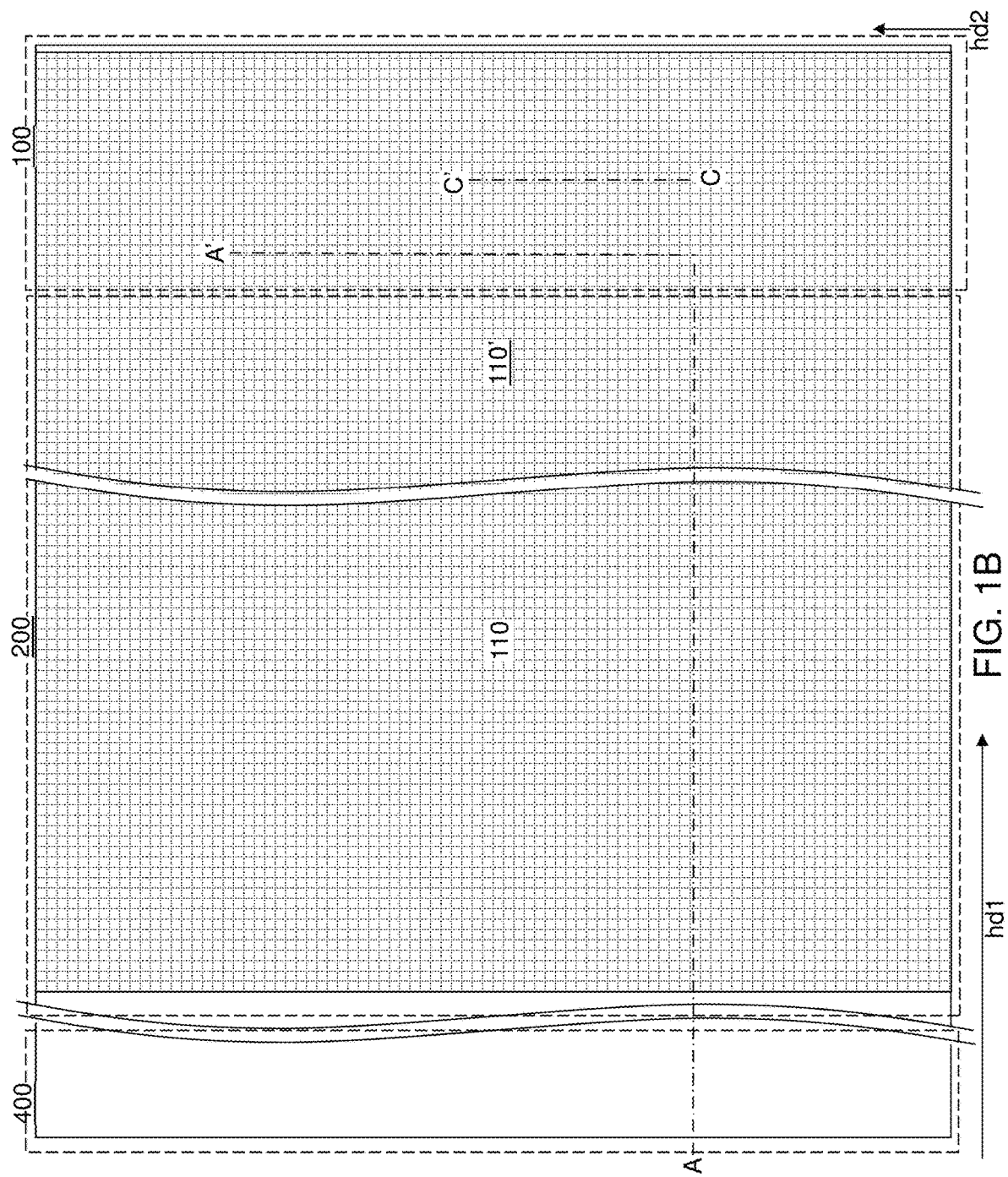
FIG. 1B is a top-down view of the first exemplary structure of FIG. 1A. The hinged vertical plane A-A' is the plane of the vertical cross-sectional view of FIG. 1A.
Figure 1C:
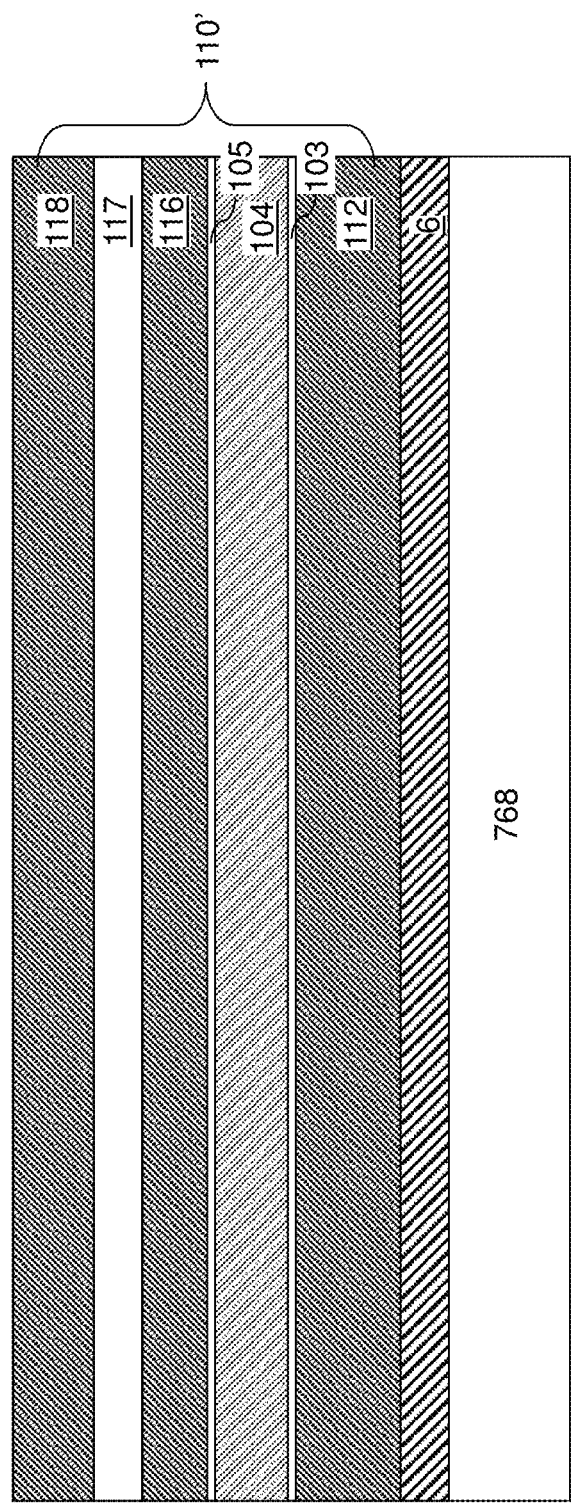
FIG. 1C is a magnified view of the in-process source level material layers along the vertical plane C-C' of FIG. 1B.

Referring to FIGS. 1A-1C, a first exemplary structure according to an embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a contact region 200 in which contact via structures contacting word line electrically conductive layers are to be subsequently formed. In one embodiment, the contact region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the contact region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
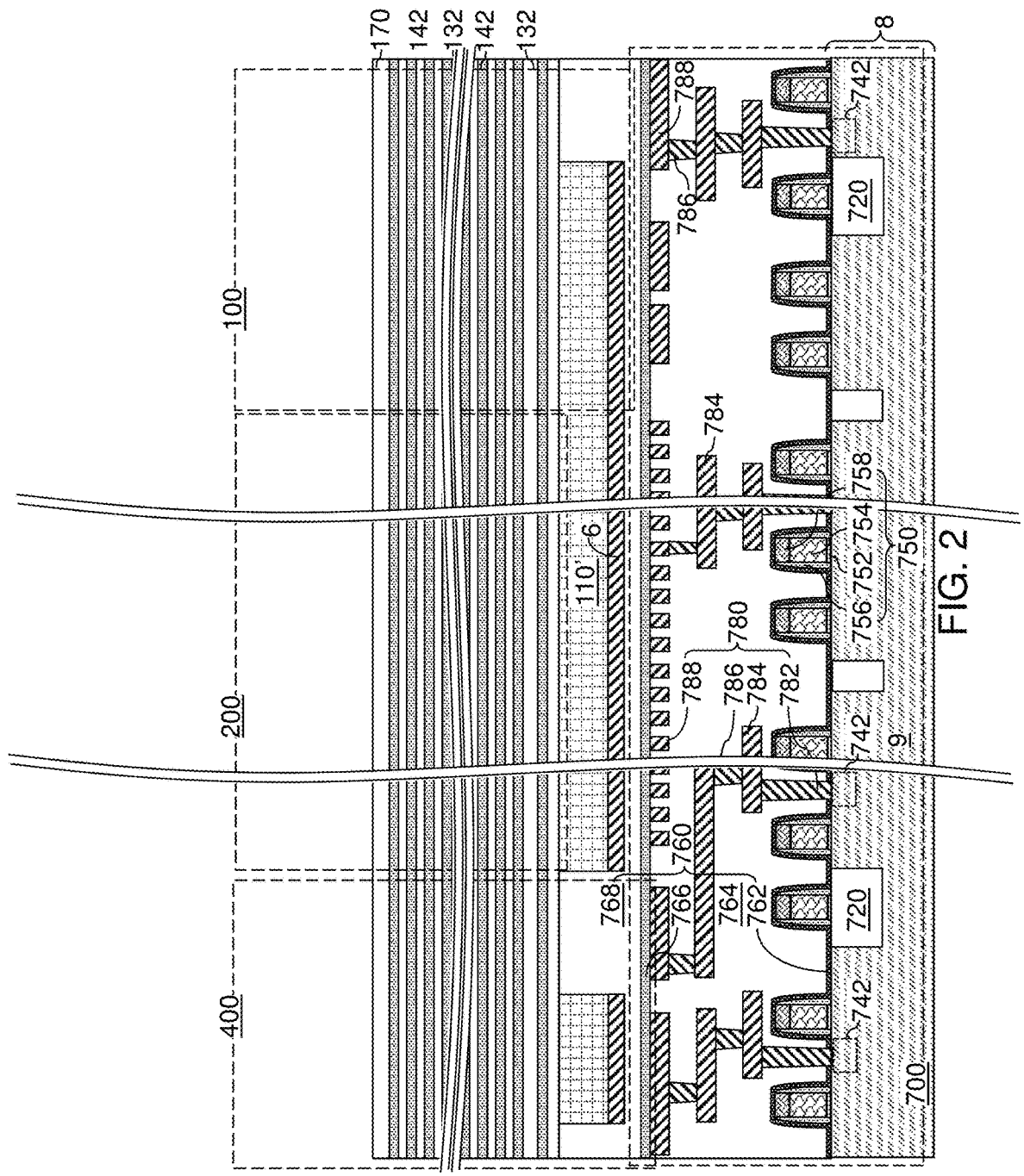
FIG. 2 is a vertical cross-sectional view of the first exemplary structure after formation of a first-tier alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

An inter-tier dielectric layer 180 may be optionally deposited over the first-tier structure (132, 142, 170). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 3:
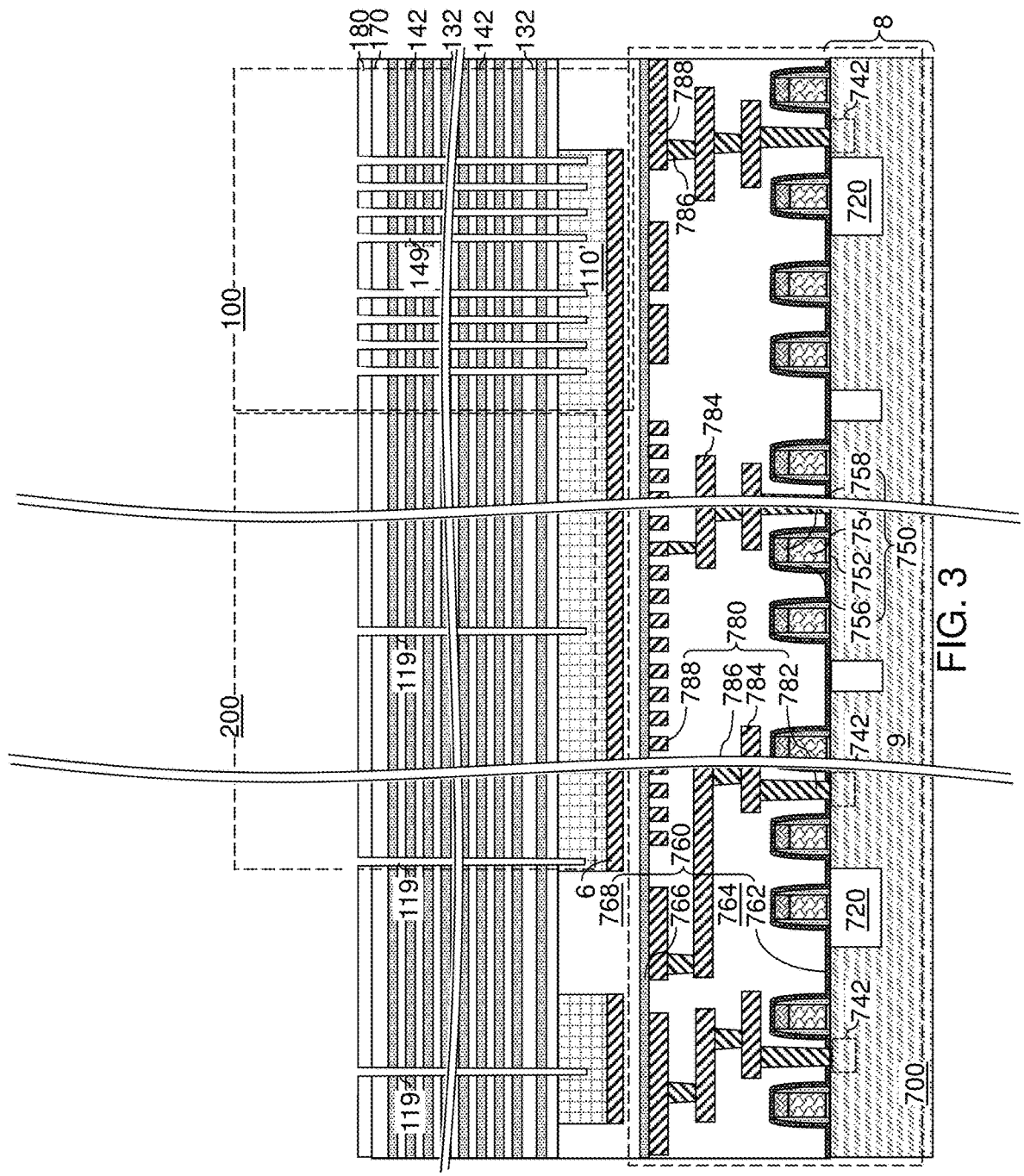
FIG. 3 is a vertical cross-sectional view of the first exemplary structure after formation of first-tier memory openings and first-tier support openings according to the first embodiment of the present disclosure.

Referring to FIG. 3, various first-tier openings (149, 129) may be formed through the inter-tier dielectric layer 180 and the first-tier structure (132, 142, 170) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149. The first-tier support openings 129 are openings that are formed in the contact region 200, and are subsequently employed to form support pillar structures.

The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 4:
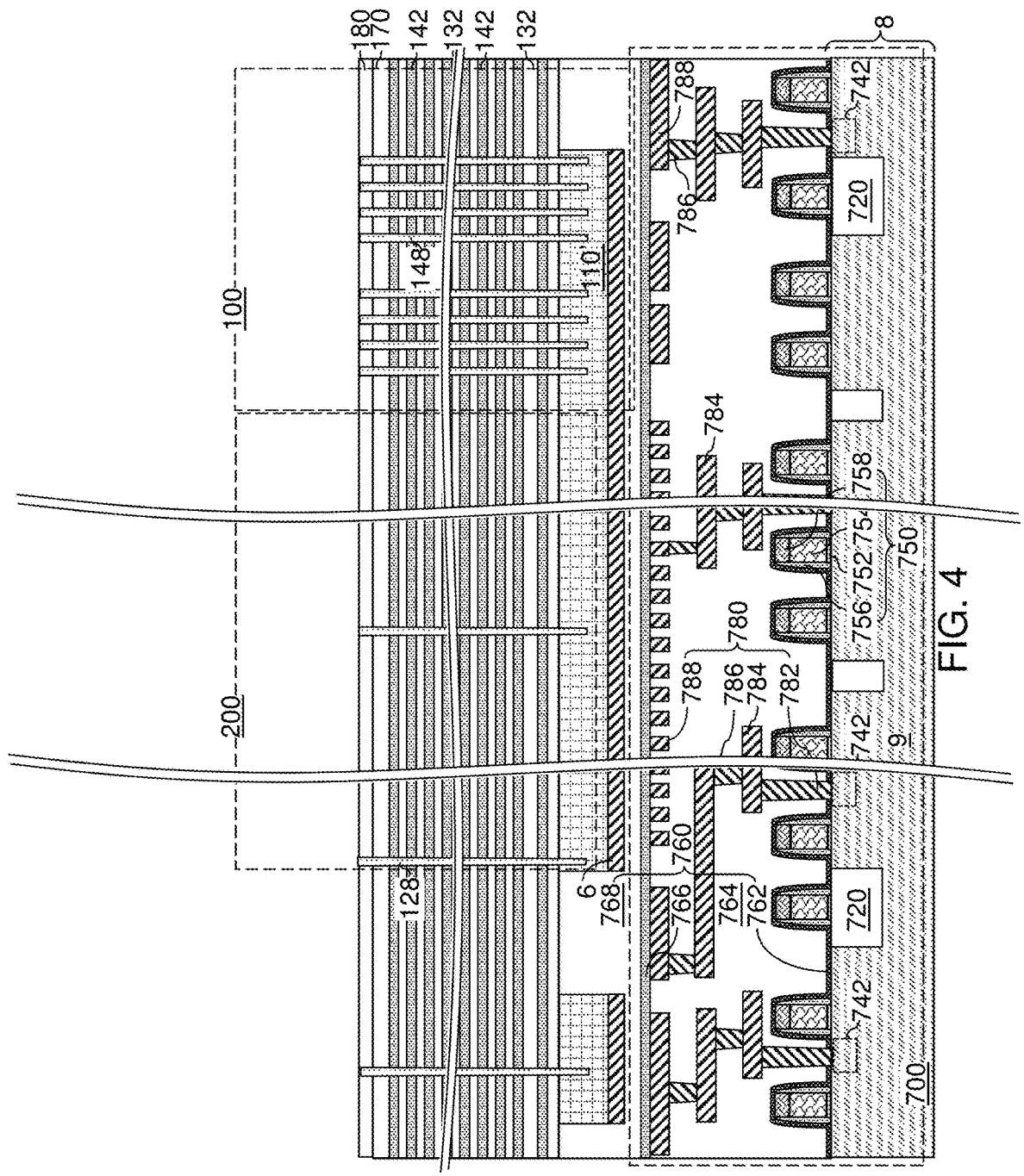
FIG. 4 is a vertical cross-sectional view of the first exemplary structure after formation of various sacrificial fill structures according to the first embodiment of the present disclosure.

Referring to FIG. 4, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

FIGS. 5A-5D illustrate structural changes in the contact region 200 of the first exemplary structure during formation of first via cavities 319. The sacrificial first-tier support opening fill portion 128 are not illustrated in FIGS. 5A-5D for clarity. FIGS. 6A-9B provide additional views of the contact region 200 of the first exemplary structure during formation of first via cavities 319. The sacrificial first-tier support opening fill portion 128 are illustrated in FIGS. 6A-9B.

Referring to FIGS. 5A, 6A, and 6B, a first masking layer 411, such as a first photoresist and/or hard mask layer can be applied over the inter-tier dielectric layer 180, and can be lithographically patterned to form openings therethrough.

Referring to FIGS. 5A, 7A, and 7B, a first anisotropic etch process can be performed to transfer the pattern of the openings in the first masking layer 411 through the inter-tier dielectric layer 180, the first insulating cap layer 170, a topmost first sacrificial material layer 142, and a topmost first insulating layer 132. In one embodiment, the first insulating layers 132, the first insulating cap layer 170, and the inter-tier dielectric layer 180 can include silicon oxide, and the first sacrificial material layers 142 can include silicon nitride. In this case, the first anisotropic etch process can include a first anisotropic etch step that etches silicon oxide selective to silicon nitride, a second anisotropic etch process that etches silicon nitride selective to silicon oxide, and a third anisotropic etch process that etches silicon oxide selective to silicon nitride. First via cavities 319 are formed underneath the openings in the first masking layer 411. The first masking layer 411 can be subsequently removed, for example, by ashing and/or selective etching.

Figure 8A:
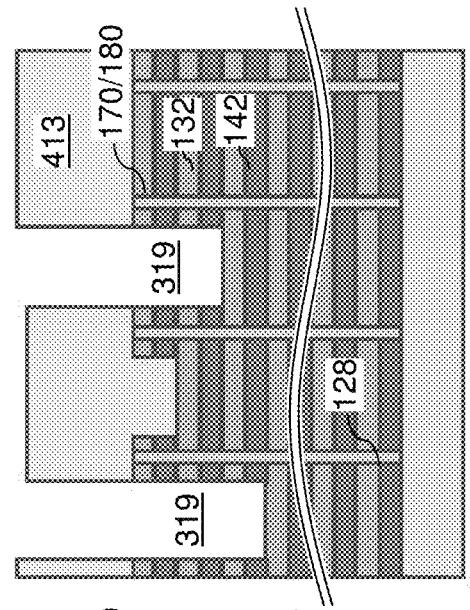
FIG. 8A is a top-down view of a portion of the contact region after a second anisotropic etch process according to an embodiment of the present disclosure.
Figure 8B:
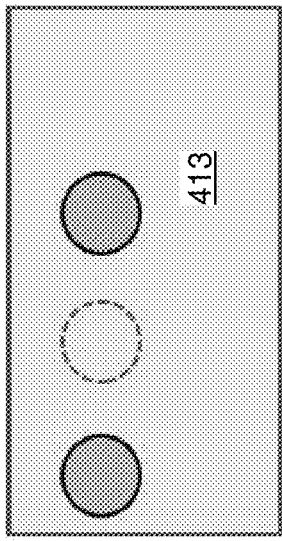
FIG. 8B is a vertical cross-sectional view of the structure of FIG. 8A.

Referring to FIGS. 5B, 8A, and 8B, a second masking layer 412 (e.g., photoresist and/or hard mask) can be applied over the inter-tier dielectric layer 180, and can be lithographically patterned to form openings therethrough. The pattern of the openings in the second masking layer 412 includes a first subset of openings that overlaps with the areas of the previously formed first via cavities 319, and a second subset of openings that do not overlap with the areas of the previously formed first via cavities 319. A second anisotropic etch process can be performed to transfer the pattern of the openings in the second masking layer 412 through underlying portions of the inter-tier dielectric layer 180 and the first insulating cap layer 170 (in case previously formed first via cavities 319 are not present under the respective openings), and through two first sacrificial material layers 142 and two first insulating layers 132 to extend the depth of the at least one previously formed first via cavity 319. In one embodiment, the first insulating layers 132, the first insulating cap layer 170, and the inter-tier dielectric layer 180 can include silicon oxide, and the first sacrificial material layers 142 can include silicon nitride. In this case, the second anisotropic etch process can include an alternating sequence of three anisotropic etch steps that etch silicon oxide and two anisotropic etch steps that etch silicon nitride. First via cavities 319 are formed underneath the openings in the second masking layer 412. The second masking layer 412 can be subsequently removed, for example, by ashing and/or selective etching.

Figure 9A:
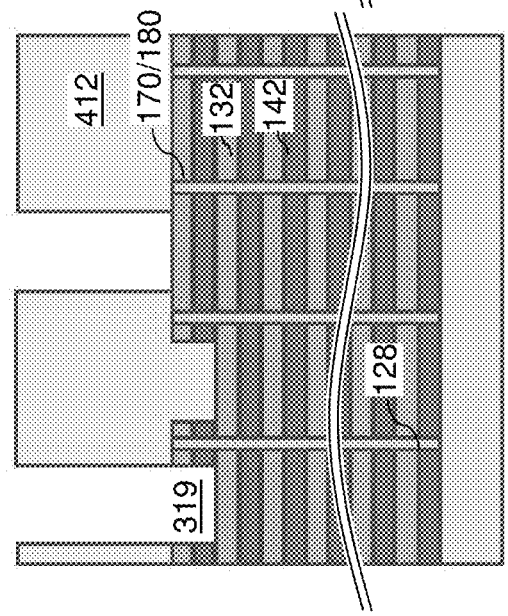
FIG. 9A is a top-down view of a portion of the contact region after a third anisotropic etch process according to an embodiment of the present disclosure.
Figure 9B:
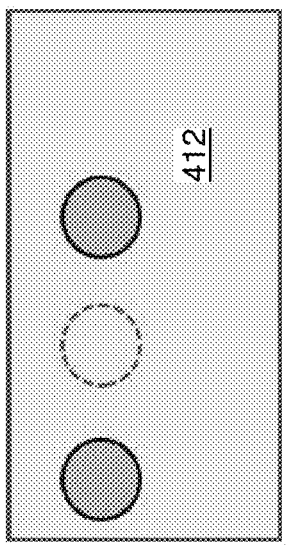
FIG. 9B is a vertical cross-sectional view of the structure of FIG. 9A.

Referring to FIGS. 5C, 9A, and 9B, a third masking layer 413 (e.g., photoresist and/or hard mask) can be applied over the inter-tier dielectric layer 180, and can be lithographically patterned to form openings therethrough. The pattern of the openings in the third masking layer 413 includes a first subset of openings that overlaps with the areas of the previously formed first via cavities 319, and a second subset of openings that do not overlap with the areas of the previously formed first via cavities 319. A third anisotropic etch process can be performed to transfer the pattern of the openings in the third masking layer 413 through underlying portions of the inter-tier dielectric layer 180 and the first insulating cap layer 170 (in case previously formed first via cavities 319 are not present under the respective openings), and through four first sacrificial material layers 142 and four first insulating layers 132 to extend the depth of at least one previously formed first via cavity 319. In one embodiment, the first insulating layers 132, the first insulating cap layer 170, and the inter-tier dielectric layer 180 can include silicon oxide, and the first sacrificial material layers 142 can include silicon nitride. In this case, the third anisotropic etch process can include an alternating sequence of five anisotropic etch steps that etch silicon oxide and four anisotropic etch steps that etch silicon nitride. First via cavities 319 are formed underneath the openings in the third masking layer 413. The third masking layer 413 can be subsequently removed, for example, by ashing and/or selective etching.

Referring to FIG. 5D, a fourth masking layer 414 (e.g., photoresist and/or hard mask) can be applied over the inter-tier dielectric layer 180, and can be lithographically patterned to form openings therethrough. The pattern of the openings in the fourth masking layer 414 includes a first subset of openings that overlaps with the areas of the previously formed first via cavities 319, and a second subset of openings that do not overlap with the areas of the previously formed first via cavities 319. A fourth anisotropic etch process can be performed to transfer the pattern of the openings in the fourth masking layer 414 through underlying portions of the inter-tier dielectric layer 180 and the first insulating cap layer 170 (in case previously formed first via cavities 319 are not present under the respective openings), and through eight first sacrificial material layers 142 and eight first insulating layers 132. In one embodiment, the first insulating layers 132, the first insulating cap layer 170, and the inter-tier dielectric layer 180 can include silicon oxide, and the first sacrificial material layers 142 can include silicon nitride. In this case, the fourth anisotropic etch process can include an alternating sequence of nine anisotropic etch steps that etch silicon oxide and eight anisotropic etch steps that etch silicon nitride. First via cavities 319 are formed underneath the openings in the fourth masking layer 414. The fourth masking layer 414 can be subsequently removed, for example, by ashing and/or selective etching.

The processing steps of FIGS. 5A-9B illustrate only a specific embodiment for formation first via cavities 319. Generally, the first via cavities 319 can formed by sequentially performing N1 sets of via formation processing steps in which N1 is an integer greater than 1. For example, N1 can be an integer in a range from 2 to 12, such as from 3 to 10. For each positive integer i not greater than N1 (i.e., for any integer i between 0 and N1+1), each i-th set of via formation processing steps comprises an i-th etch mask patterning step in which an i-th etch mask layer (such as a masking layer (411, 412, 423, or 414) is formed over the first alternating stack (132, 142) and is lithographically patterned to form openings therethrough, an i-th anisotropic etch step in which at least one pair of a first insulating layer 132 and a first sacrificial material layer 142 is etched underneath the openings in the i-th etch mask layer, and an i-th etch mask removal step in which the i-th etch mask layer is removed.

In one embodiment, a j-th etch mask layer includes a respective first subset of openings having an areal overlap with opening in a k-th etch mask layer and a respective second subset of openings that does not have any areal overlap with the openings in the k-th etch mask layer for any pair of j and k that are different from each other and selected from integers in a range between 0 and N1+1. In other words, some openings in any selected etch mask layer overlaps with openings in any other etch mask layer, while some other openings in the selected etch mask layer do not overlap with the complement of the openings in the other etch mask layer.

In one embodiment, an anisotropic etch step within the N1 sets of via formation processing steps can etch a single pair of a first insulating layer 132 and a first sacrificial material layer 142 underneath each opening in a respective etch mask layer. Another anisotropic etch step within the N1 sets of via formation processing steps can etch two pairs of a first insulating layer 132 and a first sacrificial material layer 142 underneath each opening in a respective etch mask layer. Yet another anisotropic etch step within the N1 sets of via formation processing steps can etch four pairs of a first insulating layer 132 and a first sacrificial material layer 142 underneath each opening in a respective etch mask layer. Additional anisotropic etch steps can be performed to provide first via cavities 319 having up to $2^{N1}-1$ different depths.

In one embodiment, the integer N1 may be in a range from 4 to 8, and the total number of the first sacrificial material layers 142 that are physically exposed to the first via cavities 319 after the N1 sets of via formation processing steps is in a range from $2^{N1-1}$ to $2^{N1}-1$. For example, if N1 is 6, the total number of the first sacrificial material layers 142 that are physically exposed to the first via cavities 319 after six sets of via formation processing steps is in a range from 32 to 63.

Referring to FIGS. 10 and 11, the first exemplary structure is illustrated after formation of the first via cavities 319. Each of the first sacrificial material layers 142 can comprise a respective portion of a top surface that is physically exposed to a respective one of the first via cavities 319 upon formation of the first via cavities 319. No stepped surfaces are formed in the first alternating stack (132, 142) before, or during, formation of the first via cavities 319. As used herein, "stepped surfaces" refer to a contiguous set of at least one vertical or tapered straight surface and at least two horizontal surfaces that do not have areal overlap thereamongst. In other words, at least two horizontal surfaces that do not overlap with each other are adjoined to each other through at least one vertical or tapered straight surface to provide the stepped surfaces. According to an aspect of the present disclosure, first via cavities 319 vertically extending through the first alternating stack (132, 142) can be formed without forming any stepped surfaces in the first alternating stack (132, 142). In one embodiment, the first via cavities 319 and the sacrificial first-tier support opening fill portion 128 are formed in respective areas such that areas of the first via cavities 319 do not overlap with areas of the sacrificial first-tier support opening fill portion 128.

Figure 12:
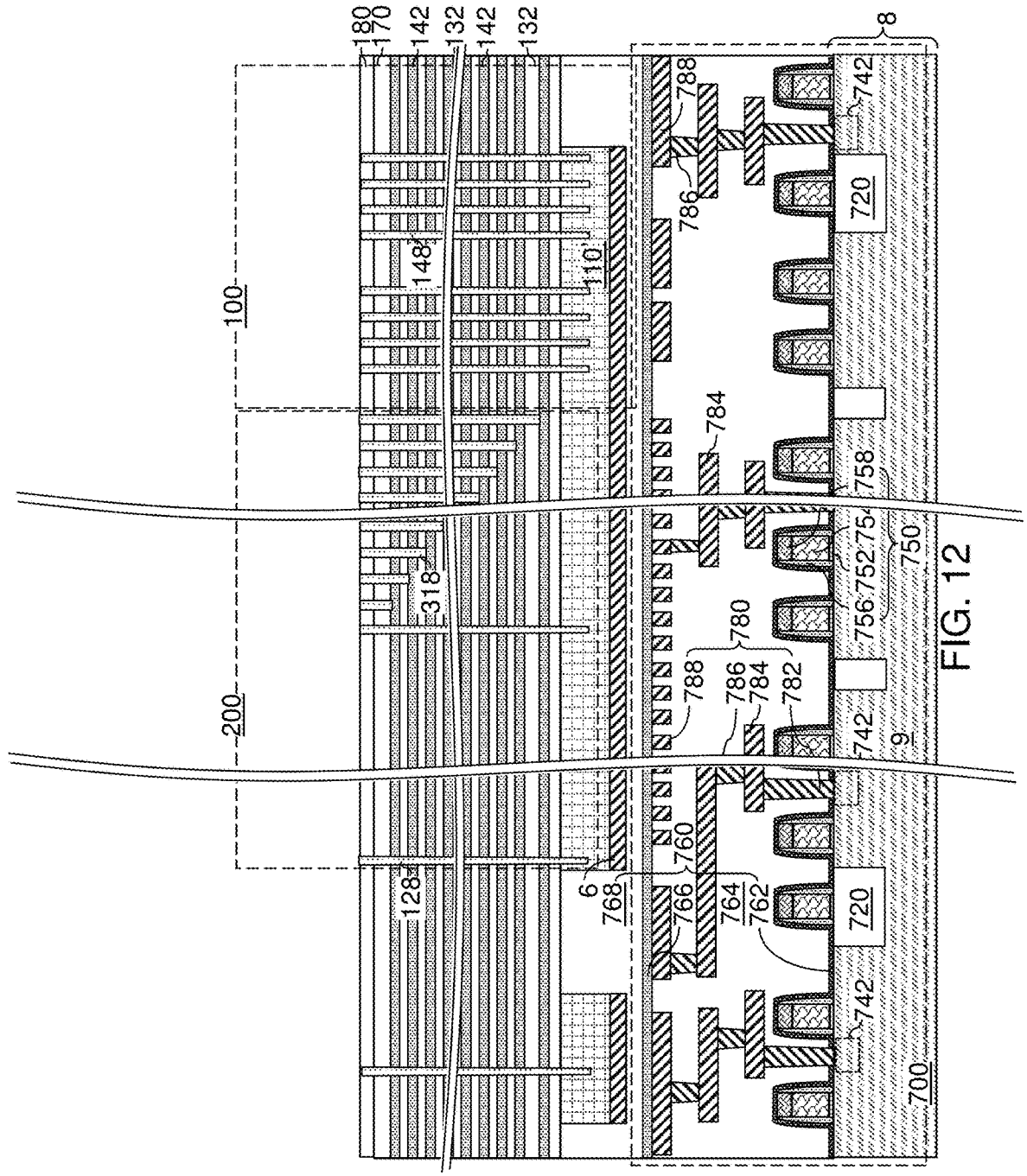
FIG. 12 is a vertical cross-sectional view of the first exemplary structure after formation of the first sacrificial via fill structures according to the first embodiment of the present disclosure.

Referring to FIG. 12, a first sacrificial via fill material can be deposited in the first via cavities 319. The first sacrificial via fill material includes amorphous silicon, a silicon-germanium alloy, amorphous carbon, diamond-like carbon, or a silicon-based inorganic polymer material. Excess portions of the first sacrificial via fill material can be removed from above the horizontal plane including the top surface of the inter-tier dielectric layer 180 by a planarization process such as a chemical mechanical planarization process. Each remaining portion of the first sacrificial via fill material that fills the first via cavities 319 comprise first sacrificial via fill structures 318.

Figure 13:
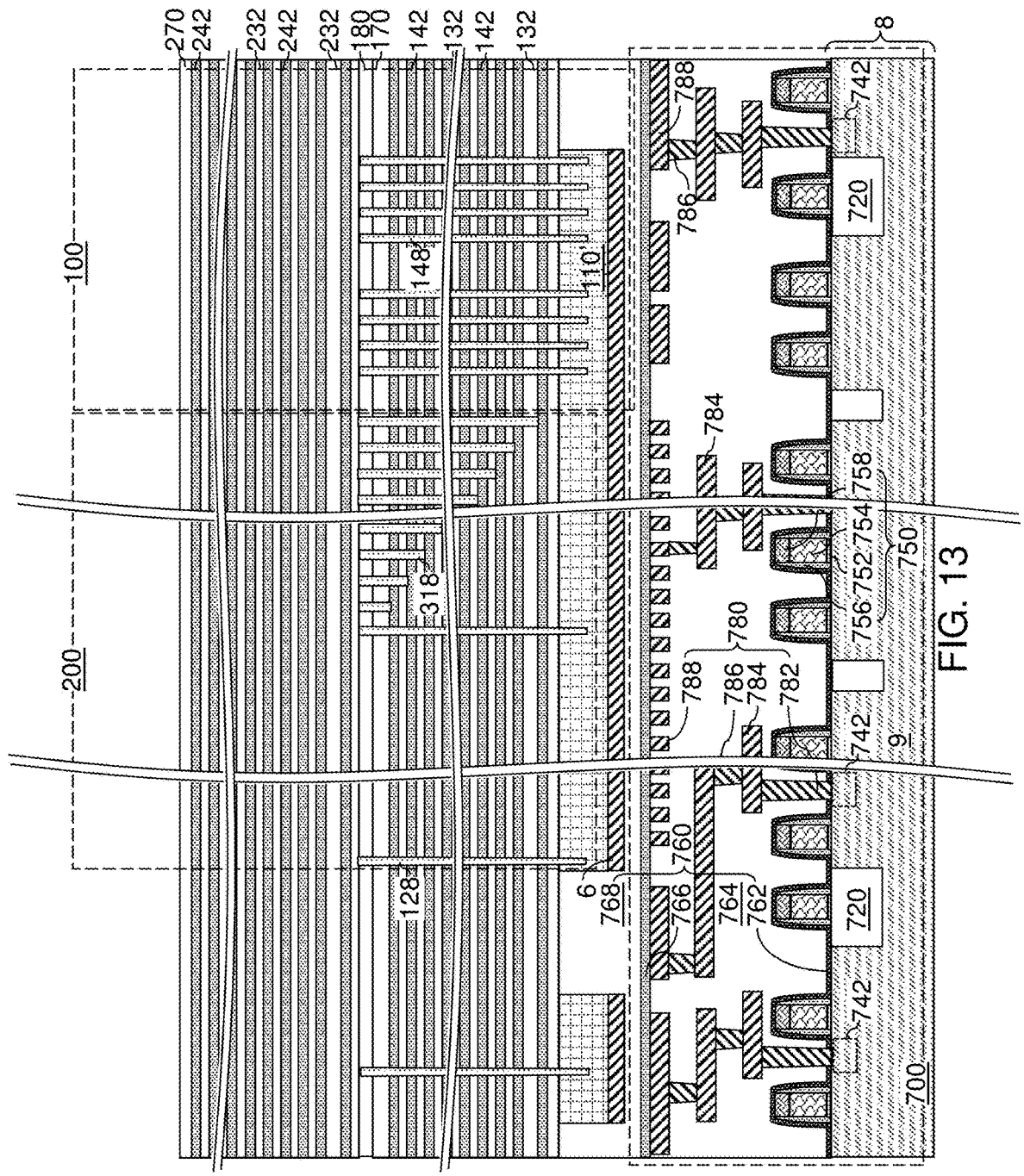
FIG. 13 is a vertical cross-sectional view of the first exemplary structure after formation of a second-tier alternating stack of second insulating layers and second spacer material layers according to the first embodiment of the present disclosure.

Referring to FIG. 13, a second-tier structure may be formed over the first-tier structure (132, 142, 170, 148, 128, 318). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110'.

Figure 14:
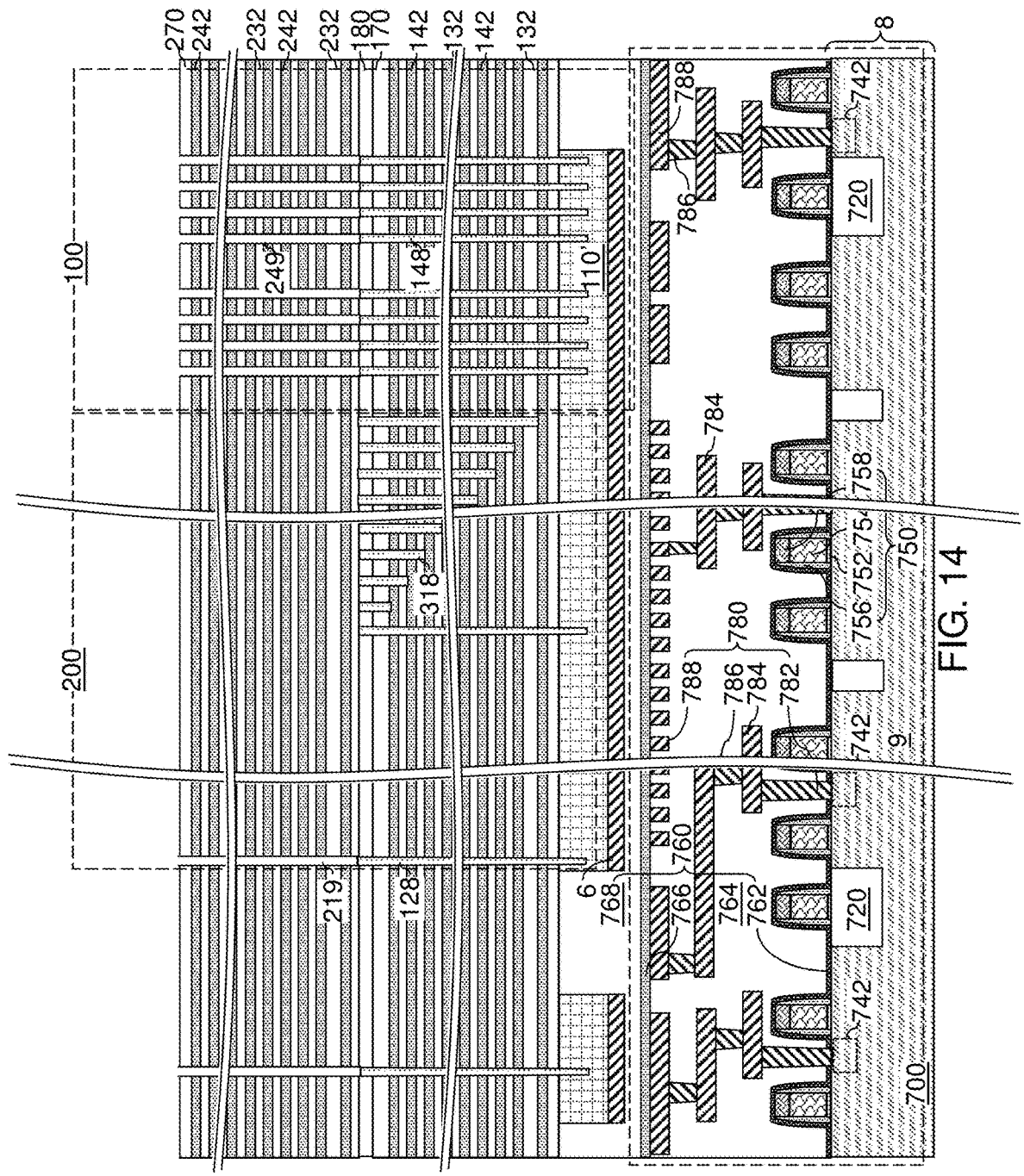
FIG. 14 is a vertical cross-sectional view of the first exemplary structure after formation of second-tier memory openings and second-tier support openings according to the first embodiment of the present disclosure.

Referring to FIG. 14, various second-tier openings (249, 229) may be formed through the second-tier structure (232, 242, 270). A masking layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the masking layer.

The pattern of openings in the masking layer may be transferred through the second-tier structure (232, 242, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The masking layer may be subsequently removed, for example, by ashing.

Figure 15:
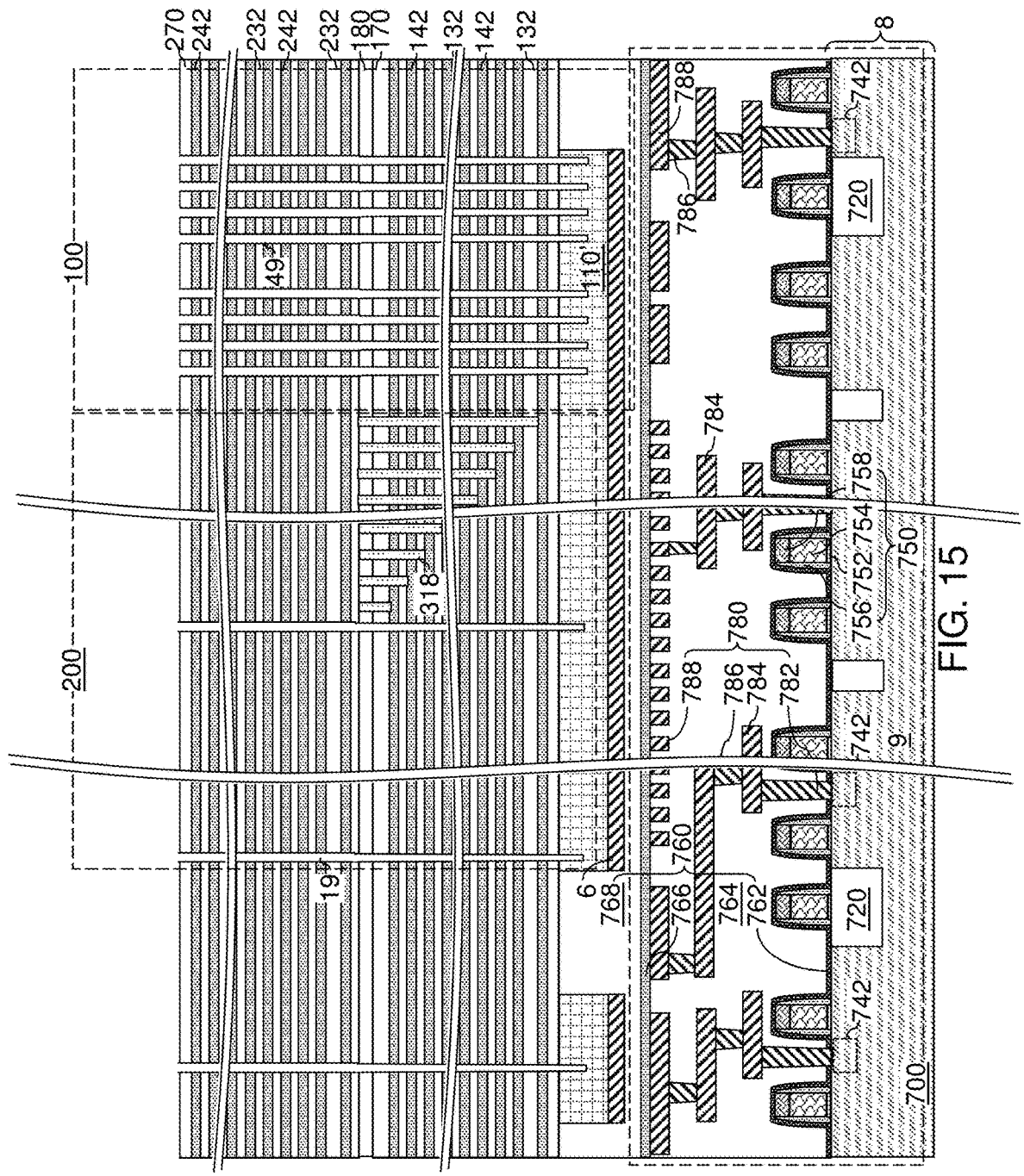
FIG. 15 is a vertical cross-sectional view of the first exemplary structure after formation of inter-tier memory openings and inter-tier support openings according to the first embodiment of the present disclosure.

Referring to FIG. 15, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 16A-16D provide sequential cross-sectional views of a memory opening 49 during formation of a memory opening fill structure. The same structural change occurs in each of the memory openings 49 and the support openings 19.

Referring to FIG. 16A, a memory opening 49 in the first exemplary device structure of FIG. 15 is illustrated. The memory opening 49 extends through the first-tier structure and the second-tier structure.

Referring to FIG. 16B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer 52 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 16C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 16D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170), the second-tier structure (232, 242, 270), the inter-tier dielectric layer 180, and the memory opening fill structures 58 collectively constitute a memory-level assembly.

Figure 17:
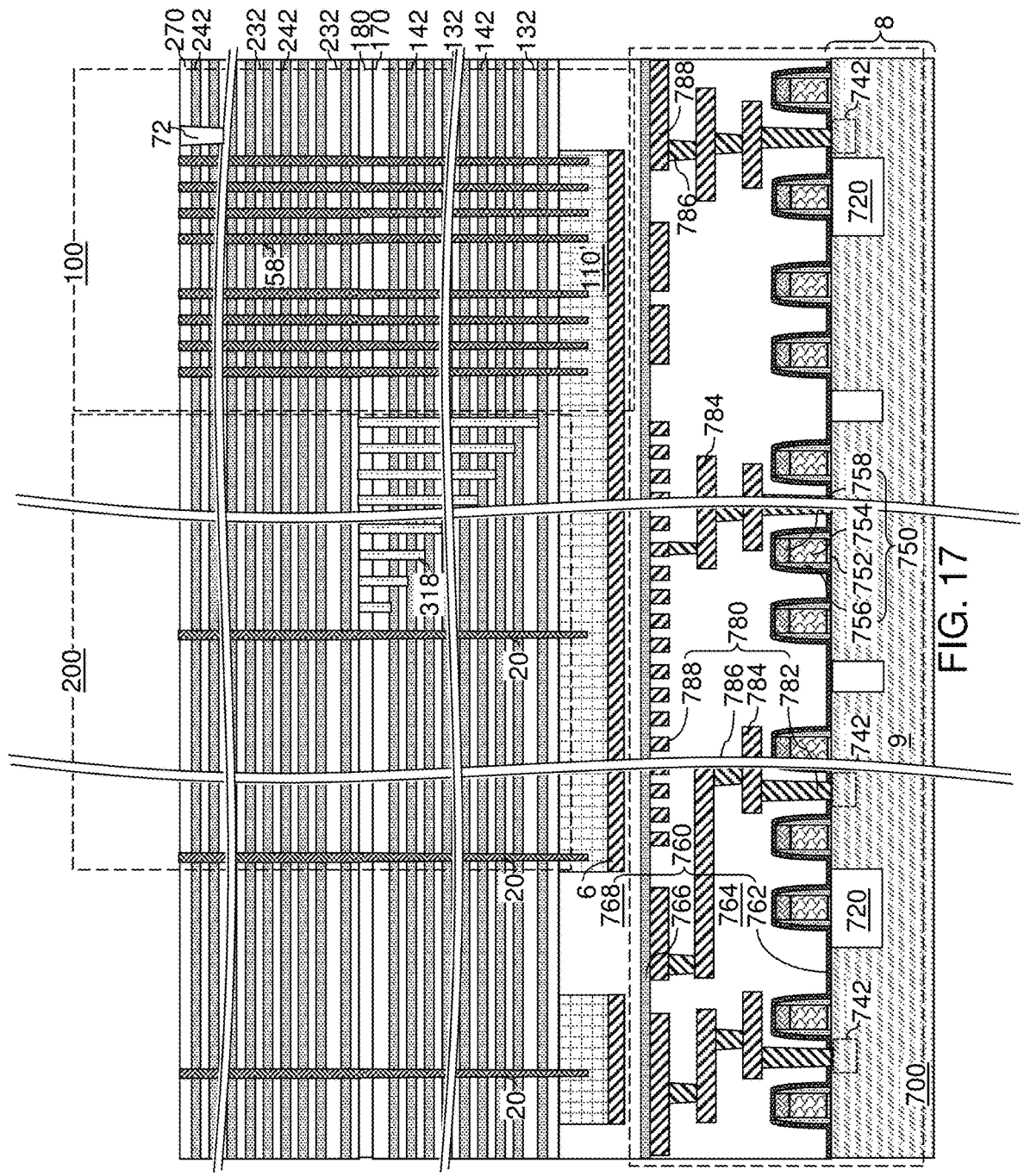
FIG. 17 is a vertical cross-sectional view of the first exemplary structure after formation of memory opening fill structures and support pillar structures according to the first embodiment of the present disclosure.
Figure 18A:
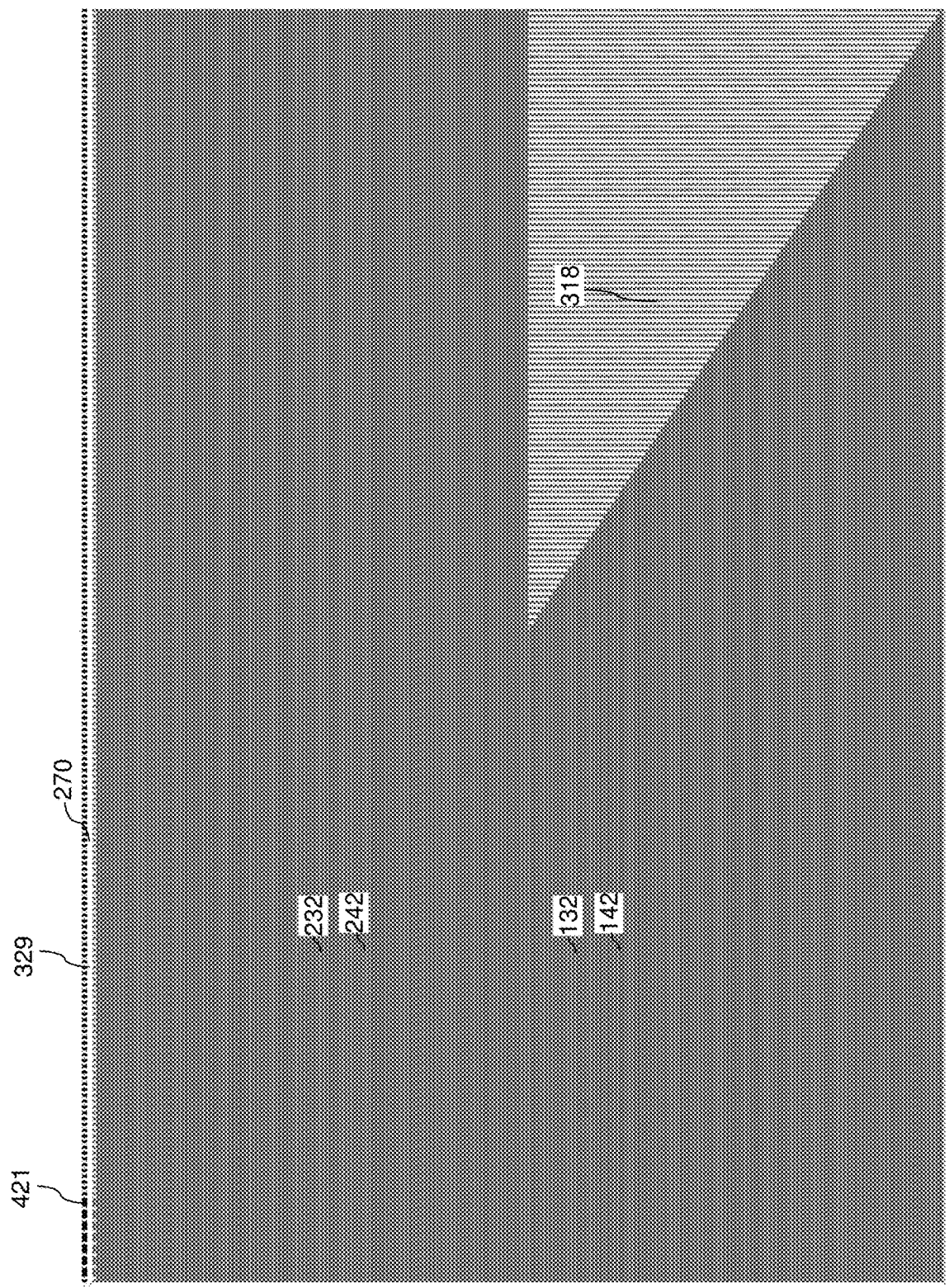
FIGS. 18A-18K illustrate vertical cross-sectional views of a contact region in the first exemplary structure during formation of second via cavities according to the first embodiment of the present disclosure.
Figure 18B:
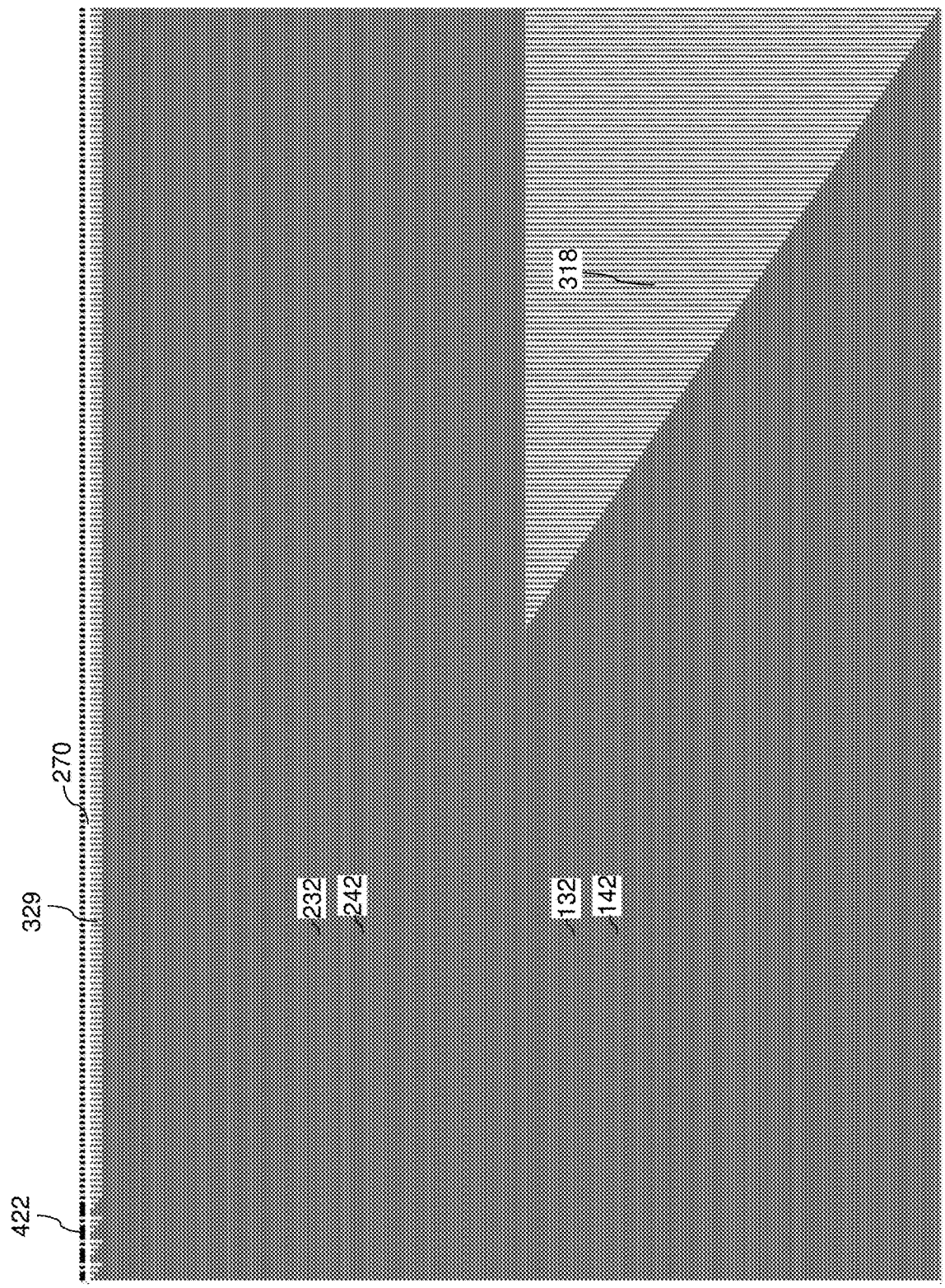
Figure 18C:
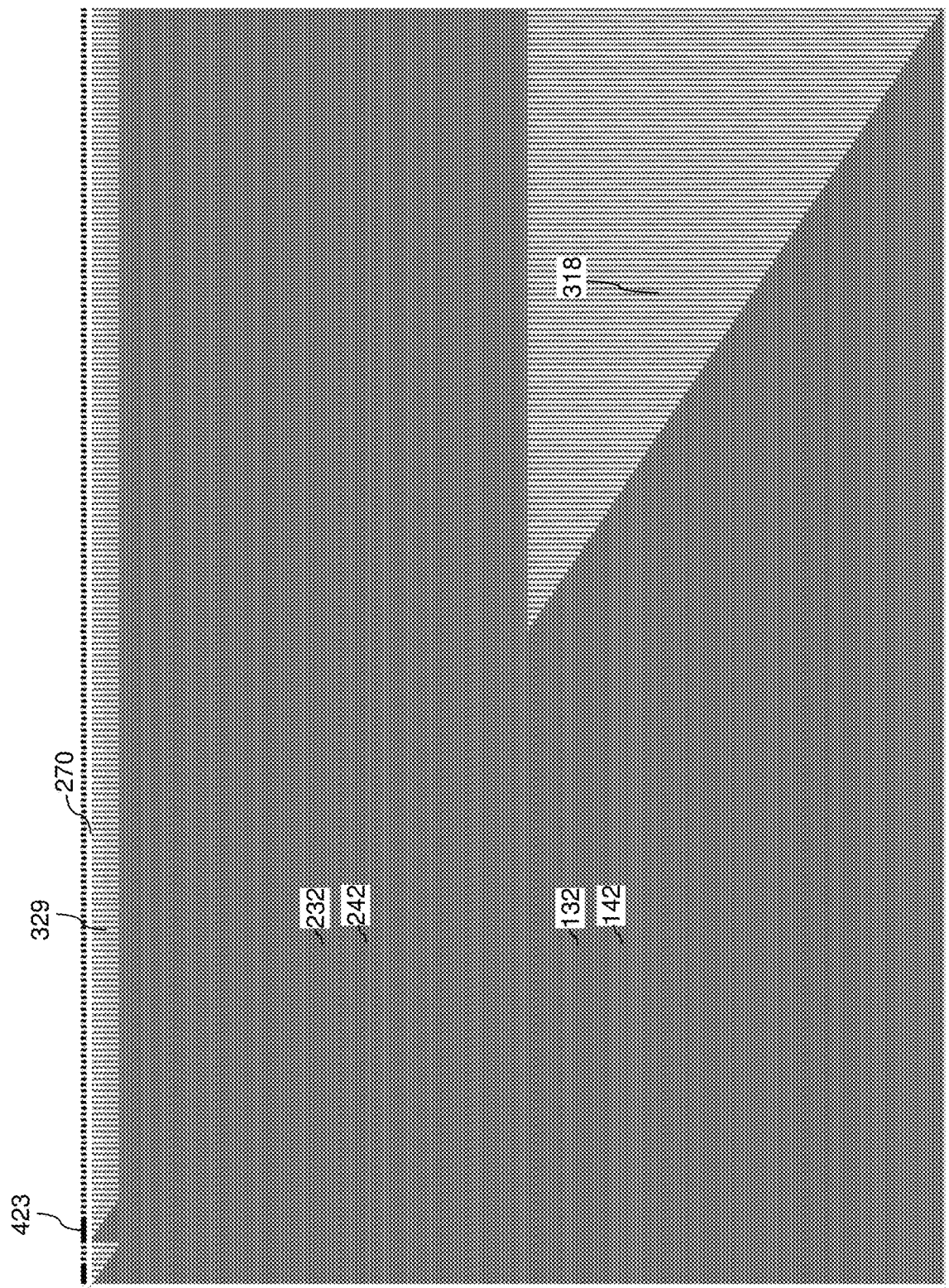
Figure 18D:
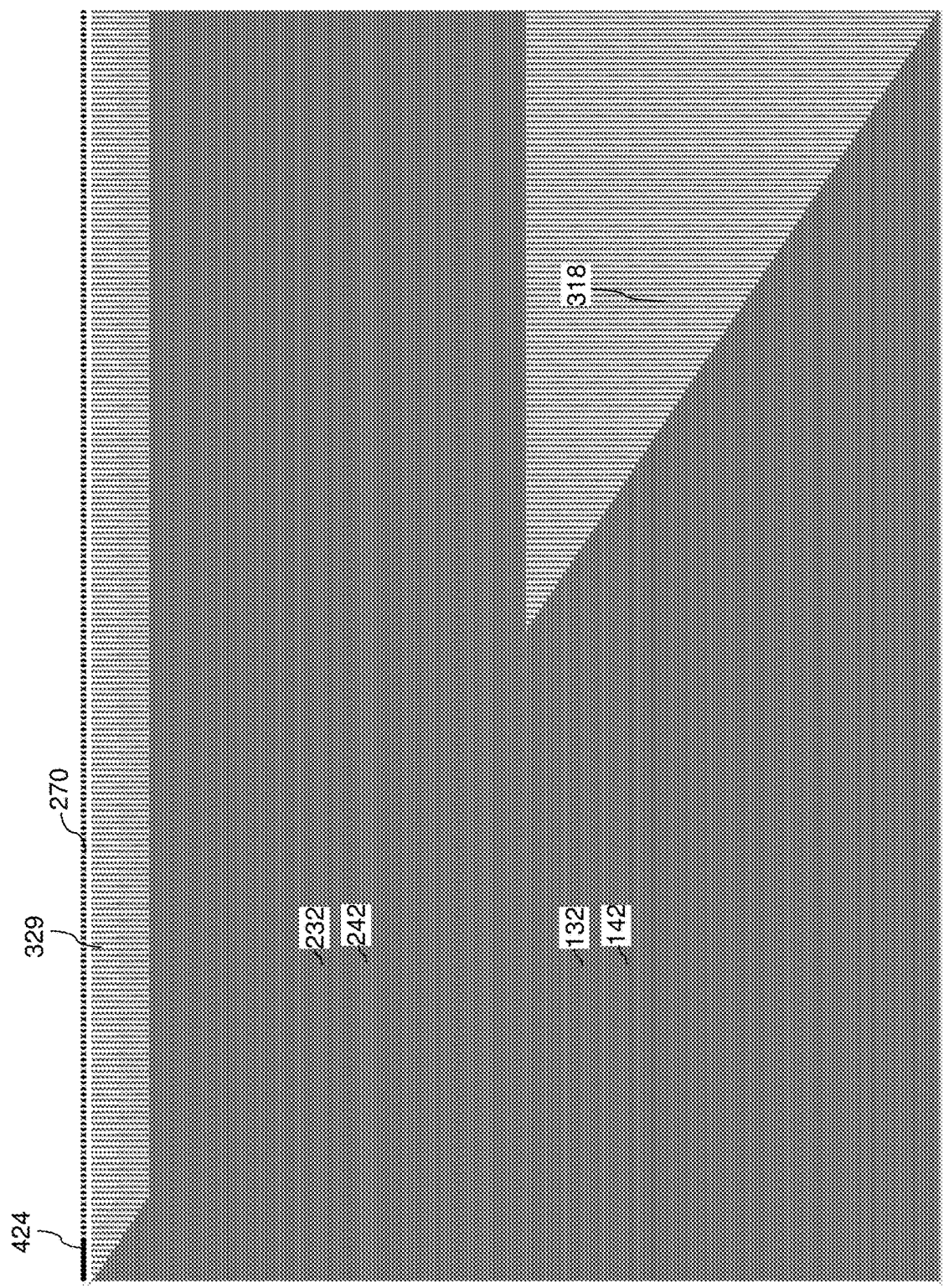
Figure 18E:
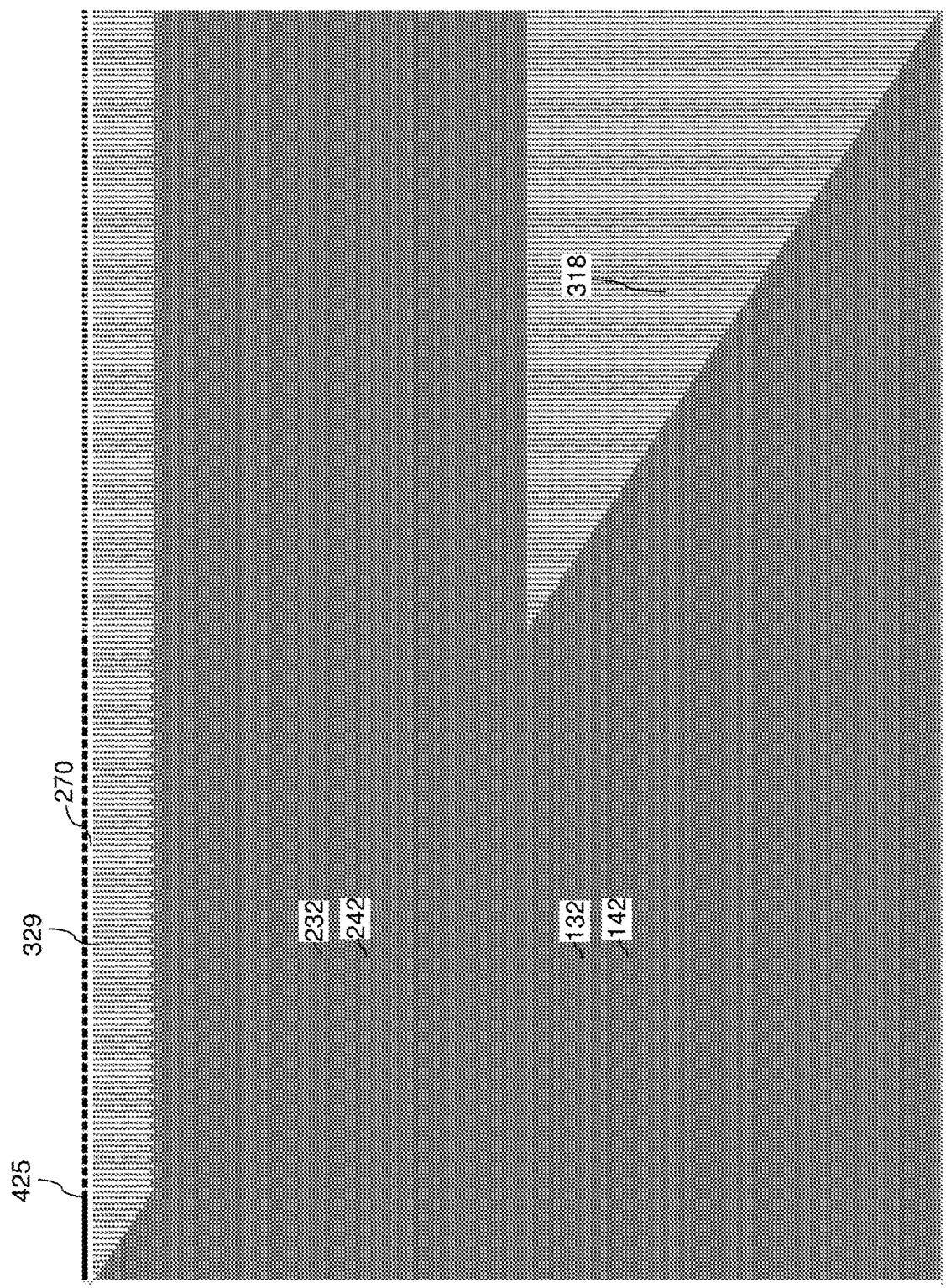
Figure 18F:
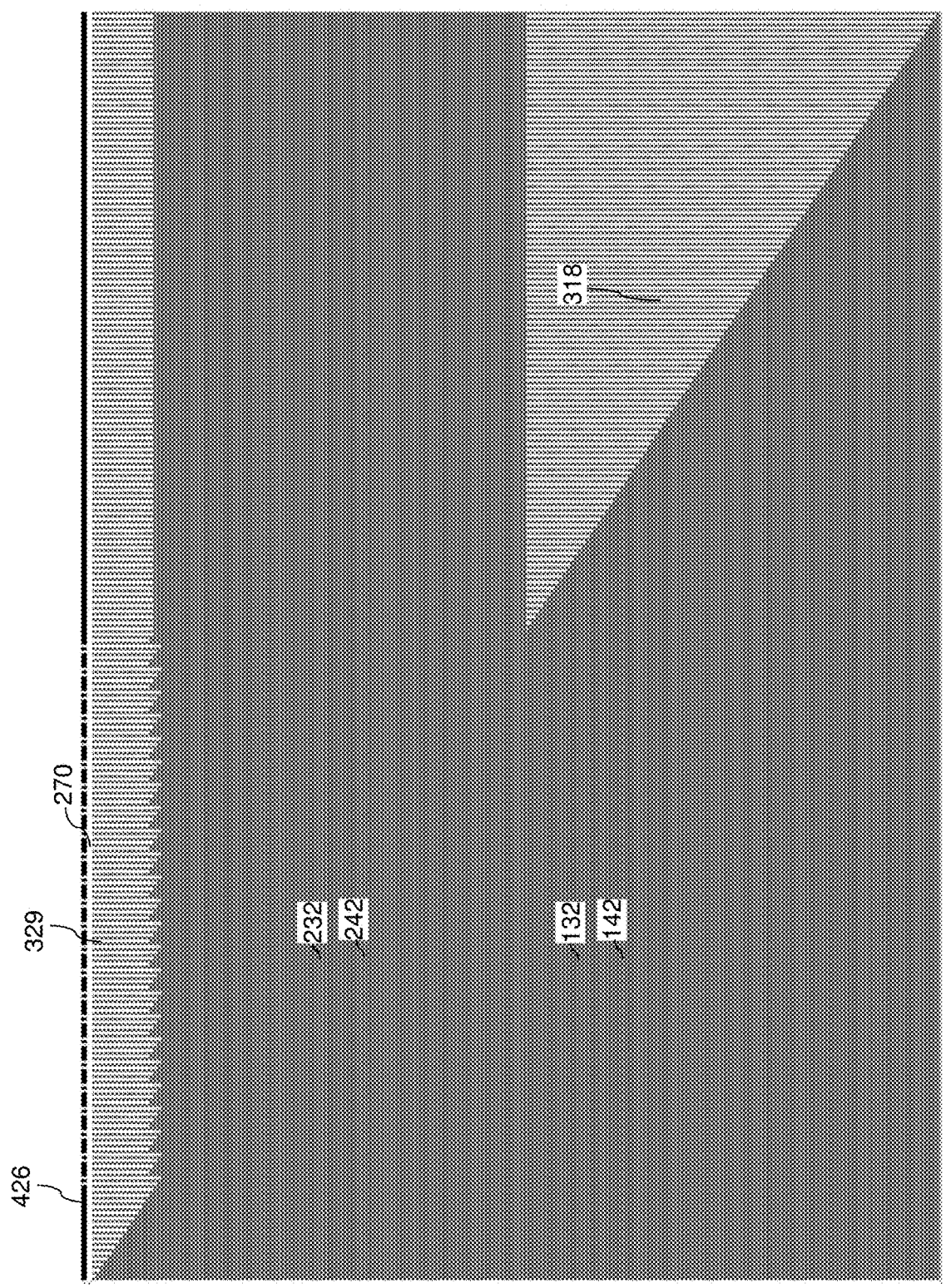
Figure 18G:
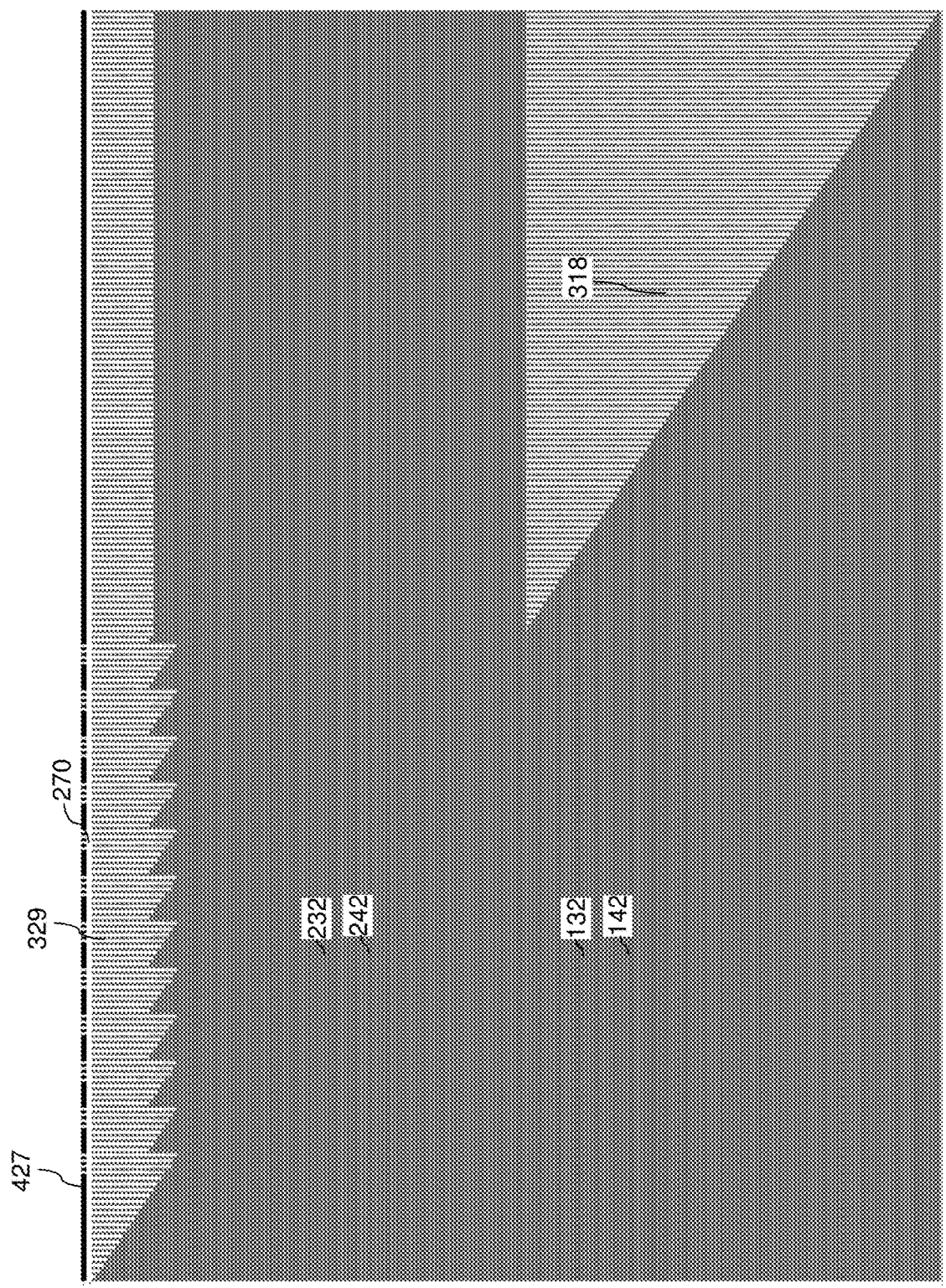
Figure 18H:
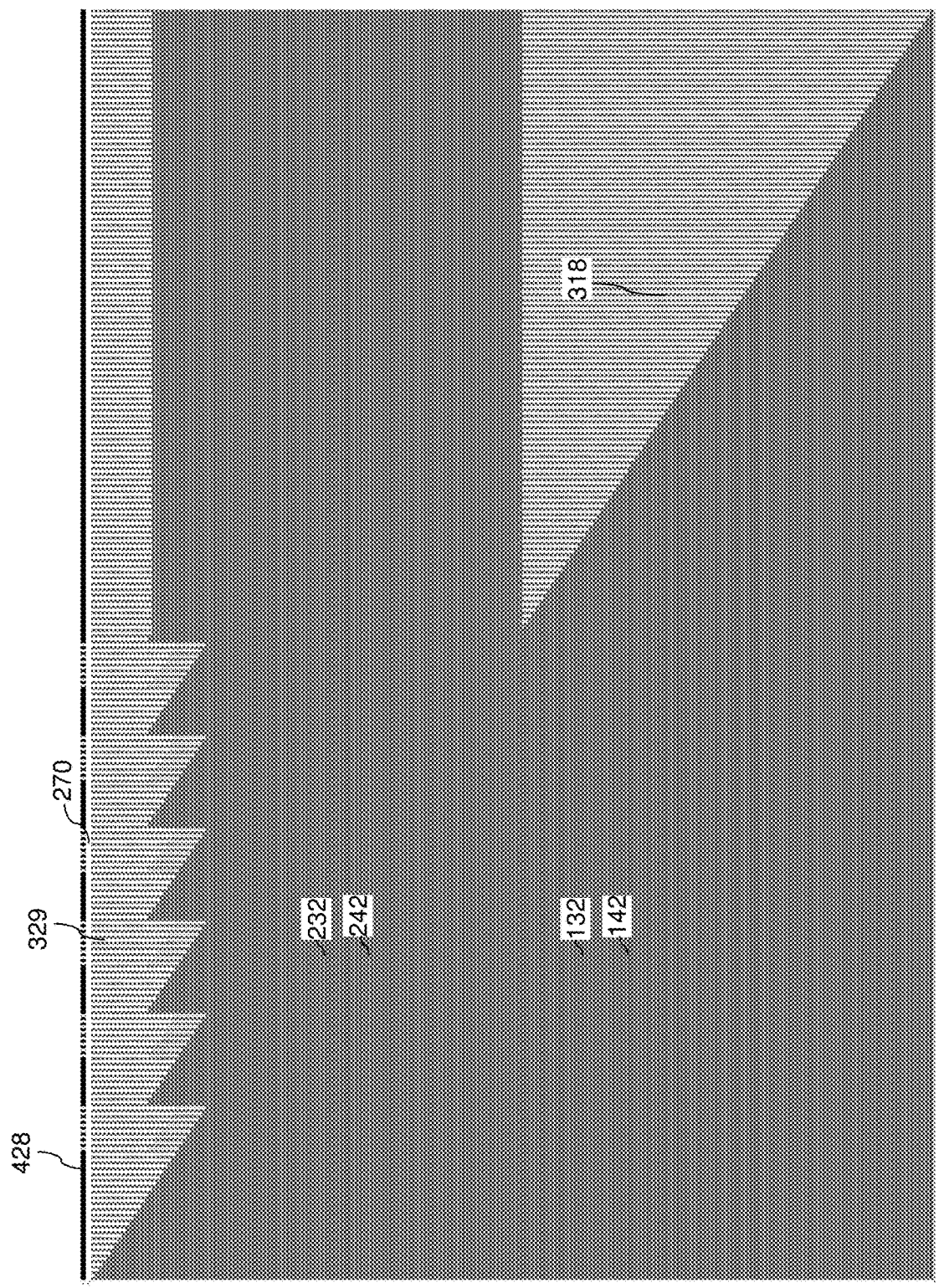
Figure 18I:
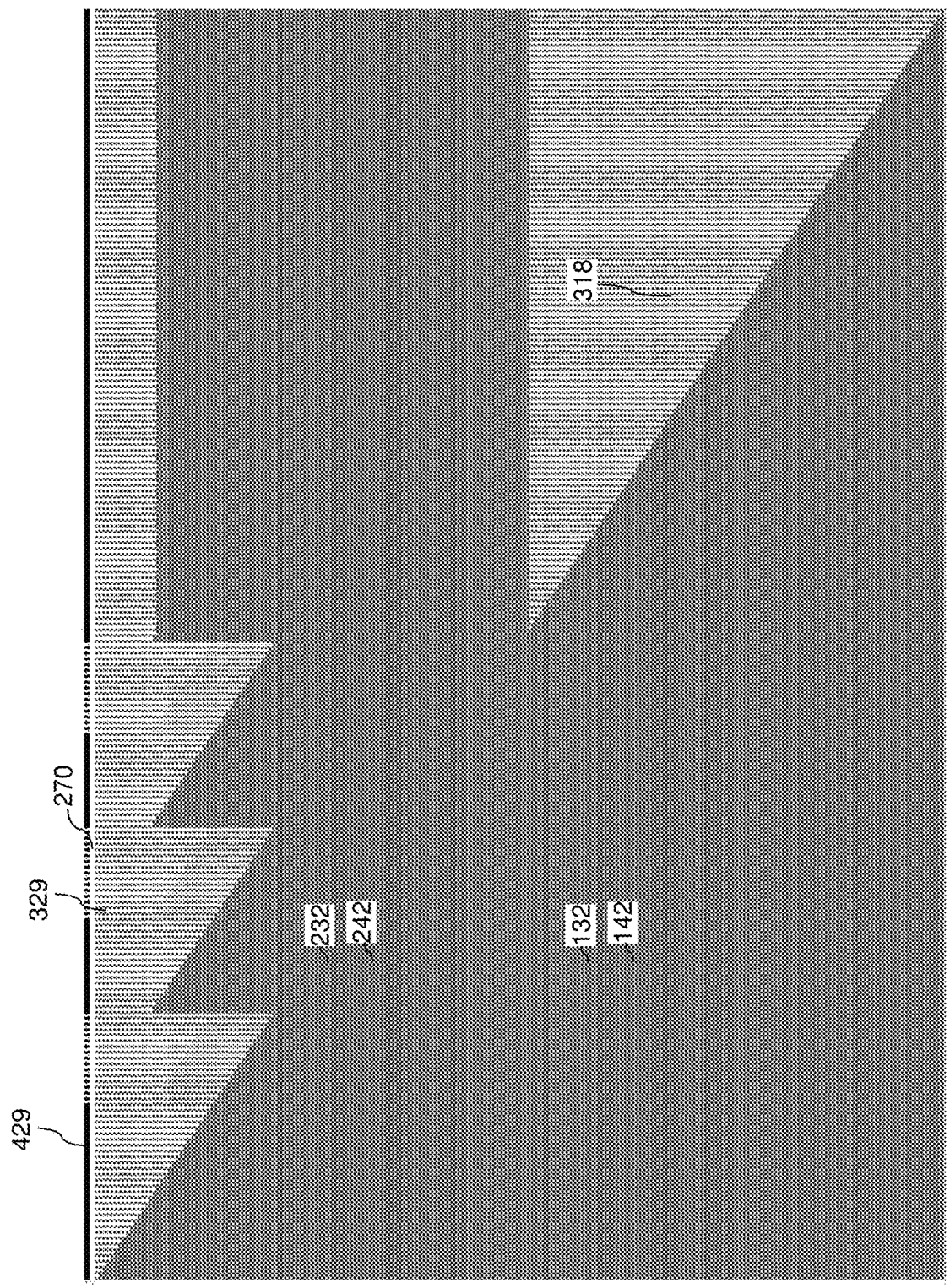
Figure 18J:
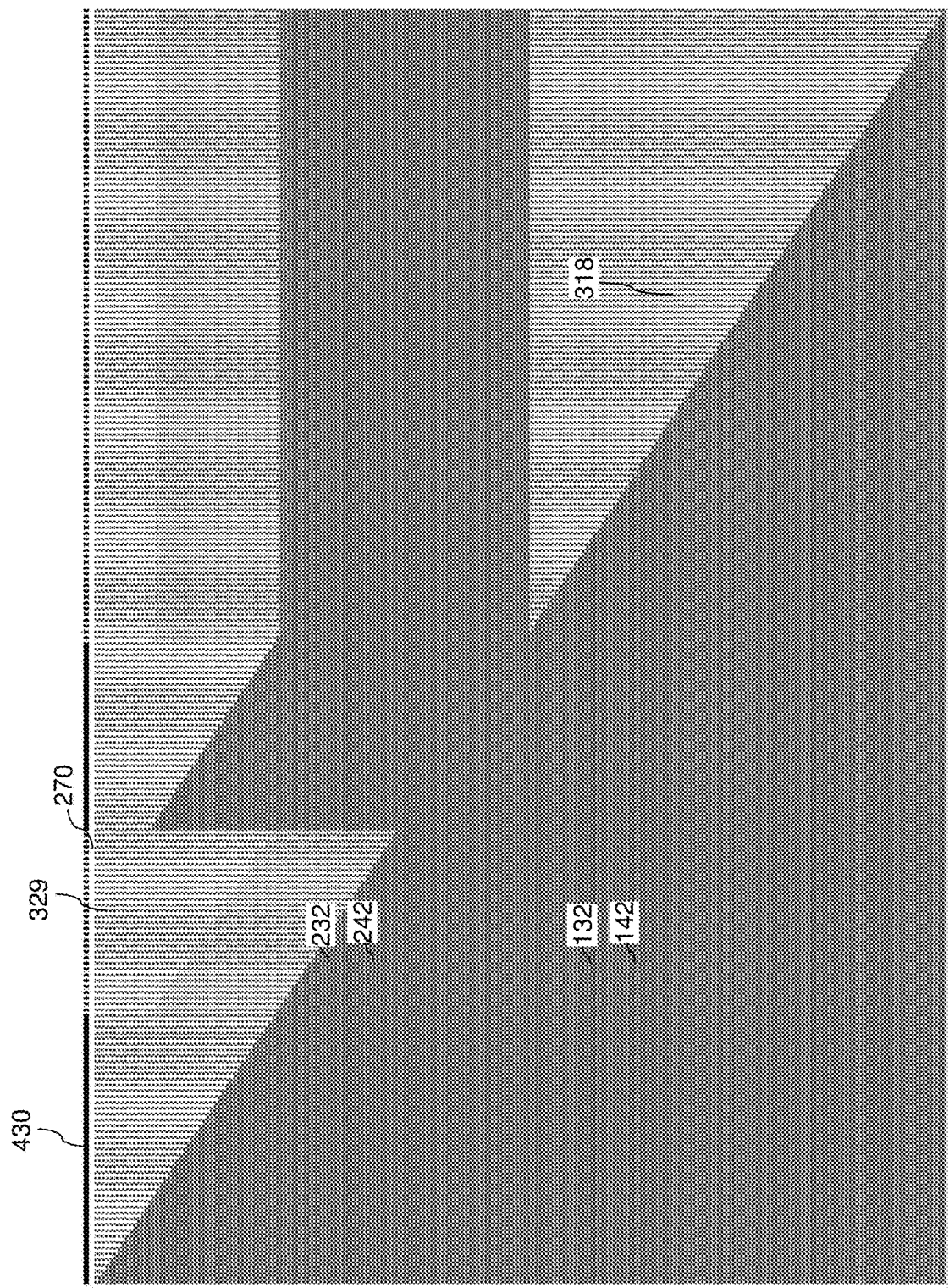
Figure 18K:
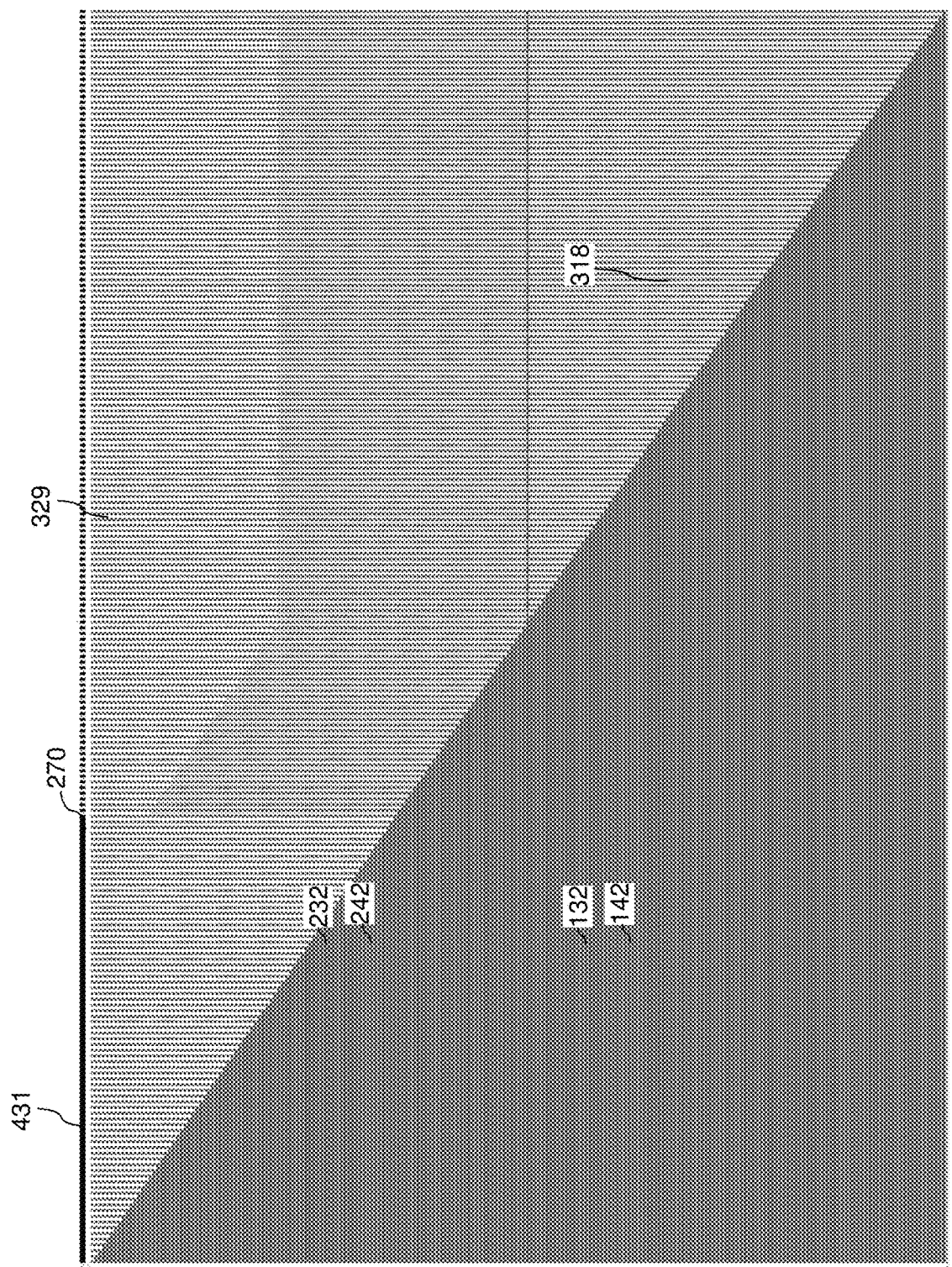

Referring to FIG. 17, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

FIG. 17 is a vertical cross-sectional view of the first exemplary structure after formation of memory opening fill structures and support pillar structures according to the first embodiment of the present disclosure.

FIGS. 18A-18K illustrate vertical cross-sectional views of the contact region 200 in the first exemplary structure during formation of second via cavities 329. The second via cavities 329 can be formed by sequentially performing N2 sets of via formation processing steps, in which N2 is an integer greater than 1. For example, N2 can be an integer in a range from 2 to 12, such as from 3 to 10. For each positive integer i not greater than N2 (i.e., for any integer i between 0 and N2+1), each i-th set of via formation processing steps comprises an i-th etch mask patterning step in which an i-th etch mask layer (such as a masking layer (421-431)) is formed over the second alternating stack (232, 242) and is lithographically patterned to form openings therethrough, an i-th anisotropic etch step in which at least one pair of a second insulating layer 232 and a second sacrificial material layer 242 is etched underneath the openings in the i-th etch mask layer, and an i-th etch mask removal step in which the i-th etch mask layer is removed.

In one embodiment, a j-th etch mask layer includes a respective second subset of openings having an areal overlap with opening in a k-th etch mask layer and a respective second subset of openings that does not have any areal overlap with the openings in the k-th etch mask layer for any pair of j and k that are different from each other and selected from integers in a range between 0 and N2+1. In other words, some openings in any selected etch mask layer overlaps with openings in any other etch mask layer, while some other openings in the selected etch mask layer do not overlap with the complement of the openings in the other etch mask layer.

In one embodiment, an anisotropic etch step within the N2 sets of via formation processing steps can etch a single pair of a second insulating layer 232 and a second sacrificial material layer 242 underneath each opening in a respective etch mask layer. Another anisotropic etch step within the N2 sets of via formation processing steps can etch two pairs of a second insulating layer 232 and a second sacrificial material layer 242 underneath each opening in a respective etch mask layer. Yet another anisotropic etch step within the N2 sets of via formation processing steps can etch four pairs of a second insulating layer 232 and a second sacrificial material layer 242 underneath each opening in a respective etch mask layer. Additional anisotropic etch steps can be performed to provide second via cavities 329 having up to $2^{N2}-1$ different depths.

In one embodiment, the integer N2 may be in a range from 4 to 8, and the total number of the second sacrificial material layers 242 that are physically exposed to the second via cavities 329 after the N2 sets of via formation processing steps is in a range from $2^{N2-1}$ to $2^{N2}-1$. For example, if N2 is 6, the total number of the second sacrificial material layers 242 that are physically exposed to the second via cavities 329 after six sets of via formation processing steps is in a range from 32 to 63.

The second via cavities 329 include a subset of second via cavities 329 that extend to a top surface of a respective one of the first sacrificial via fill structures 318. Each of the first sacrificial via fill structures 318 has a top surface that is physically exposed to a respective one of the second via cavities 329.

Each of the second sacrificial material layers 242 can comprise a respective portion of a top surface that is physically exposed to a respective one of the second via cavities 329 upon formation of the second via cavities 329. No stepped surfaces are formed in the second alternating stack (232, 242) before, or during, formation of the second via cavities 329. According to an aspect of the present disclosure, second via cavities 329 vertically extending through the second alternating stack (232, 242) can be formed without forming any stepped surfaces in the second alternating stack (232, 242) or in the first alternating stack (132, 142) within the contact region 200, i.e., within the region in which the first via cavities 319 and the second via cavities 329 are formed. In one embodiment, the second via cavities 329 and the sacrificial second-tier support opening fill portion 228 are formed in respective areas such that areas of the second via cavities 329 do not overlap with areas of the sacrificial second-tier support opening fill portion 228.

Figure 19A:
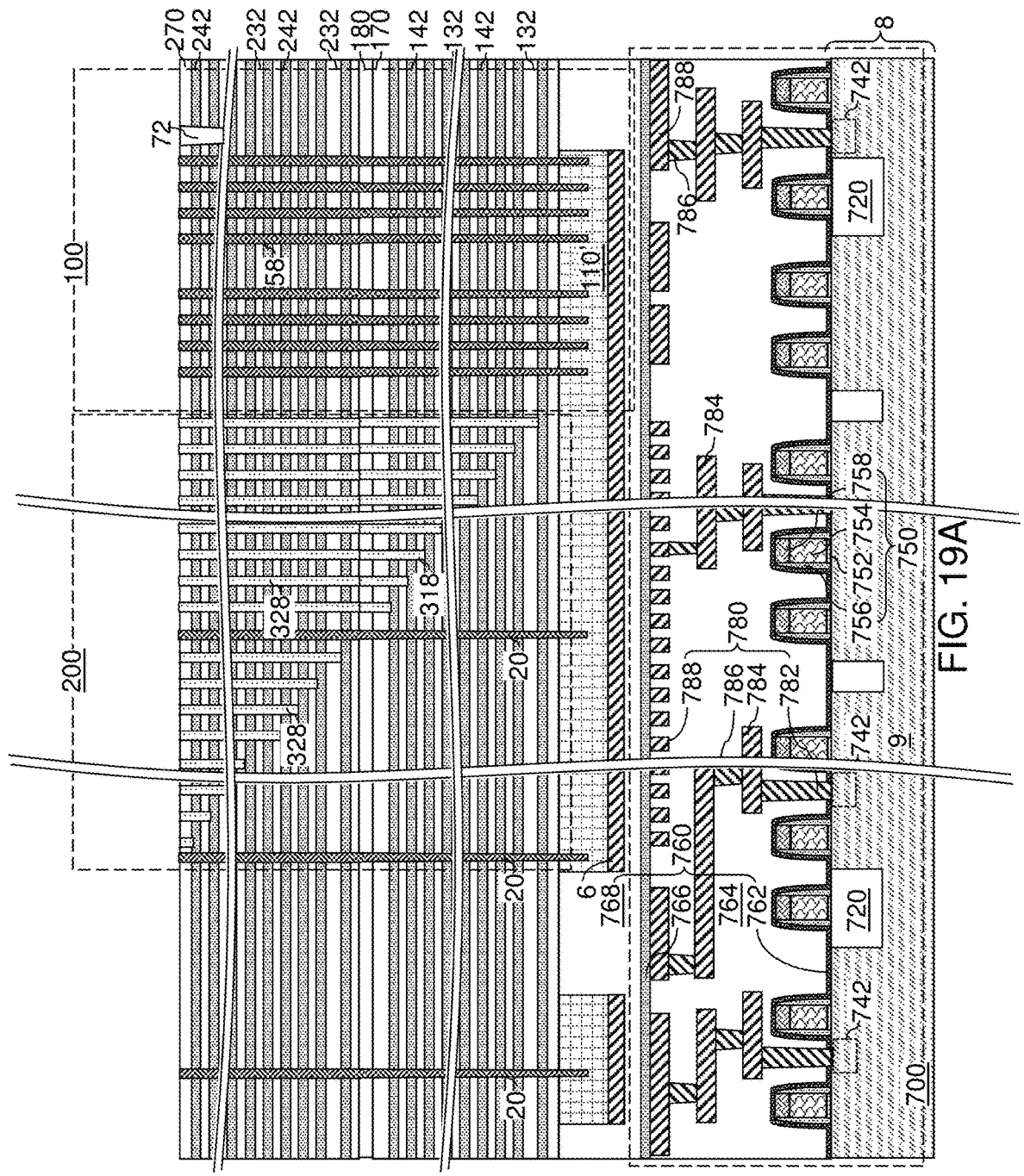
FIG. 19A is a vertical cross-sectional view of the first exemplary structure after formation of second sacrificial via fill structures according to the first embodiment of the present disclosure.
Figure 19B:
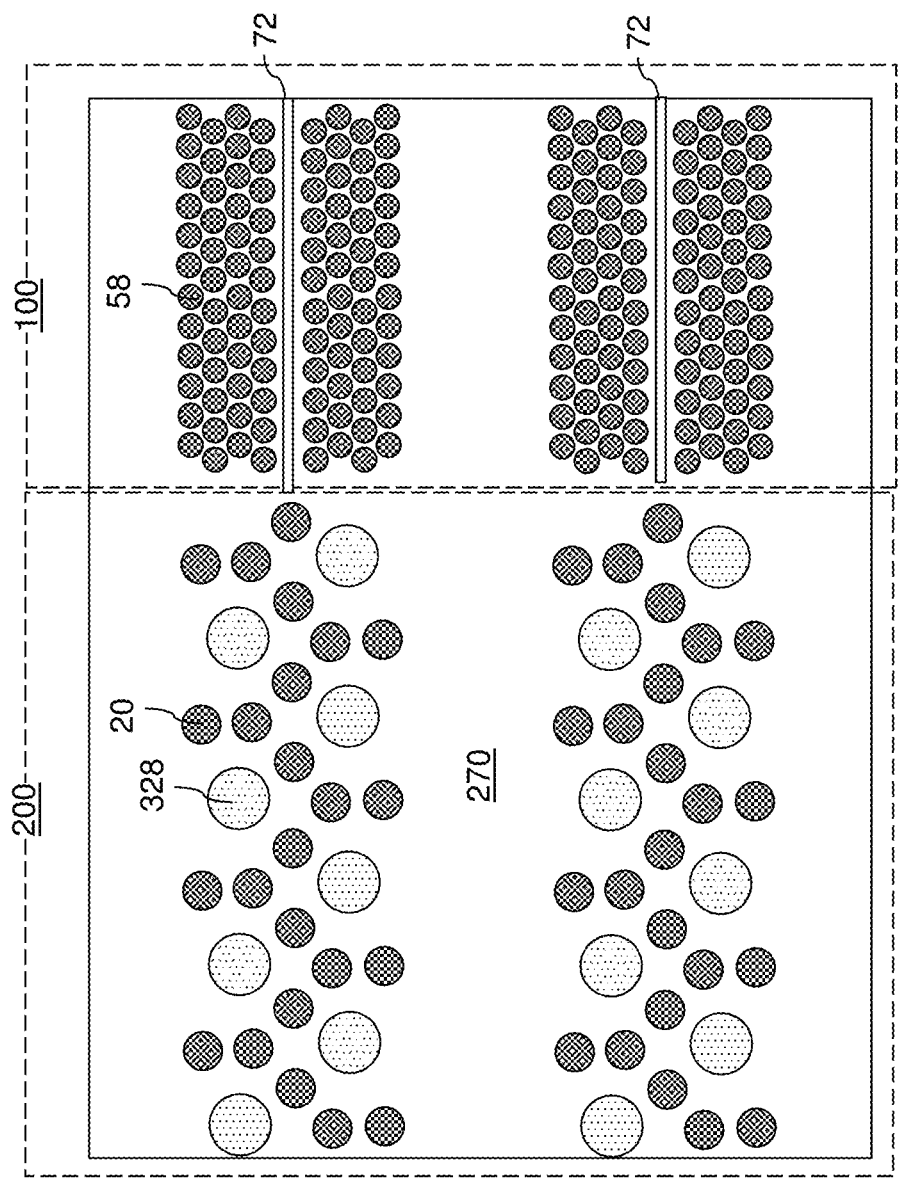
FIG. 19B is a horizontal cross-sectional view of the first exemplary structure of FIG. 19A.

Referring to FIGS. 19A and 19B, a second sacrificial via fill material can be deposited in the second via cavities 329. The second sacrificial via fill material includes amorphous silicon, a silicon-germanium alloy, amorphous carbon, diamond-like carbon, or a silicon-based inorganic polymer material. Excess portions of the second sacrificial via fill material can be removed from above the horizontal plane including the top surface of the second insulating cap layer 270 by a planarization process such as a chemical mechanical planarization process. Each remaining portion of the second sacrificial via fill material that fills the second via cavities 329 comprise second sacrificial via fill structures 328.

Figure 20A:
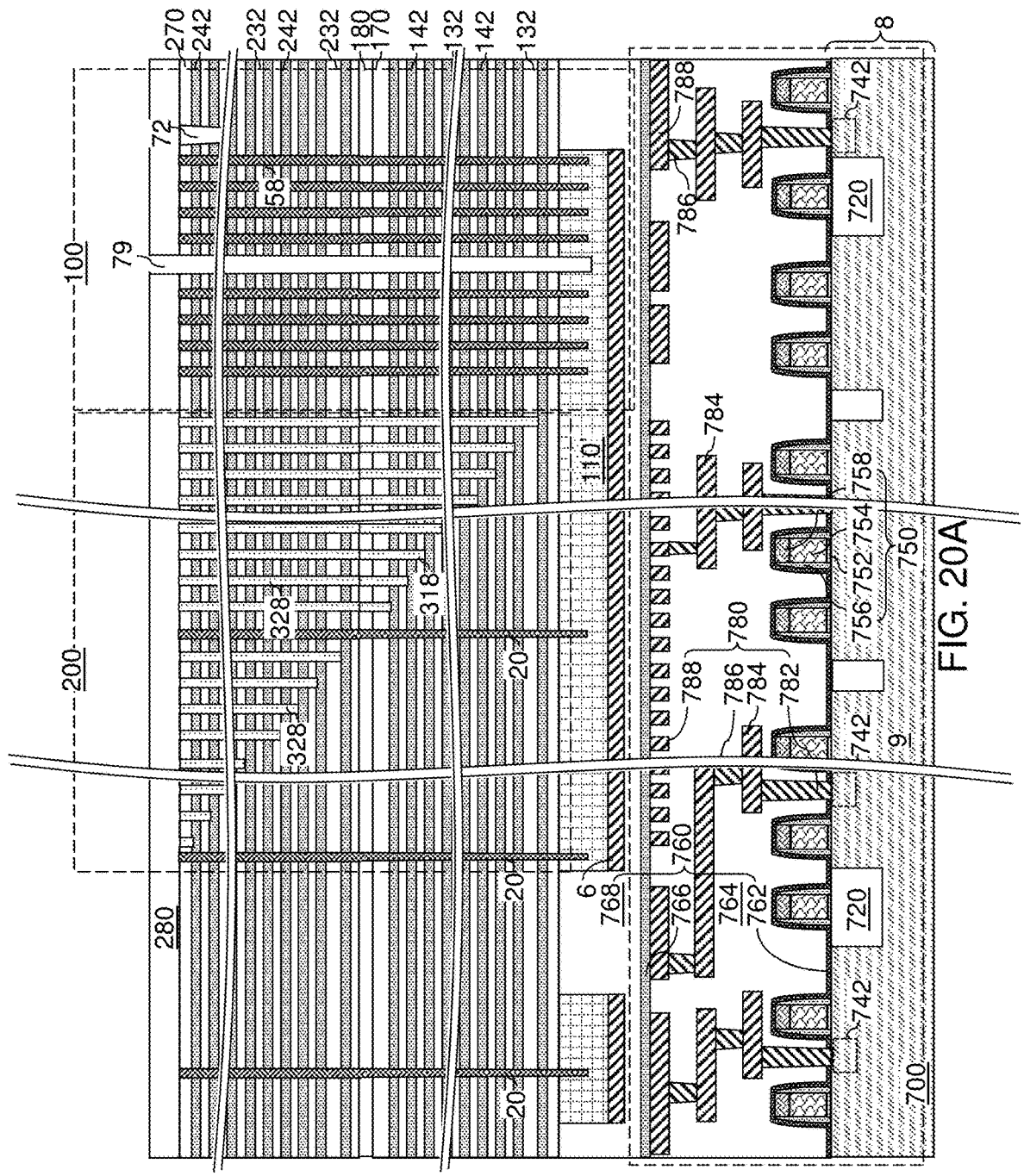
FIG. 20A is a vertical cross-sectional view of the first exemplary structure after formation of a first contact-level dielectric layer and backside trenches according to the first embodiment of the present disclosure.
Figure 20B:
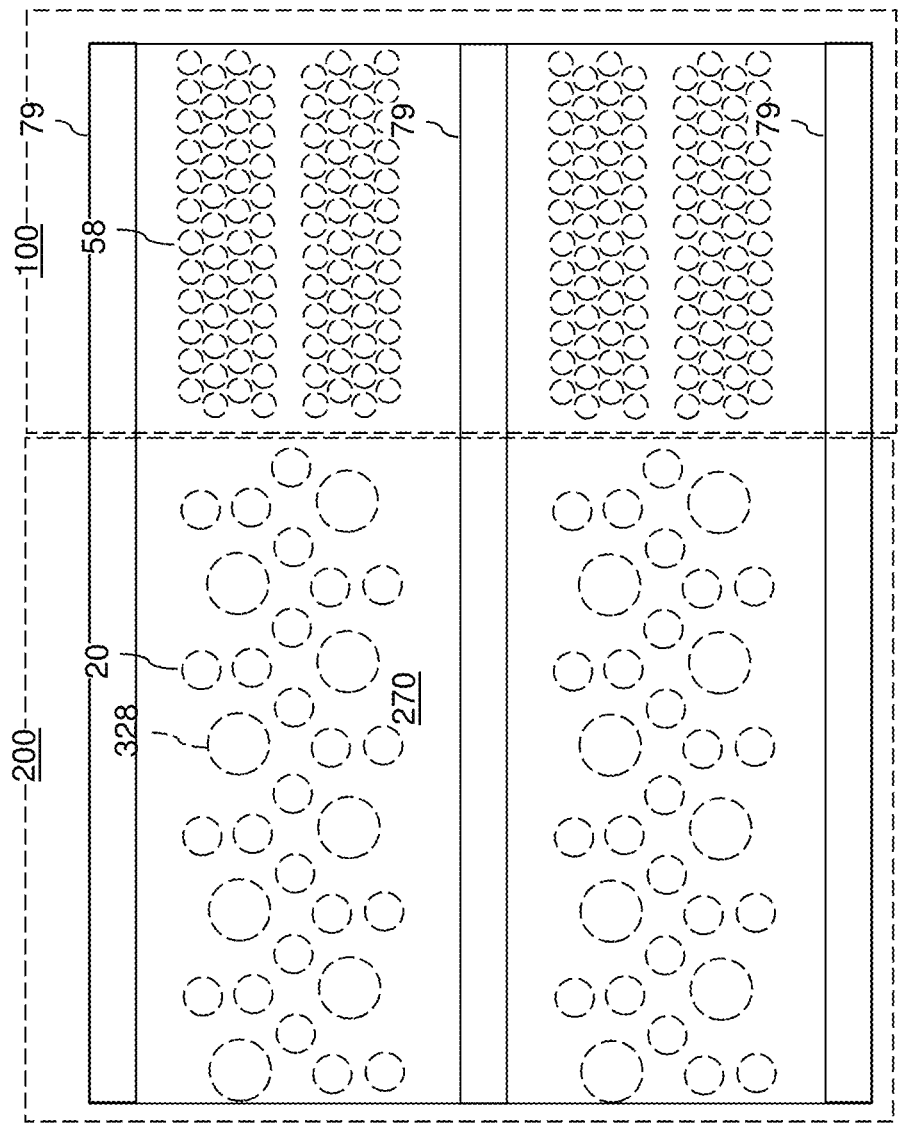
FIG. 20B is a horizontal cross-sectional view of the first exemplary structure along the horizontal plane B-B' of FIG. 20A. The hinged vertical plane A-A' corresponds to the plane of the vertical cross-sectional view of FIG. 20A.

Referring to FIGS. 20A and 20B, a contact-level dielectric layer 280 may be formed over the second-tier structure (232, 242, 270, 72). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer may be applied over the contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the contact-level dielectric layer 280, the second-tier structure (232, 242, 270, 72), and the first-tier structure (132, 142, 170), and into the in-process source-level material layers 110'. Portions of the contact-level dielectric layer 280, the second-tier structure (232, 242, 270, 72), the first-tier structure (132, 142, 170), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 21:
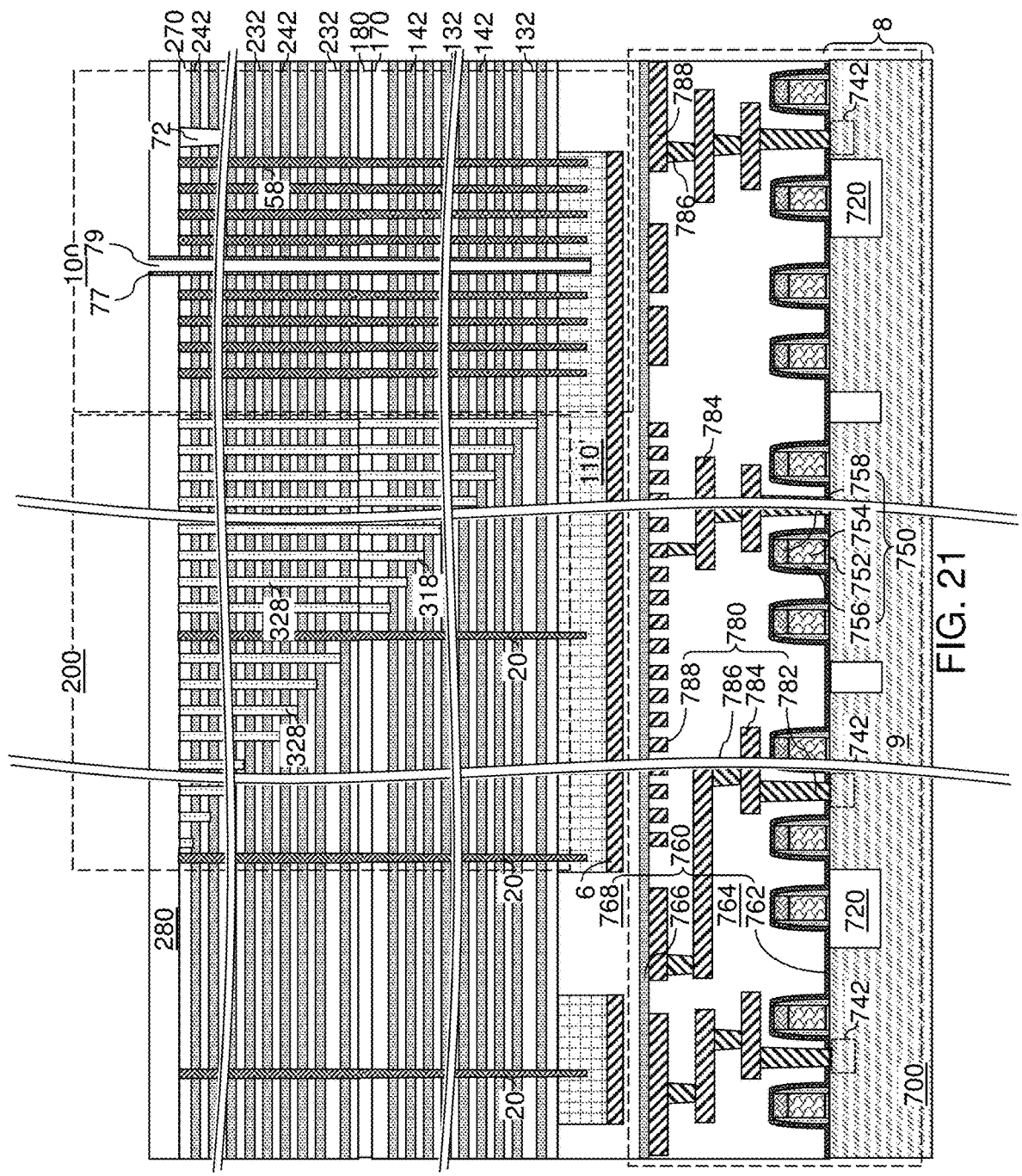
FIG. 21 is a vertical cross-sectional view of the first exemplary structure after formation of backside trench spacers according to the first embodiment of the present disclosure.
Figure 22A:
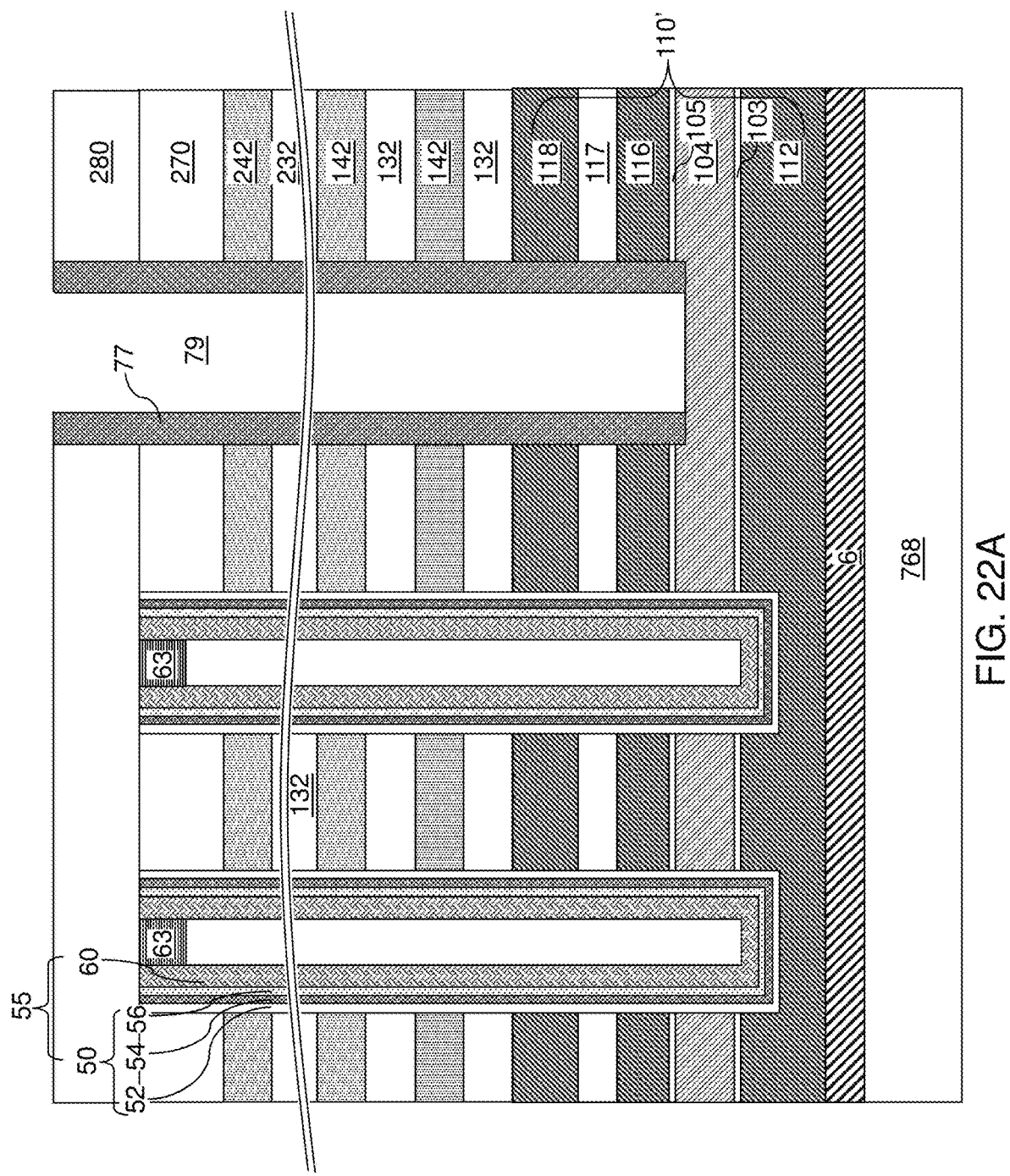
FIGS. 22A-22E illustrate sequential vertical cross-sectional views of memory opening fill structures and a backside trench during formation of source-level material layers according to the first embodiment of the present disclosure.

Referring to FIGS. 21 and 22A, a backside trench spacer 77 may be formed on sidewalls of each backside trench 79. For example, a conformal spacer material layer may be deposited in the backside trenches 79 and over the contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 22B:
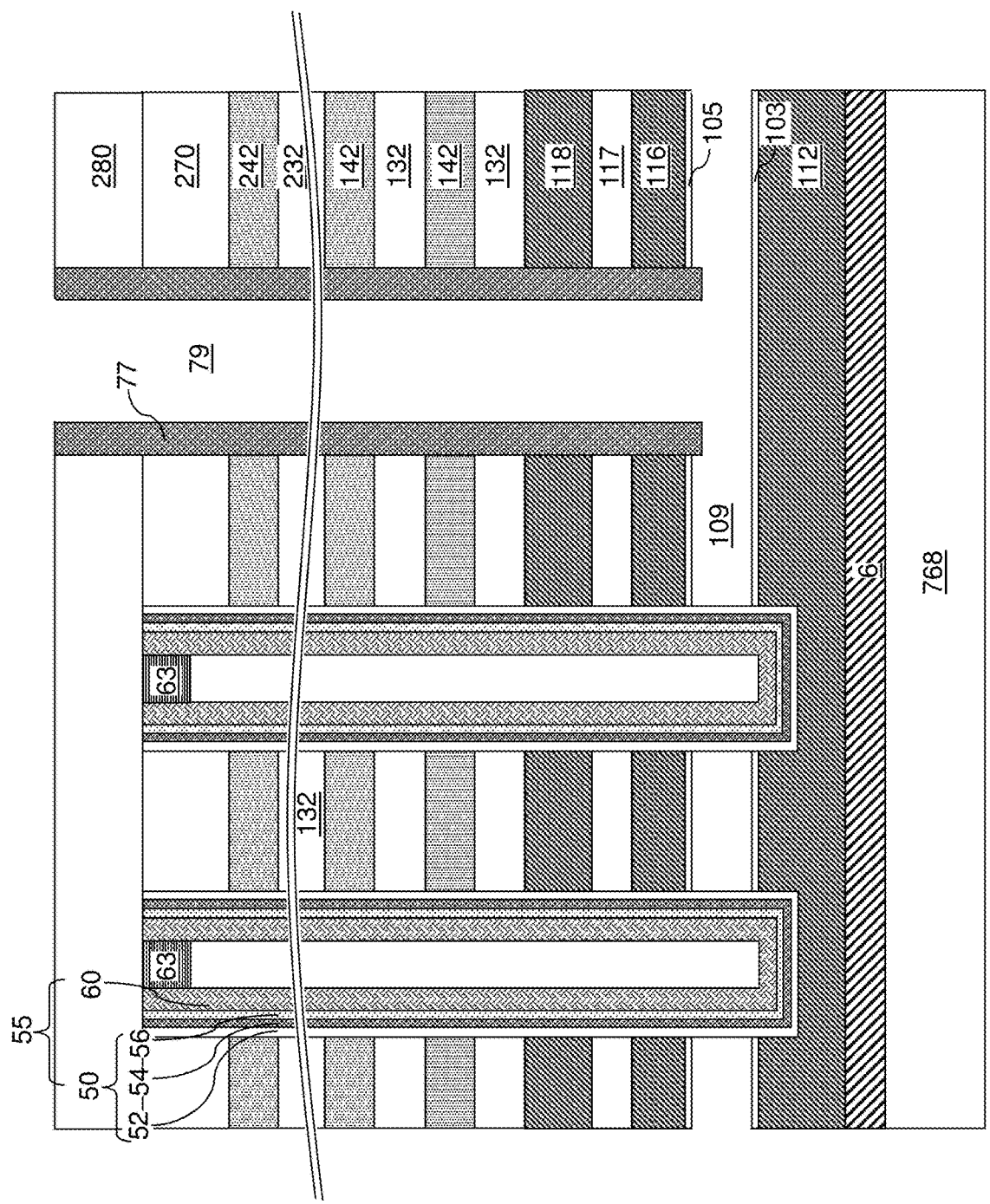

Referring to FIG. 22B, an etchant that etches the material of the source-level sacrificial layer 104 selective to the materials of the first alternating stack (132, 142), the second alternating stack (232, 242), the first and second insulating cap layers (170, 270), the contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 22C:
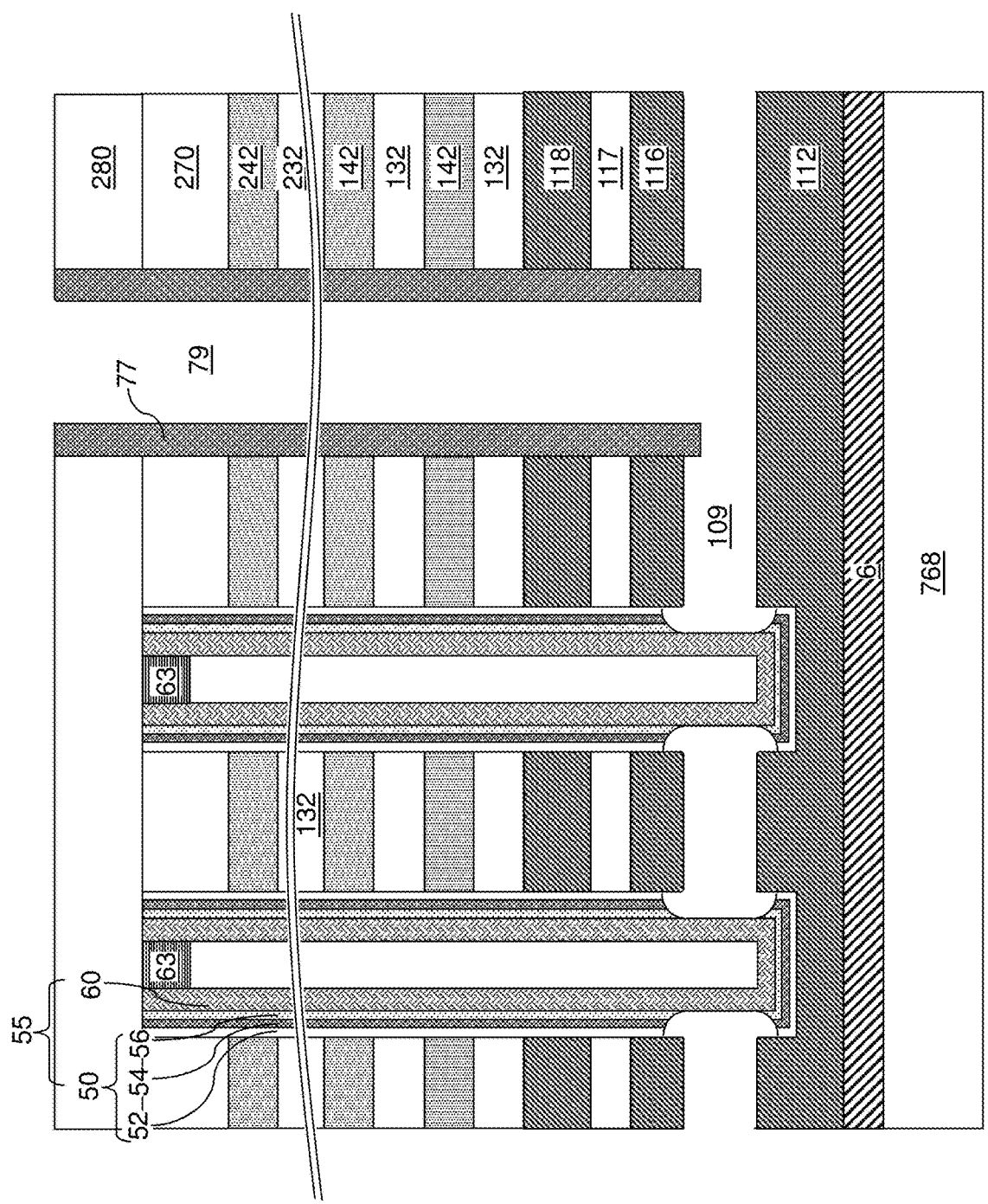

Referring to FIG. 22C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 22D:
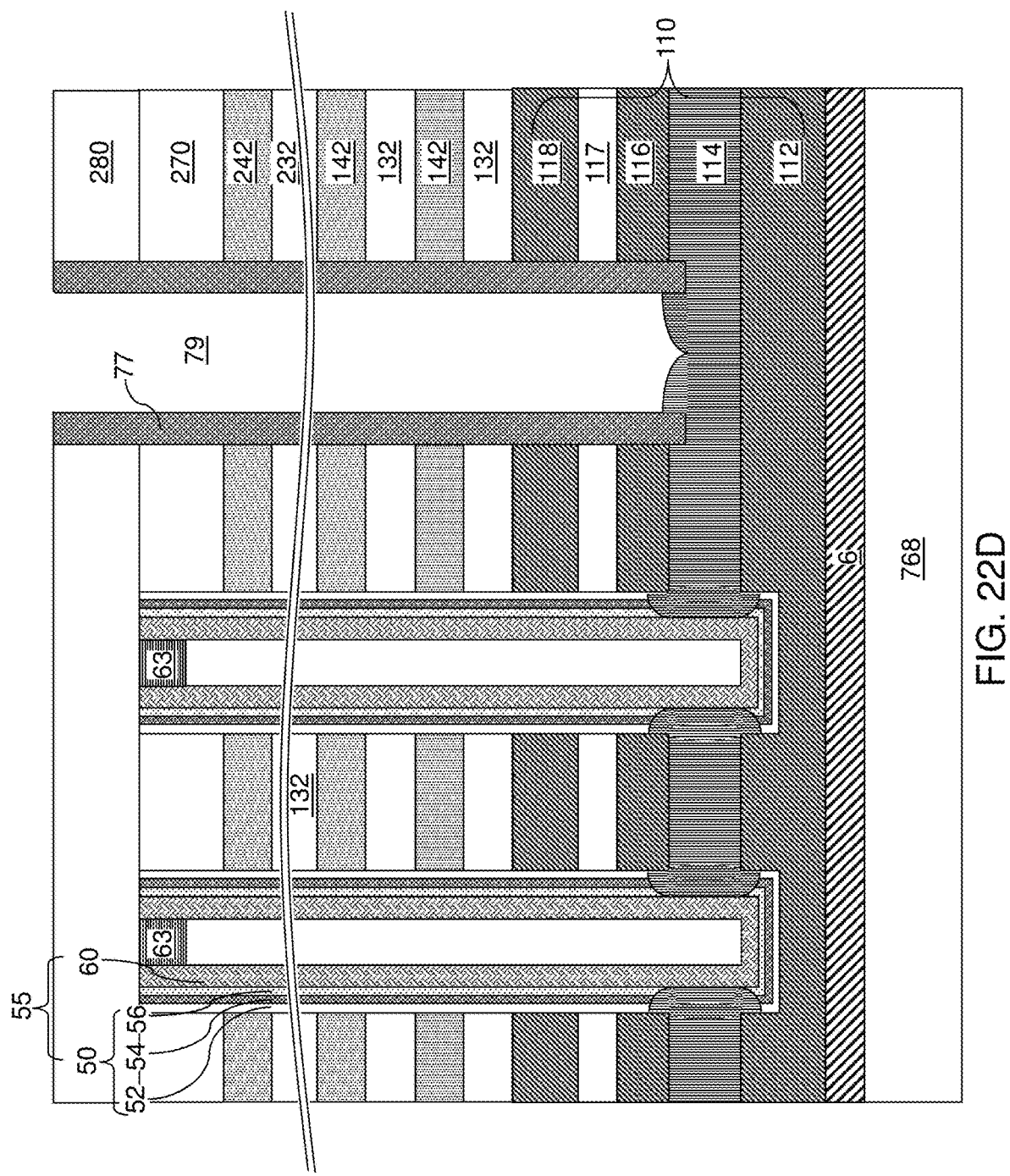

Referring to FIG. 22D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 22E:
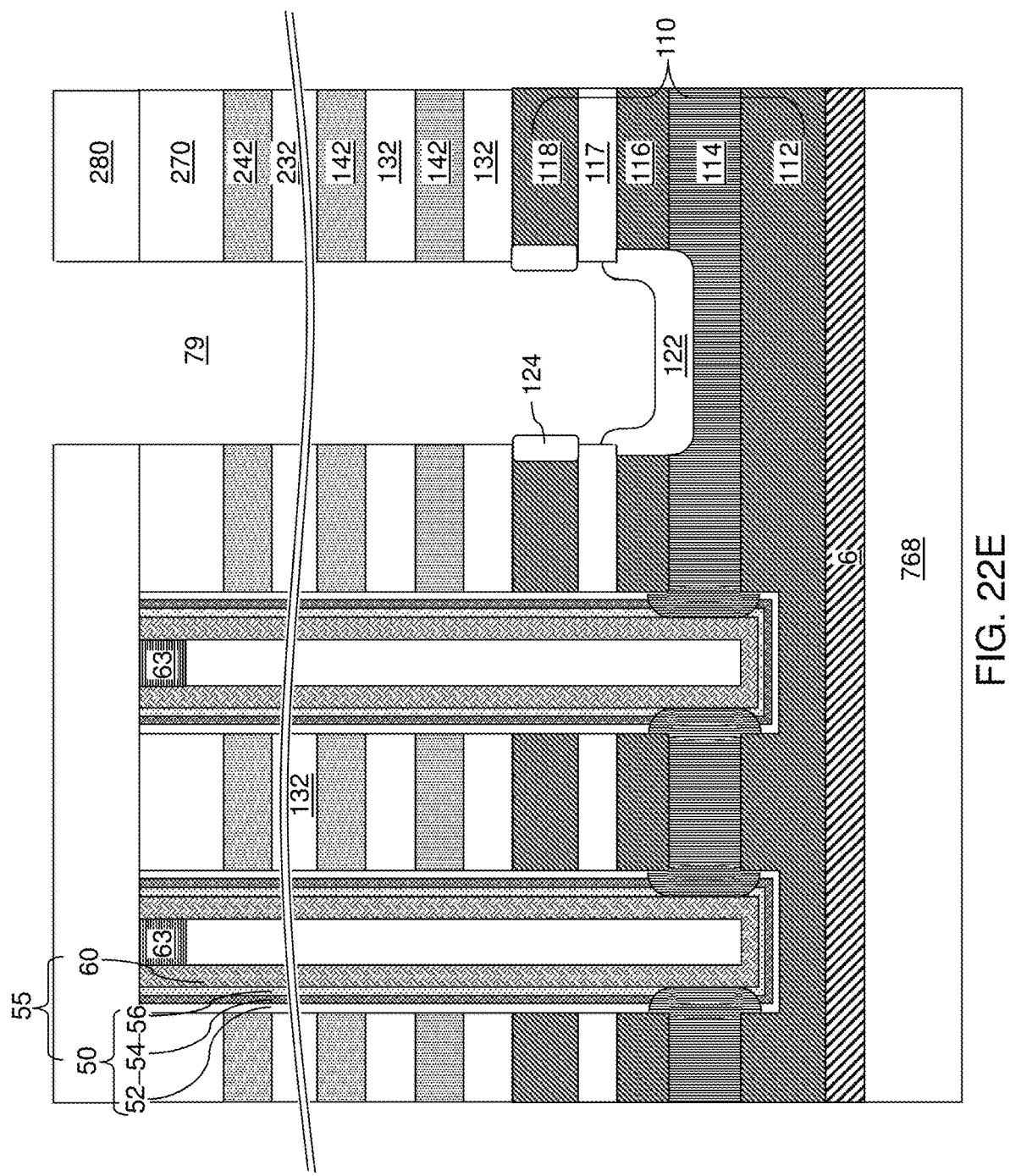
Figure 23:
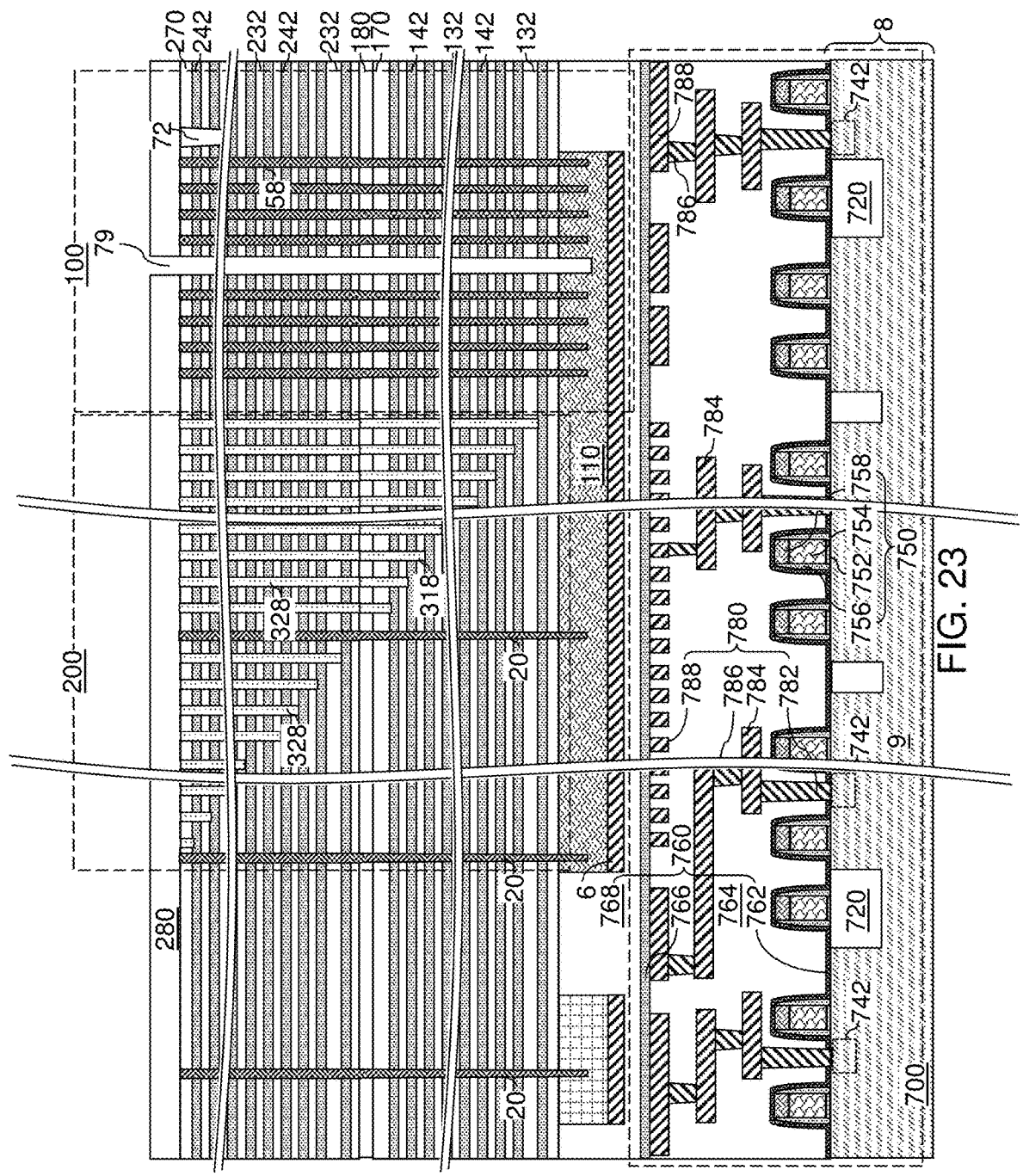
FIG. 23 is a vertical cross-sectional view of the first exemplary structure after formation of source-level material layers according to the first embodiment of the present disclosure.

Referring to FIGS. 22E and 23, the backside trench spacers 77 may be removed selective to the insulating layers (132, 232), the first and second insulating cap layers (170, 270), the contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 24:
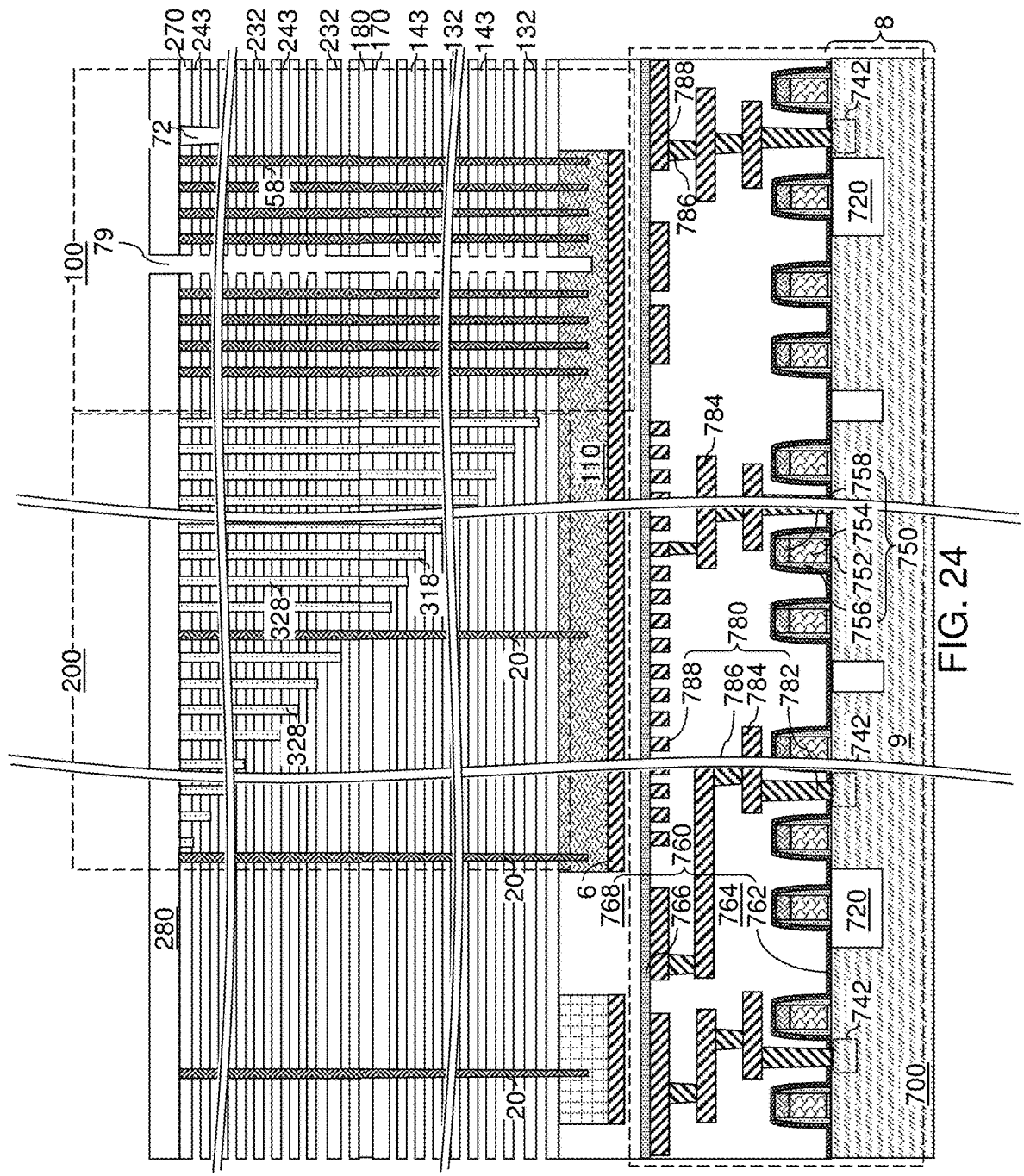
FIG. 24 is a vertical cross-sectional view of the first exemplary structure after formation of backside recesses according to the first embodiment of the present disclosure.

Referring to FIG. 24, the sacrificial material layers (142, 242) are removed selective to the insulating layers (132, 232), the first and second insulating cap layers (170, 270), the contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 25:
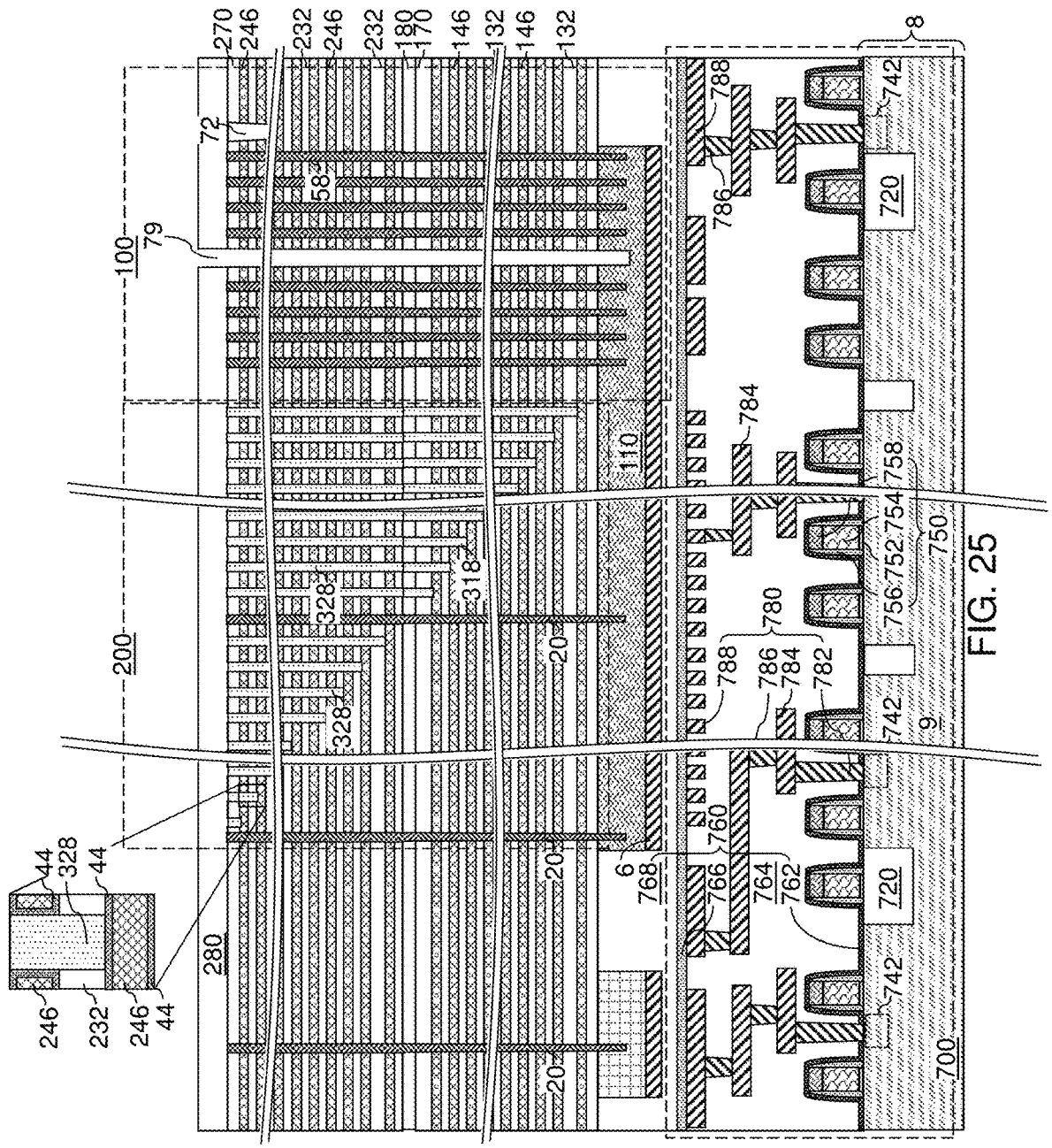
FIG. 25 is a vertical cross-sectional view of the first exemplary structure after formation of electrically conductive layers according to the first embodiment of the present disclosure.

Referring to FIG. 25, a backside blocking dielectric layer 44 may be optionally deposited in the backside recesses (143, 243) and the backside trenches 79 and over the contact-level dielectric layer 280. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 26:
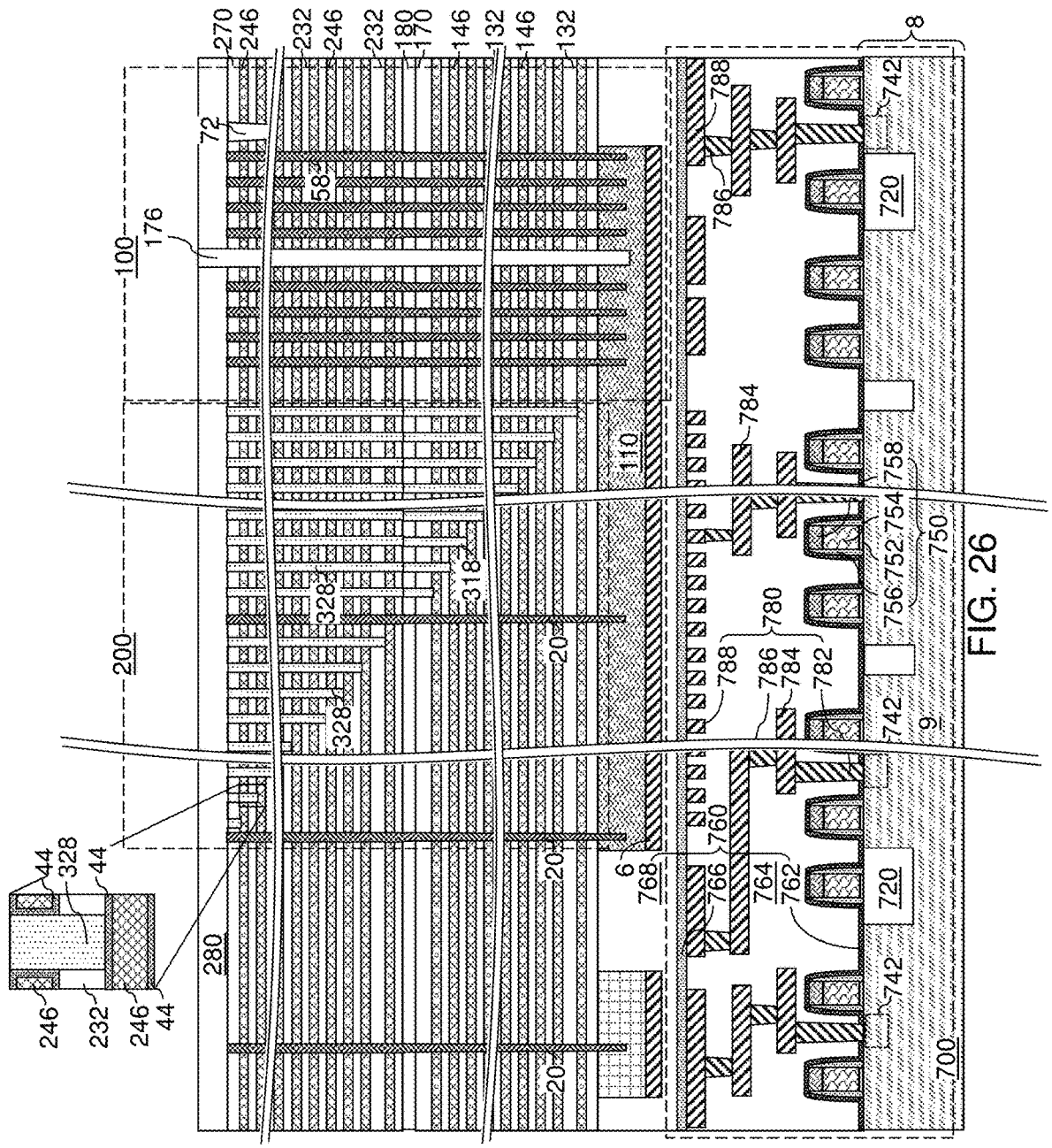
FIG. 26 is a vertical cross-sectional view of the first exemplary structure after formation of backside trench fill structures according to the first embodiment of the present disclosure.

Referring to FIG. 26, a dielectric material such as silicon oxide may be conformally deposited in the backside trenches 79 to form backside trench fill structures 176.

Figure 27:
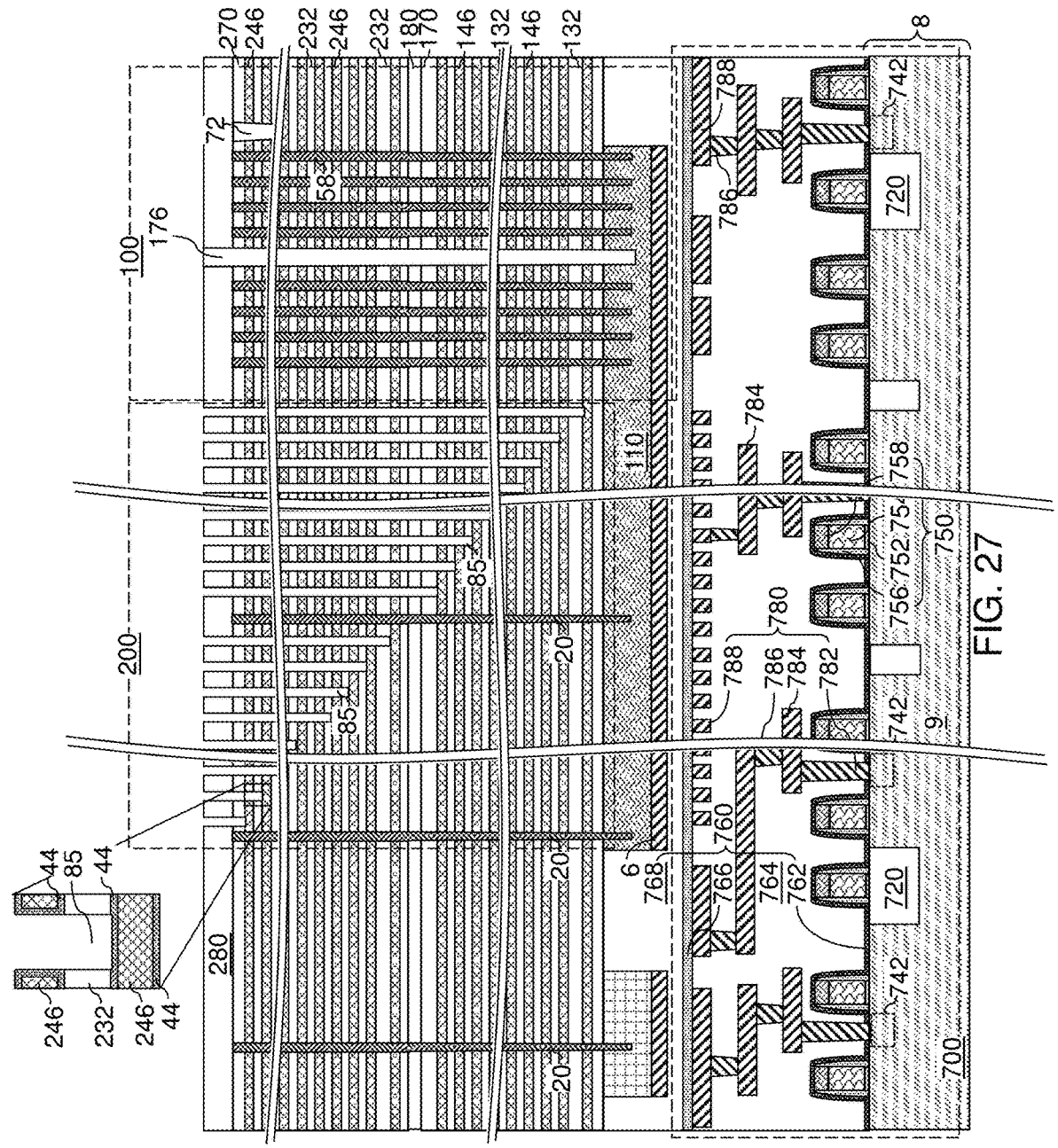
FIG. 27 is a vertical cross-sectional view of the first exemplary structure after formation of via cavities by removal of the sacrificial via fill structures according to the first embodiment of the present disclosure.

Referring to FIG. 27, openings are formed through the contact-level dielectric layer 280, for example, by applying and patterning a photoresist layer (not shown) over the contact-level dielectric layer 280 such that openings are formed in the photoresist layer in each area that overlies the second sacrificial via fill structures 328. An anisotropic etch process can be performed to transfer the pattern of the openings in the photoresist layer through the contact-level dielectric layer 280. Top surfaces of the second sacrificial via fill structures 328 are physically exposed after the anisotropic etch process.

The second sacrificial via fill structures 328 and the first sacrificial via fill structures 318 are removed selective to the materials of the insulating layers (132, 232) and the backside blocking dielectric layer 44 by an isotropic etch process. For example, a wet etch process that etches the sacrificial materials of the second sacrificial via fill structures 328 and the first sacrificial via fill structures 318 may be performed to remove the second sacrificial via fill structures 328 and the first sacrificial via fill structures 318. Contact via cavities 85 are formed in volumes from which the second sacrificial via fill structures 328 and the first sacrificial via fill structures 318 are removed. The contact via cavities 85 comprise voids that are formed in the volumes of the first via cavities 319 and the second via cavities 329. As such, the volumes of the contact via cavities 85 can be the same as the union of the volumes of the first via cavities 319 and the second via cavities 329. Generally, the contact via cavities 85 can be formed by removing the sacrificial via fill structures (318, 328). If desired, the exposed portions of the backside blocking dielectric 44 at the bottom of the contact via cavities 85 may optionally be removed by etching at this time.

Figure 28:
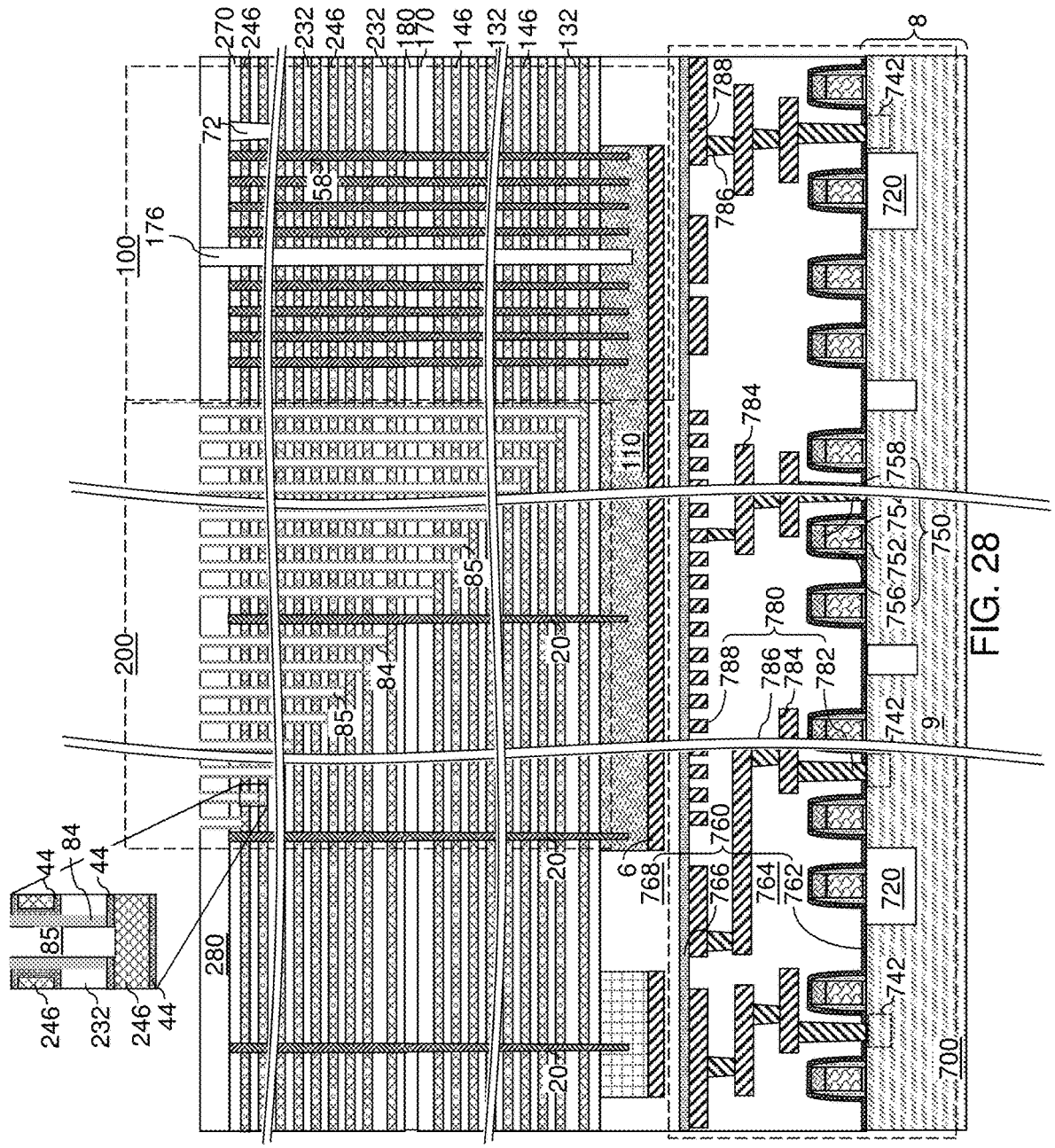
FIG. 28 is a vertical cross-sectional view of the first exemplary structure after formation of tubular dielectric spacers according to the first embodiment of the present disclosure.

Referring to FIG. 28, a dielectric material layer can be conformally deposited in the contact via cavities 85. The dielectric material includes a dielectric material such as silicon oxide, and can be deposited by a conformal deposition process such as a chemical vapor deposition process. The thickness of the dielectric material layer may be in a range from 5 nm to 100 nm, such as from 10 nm to 50 nm, although lesser and greater thicknesses may also be employed. An anisotropic etch process can be performed to remove horizontal portions of the dielectric material layer. Each remaining tubular portion of the dielectric material layer located at peripheral regions of the contact via cavities 85 comprises a tubular dielectric spacer 84. The anisotropic etch process can include an overetch step that etches through physically exposed horizontal portions of the backside blocking dielectric layers 44 (if present) at the bottom of each contact via cavity 85 to expose a respective underlying electrically conductive layer (146, 246).

The physically exposed portions of the backside blocking dielectric layers 44 are removed after removal of the sacrificial via fill structures (318, 328) either before or after formation of the tubular dielectric spacers 84. Cylindrical surfaces (e.g., sidewalls) of the backside blocking dielectric layers 44 are physically exposed to the voids in the volumes of the contact via cavities 85 upon removal of the sacrificial via fill structures (318, 328). A top surface of an electrically conductive layer (146, 246) can be physically exposed at the bottom of each contact via cavity 85.

Figure 29:
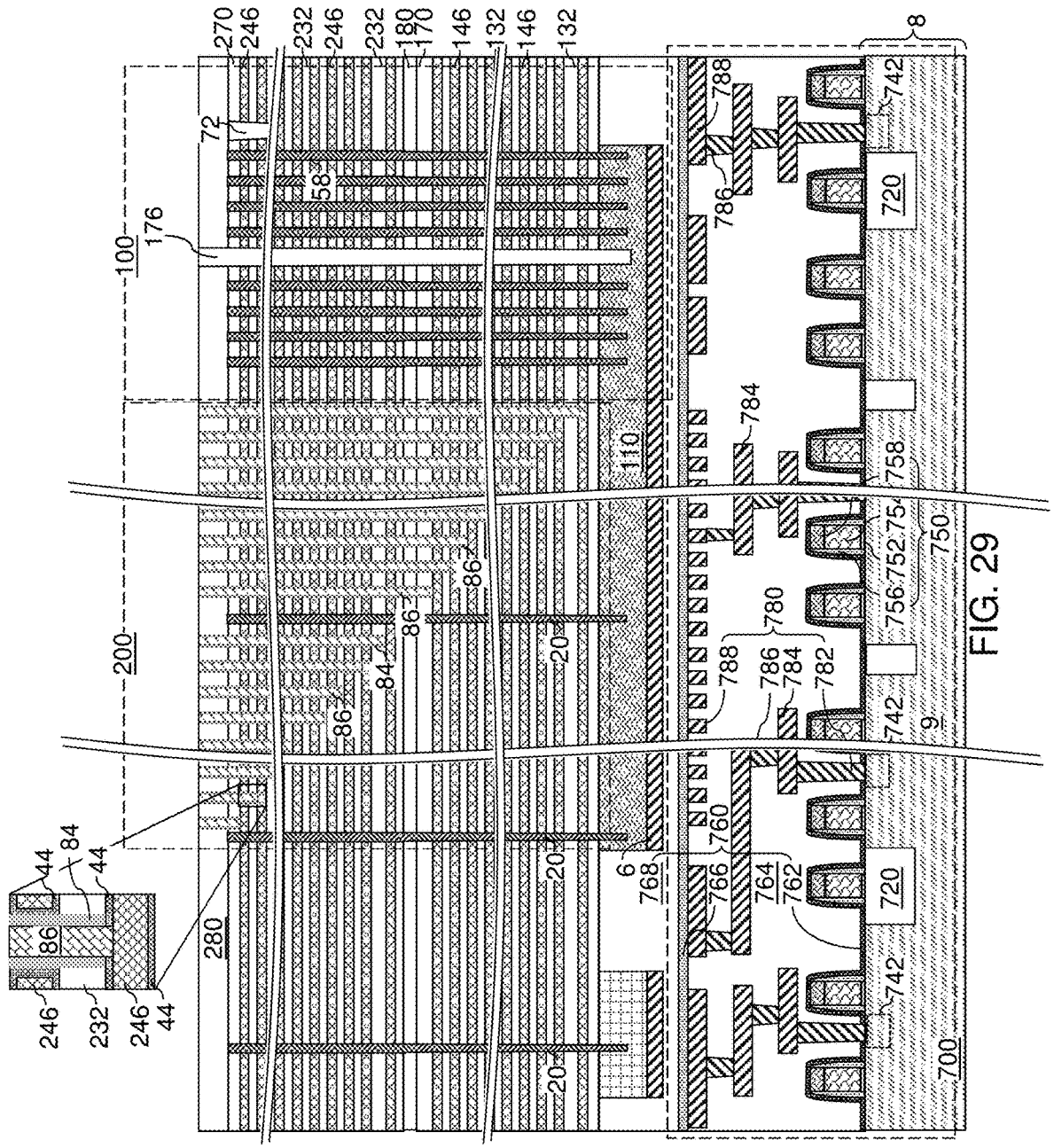
FIG. 29 is a vertical cross-sectional view of the first exemplary structure after formation of contact via structures according to the first embodiment of the present disclosure.

Referring to FIG. 29, at least one conductive material can be deposited in the contact via cavities 85. The at least one conductive material can include, for example, an optional conductive metallic liner material and a conductive fill material. The conductive metallic liner material can include a conductive metallic nitride material such as TiN, TaN, and/or WN. The conductive metallic liner material can be deposited, for example, by a chemical mechanical deposition process. The conductive fill material can include, for example, W, Ru, Co, Mo, Ti, Ta, and/or Cu. The conductive fill material can be deposited by physical vapor deposition, chemical vapor deposition, electroplating, and/or electroless plating. Excess portions of the at least one conductive material can be removed from above the horizontal plane including the top surface of the contact-level dielectric layer 280.

Each remaining portion of the at least one conductive material that fills a respective contact via cavity 85 constitutes a contact via structure 86. The contact via structures 86 may be formed directly on the exposed cylindrical surfaces of the backside blocking dielectric layers 44. Thus, the contact via structures 86 are formed in remaining volumes of the contact via cavities 85 on an inner sidewall of a respective one of the tubular dielectric spacers 84, and directly on a top surface of a respective one of the electrically conductive layers (146, 246). In one embodiment, each of the contact via structures 86 can be formed directly on a respective sidewall of a horizontal portion of the backside blocking dielectric layer 44. Each contiguous combination of a tubular dielectric spacer 84 and a contact via structure 86 constitutes a laterally-isolated contact via assembly (84, 86).

Figure 30:
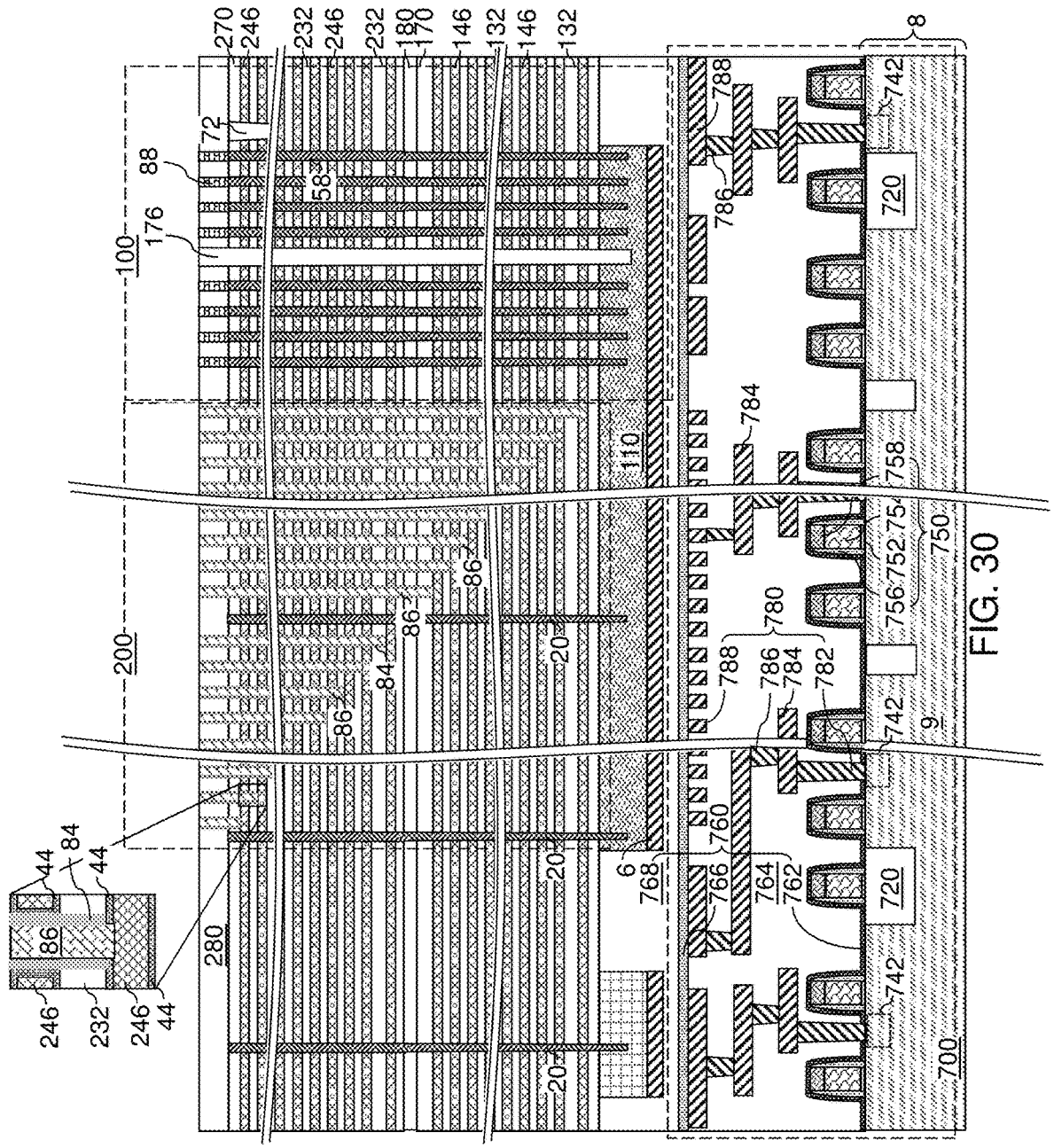
FIG. 30 is a vertical cross-sectional view of the first exemplary structure after formation of drain contact via structures according to the first embodiment of the present disclosure.

Referring to FIG. 30, drain contact via structures 88 can be formed through the contact-level dielectric layer 280 on top surfaces of the drain regions 63, which are located within the memory opening fill structures 58. In the previously described aspect of the first embodiment, the memory opening fill structures 58 are formed before forming the via cavities 329 and then contact via structures 86. However, in an alternative aspect of the first embodiment, the via cavities 329 and/or the contact via structures 86 are formed before the memory opening fill structures 58.

Referring to FIGS. 1A-30 and according to various embodiments of the present disclosure, a three-dimensional memory device is provided, which comprises; an alternating stack {(132, 146). (232, 246)} of insulating layers (132, 232) and electrically conductive layers (146, 246) located over a substrate 8; memory openings 49 located in a memory array region 100 and vertically extending through the alternating stack {(132, 146). (232, 246)} and including memory opening fill structures 58 therein; laterally-isolated contact via assemblies (84, 86) located in a contact region 200 that is located adjacent to the memory array region 100, wherein each of the laterally-isolated contact via assemblies (84, 86) comprises a contact via structure 86 contacting a top surface of a respective one of the electrically conductive layers (146, 246) and a tubular dielectric spacer 84 laterally surrounding the contact via structure 86, wherein each contact via structure 86 other than a contact via structure 86 contacting a topmost one of the electrically conductive layers (146, 246) extends through and is laterally surrounded by each electrically conductive layer that overlies the respective electrically conductive layer, and wherein the alternating stack {(132, 146), (232, 246)} is free of stepped surfaces within the contact region 200.

In one embodiment, each of the memory opening fill structures 58 comprises a vertical semiconductor channel 60 and a memory film 50. In one embodiment, backside blocking dielectric layers 44 can be located between each vertically neighboring pair of an insulating layer (132, 232) and an electrically conductive layer (146, 246) within the alternating stack {(132, 146), (232, 246)}, wherein each contact via structure 86 contacts and extends through a respective one of the backside blocking dielectric layers 44 that contacts a top surface of the respective electrically conductive layer (146, 246).

In one embodiment, each tubular dielectric spacer 84 comprises an annular bottom surface that contacts a top surface of a respective one of the backside blocking dielectric layers 44. In one embodiment, each tubular dielectric spacer 84 vertically extends through the topmost one of the electrically conductive layers (146, 246) contacts a respective cylindrical sidewall of one of the backside blocking dielectric layers 44 that contacts the topmost one of the electrically conductive layers (146, 246).

In one embodiment, a bottom of each contact via structure 86 contacts an interface boundary at the top surface of the respective one of the electrically conductive layers (146, 246). The interface boundary may comprise a grain boundary between the contact via structure 86 and the top surface of the respective one of the electrically conductive layers (146, 246). If the contact via structure 86 and the electrically conductive layers (146, 246) comprise different conductive materials, then the interface boundary may comprise a compositional boundary at which the composition of the electrically conductive material is different on opposite sides of the compositional boundary. In one embodiment, the bottom of each contact via structure 86 contacts the top surface of the respective one of the electrically conductive layers (146, 246) such that the top surface extends past the bottom of the contact via structure 86 in all horizontal directions (i.e., the contact via structure 86 contacts an inner portion rather than the extreme edge or end portion of the top surface of the respective electrically conductive layer (146, 246)).

Figure 31:
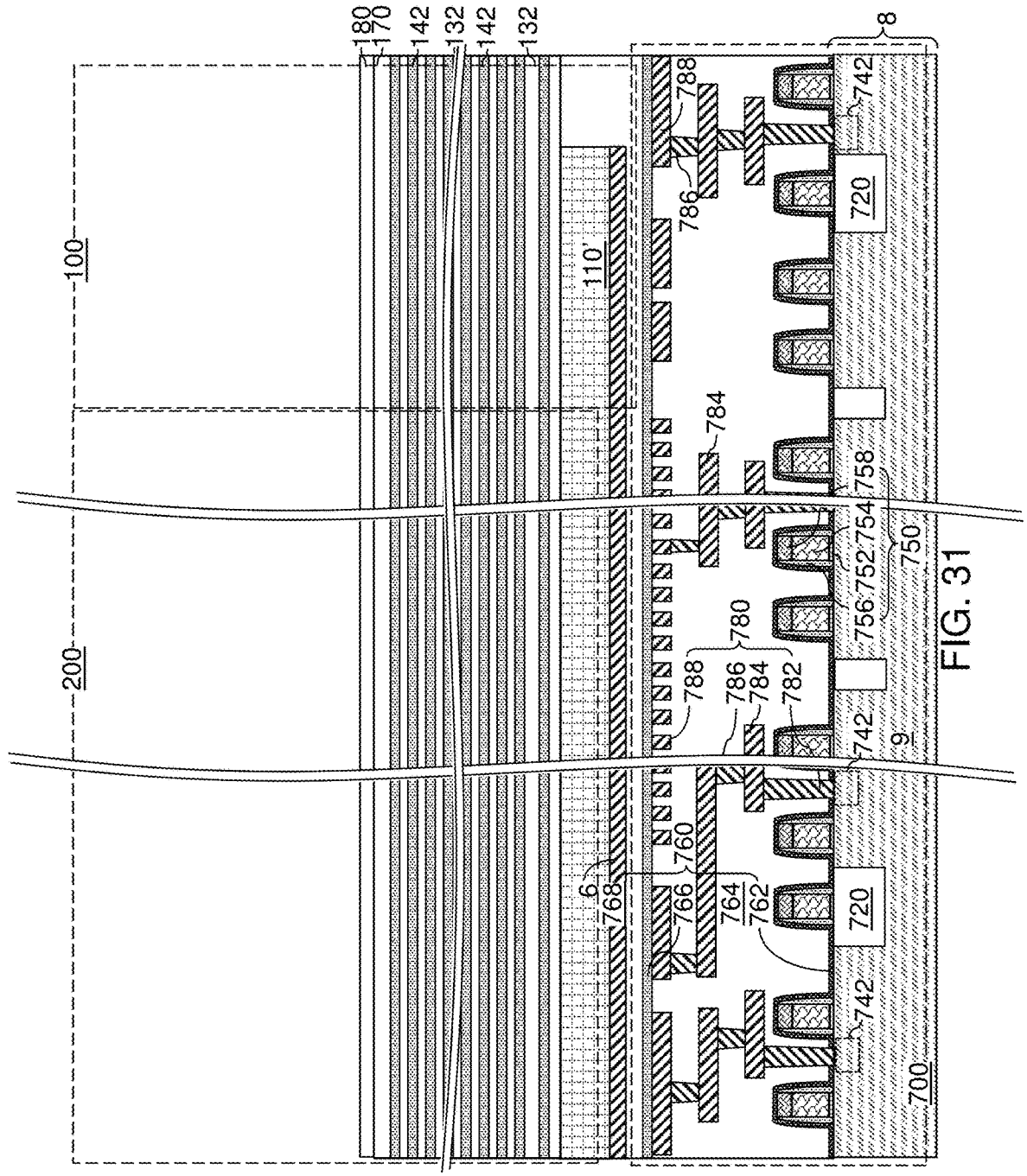
FIG. 31 is a vertical cross-sectional view of the second exemplary structure after formation of a first alternating stack of first insulating layers and first sacrificial material layers according to a second embodiment of the present disclosure.

Referring to FIG. 31, a second exemplary structure according to a second embodiment of the present disclosure can be the same as the first exemplary structure of FIG. 2.

Figure 32:
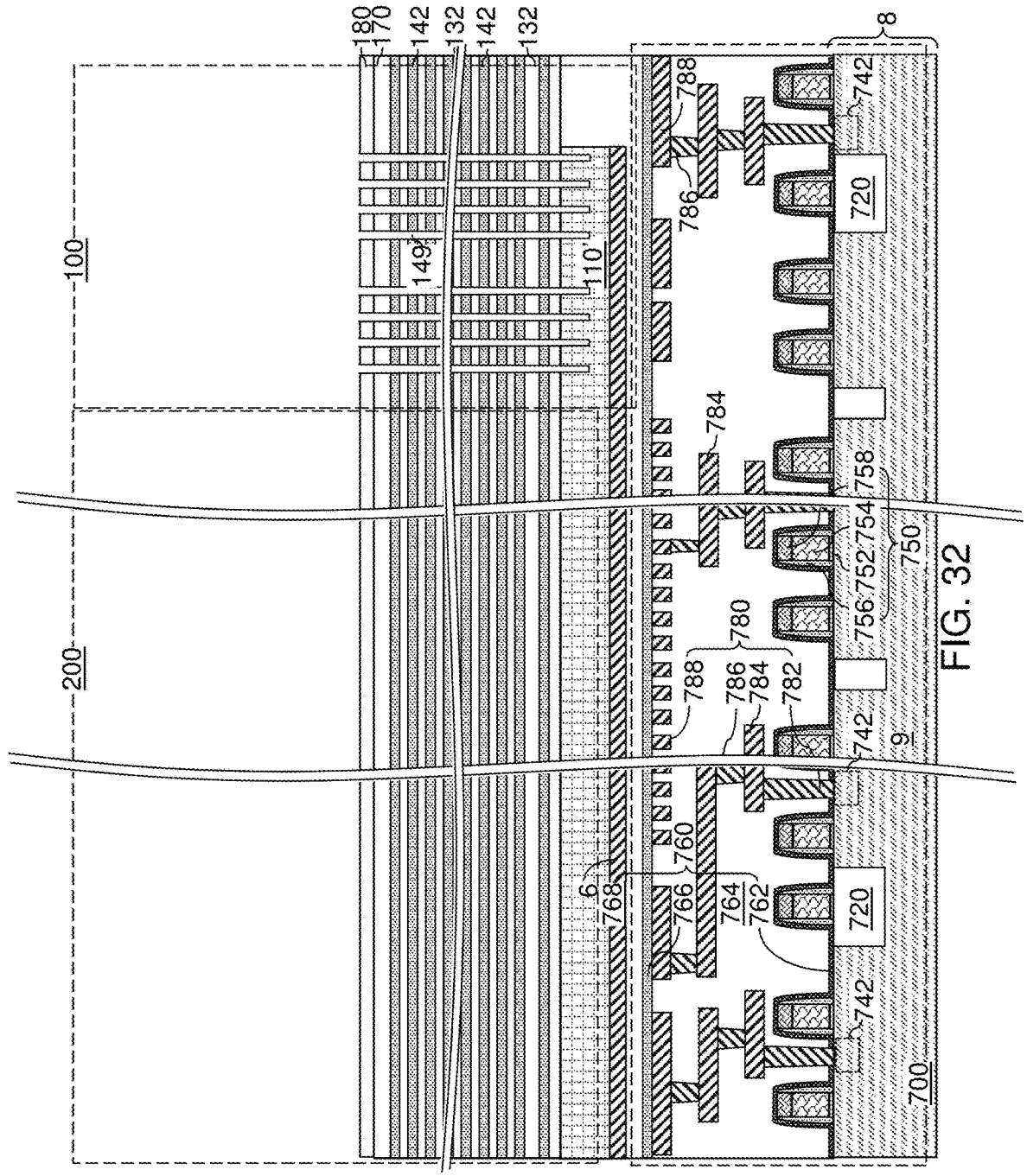
FIG. 32 is a vertical cross-sectional view of the second exemplary structure after formation of first-tier memory openings according to the second embodiment of the present disclosure.

Referring to FIG. 32, the processing steps of FIG. 3 can be performed with a modification in the pattern of openings in the photoresist layer to form first-tier memory openings 149 without forming first-tier support openings.

Figure 33:
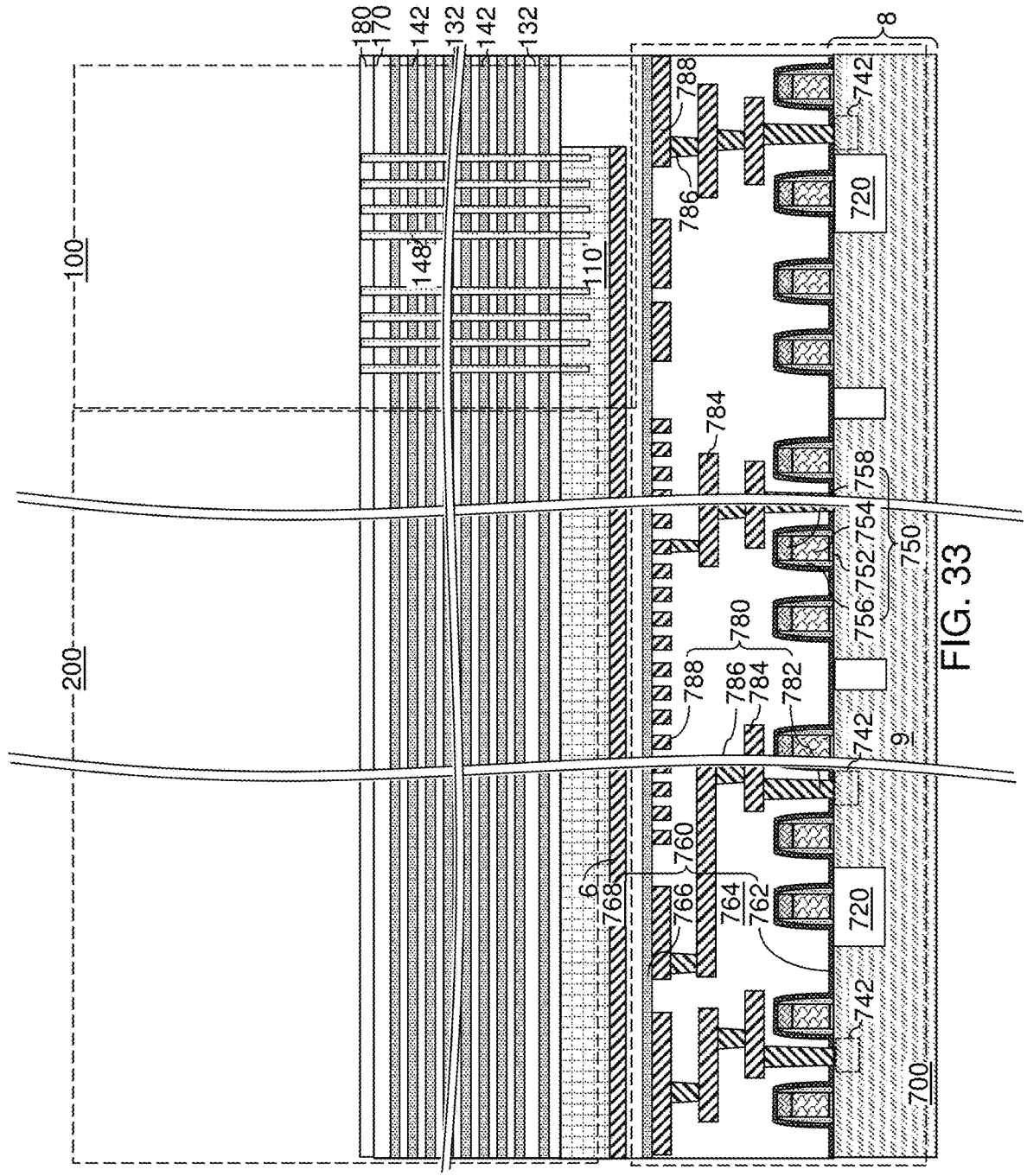
FIG. 33 is a vertical cross-sectional view of the second exemplary structure after formation of first-tier memory opening fill structures according to the second embodiment of the present disclosure.

Referring to FIG. 33, the processing steps of FIG. 4 can be performed to form sacrificial first-tier memory opening fill portions 148.

Figure 34:
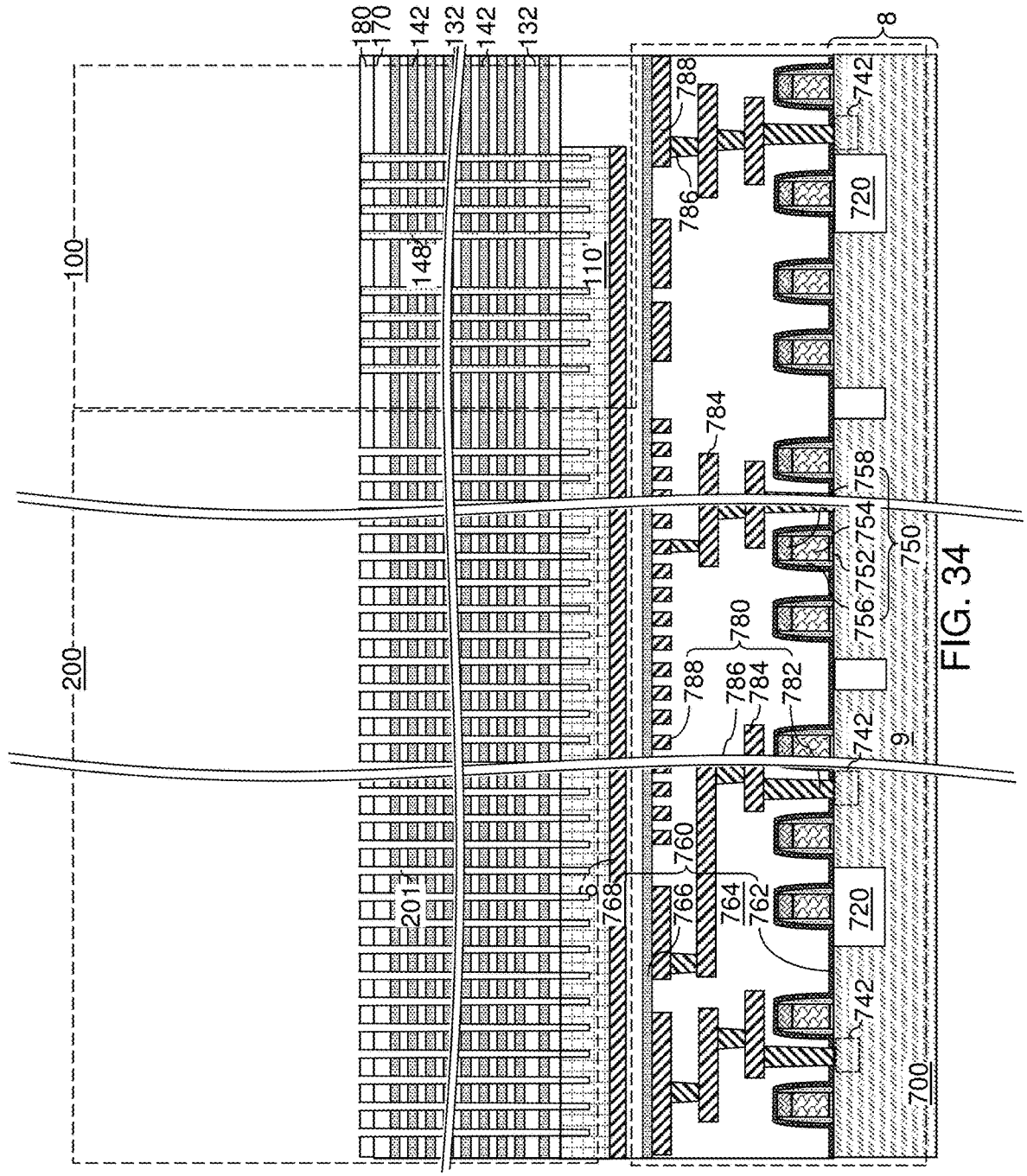
FIG. 34 is a vertical cross-sectional view of the second exemplary structure after formation of first-tier support openings according to the second embodiment of the present disclosure.

Referring to FIG. 34, a photoresist layer (not shown) can be applied over the second exemplary structure, and can be lithographically patterned to form openings within the areas of the contact region 200. An anisotropic etch process can be performed to form first-tier support openings 119 through the first-tier alternating stack (132, 142) and into the in-process source level material layers 110'. In one embodiment, the first-tier support openings 119 can be arranged in periodic two-dimensional arrays.

Figure 35B:
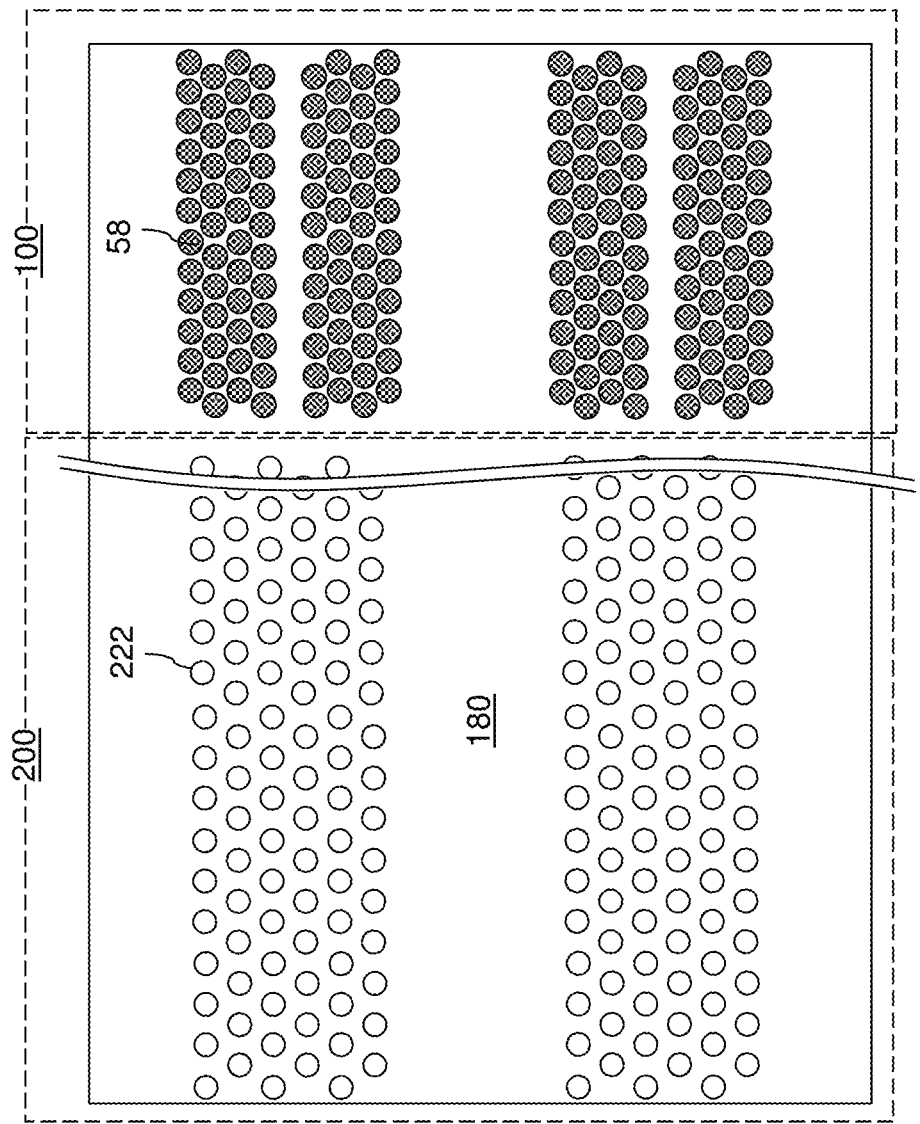
FIG. 35B is a top-down view of the second exemplary structure of FIG. 35B.

Referring to FIGS. 35A and 35B, a dielectric fill material such as silicon oxide can be deposited in the first-tier support openings 119 by a conformal deposition process such as chemical vapor deposition. Excess portions of the dielectric fill material can be removed from above the horizontal plane including the top surface of the inter-tier dielectric layer 180. Remaining portions of the dielectric fill material in the first-tier support openings 119 comprise first-tier support pillar structures 222.

In an alternative embodiment, the first-tier memory openings 149 are formed after forming the first-tier support pillar structures 222 in the first-tier support openings 119.

Referring to FIG. 36, the processing steps of FIG. 13 can be performed to form a second alternating stack of second insulating layers 232 and second electrically conductive layers 246.

Figure 37:
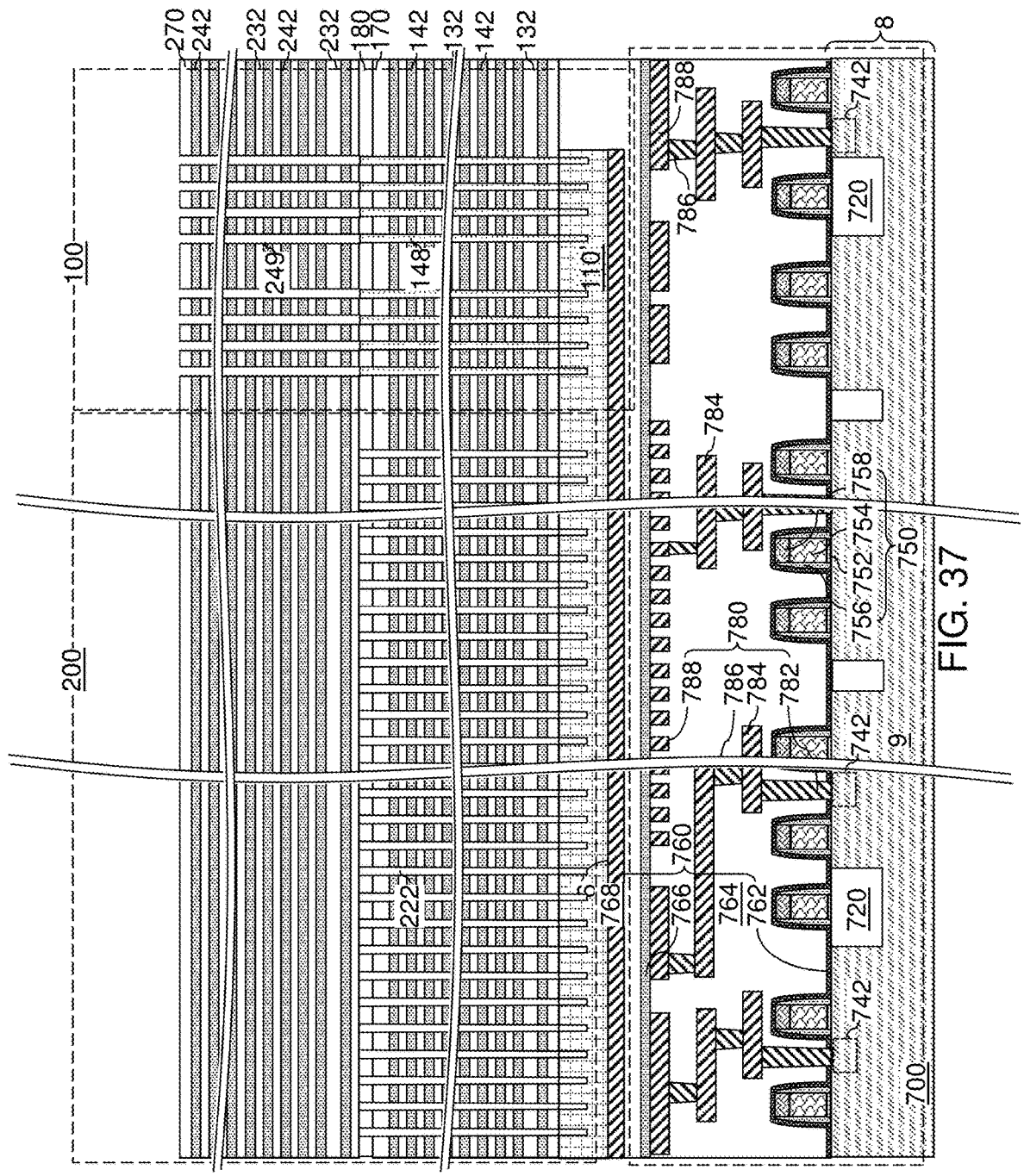
FIG. 37 is a vertical cross-sectional view of the second exemplary structure after formation of second-tier memory openings according to the second embodiment of the present disclosure.

Referring to FIG. 37, the processing steps of FIG. 14 can be performed with a modification in the pattern of openings in the photoresist layer to form second-tier memory openings 249 without forming second-tier support openings.

Figure 38:
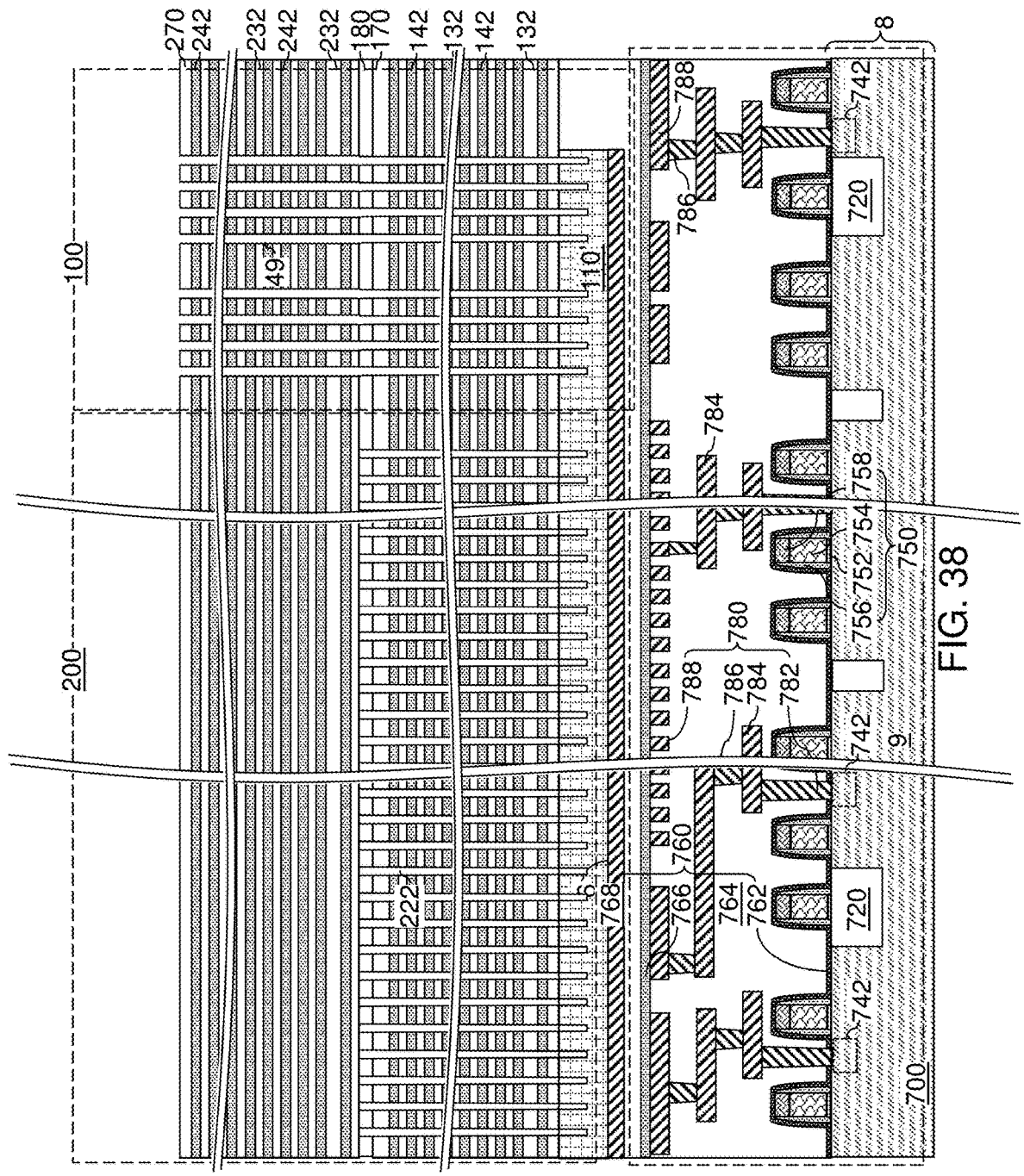
FIG. 38 is a vertical cross-sectional view of the second exemplary structure after formation of inter-tier memory openings according to the second embodiment of the present disclosure.

Referring to FIG. 38, the processing steps of FIG. 15 can be performed to form inter-tier memory openings 49.

Figure 39:
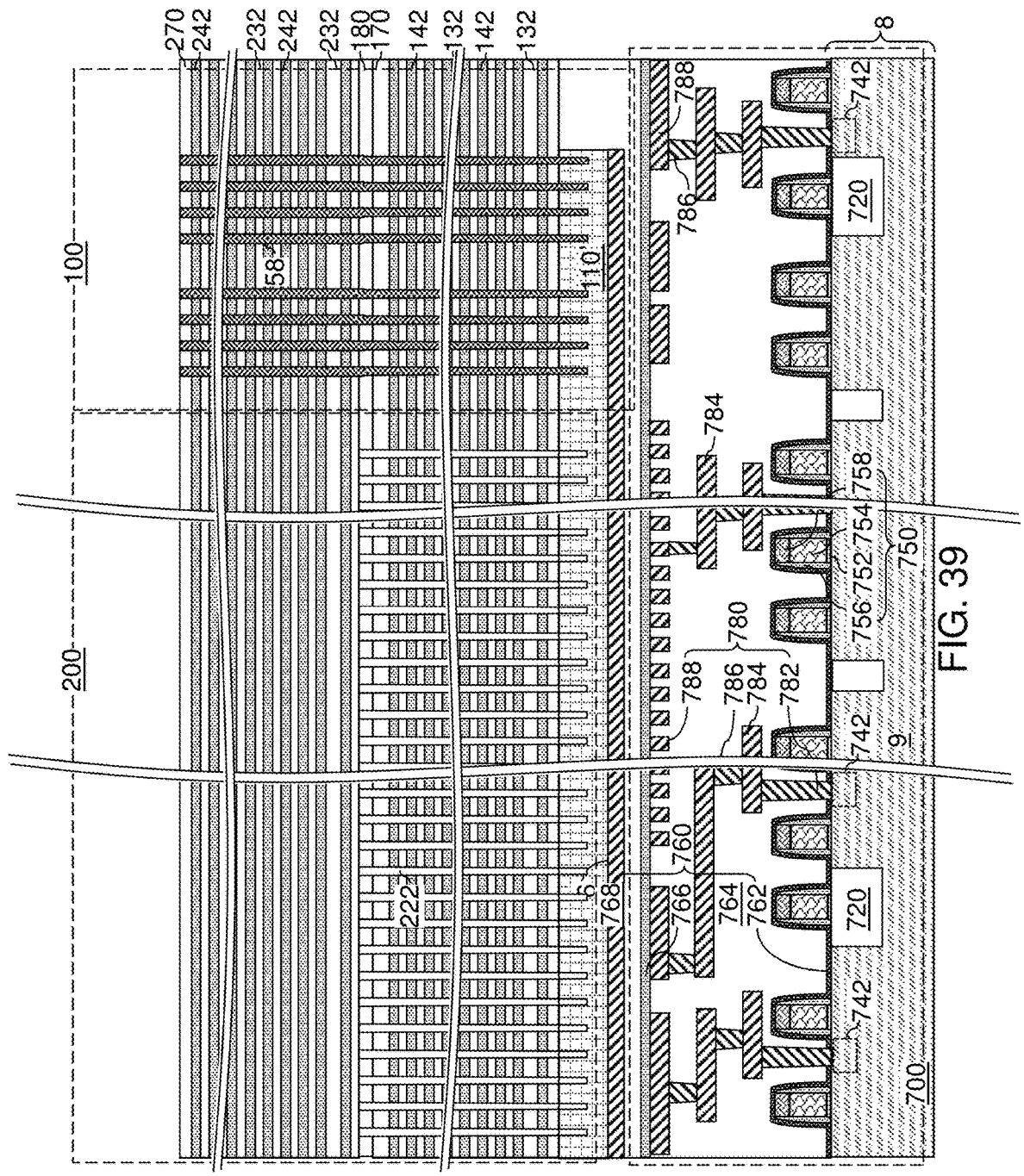
FIG. 39 is a vertical cross-sectional view of the second exemplary structure after formation of memory opening fill structures according to the second embodiment of the present disclosure.

Referring to FIG. 39, the processing steps of FIGS. 16A-16D can be performed to form the memory opening fill structures 58.

Figure 40A:
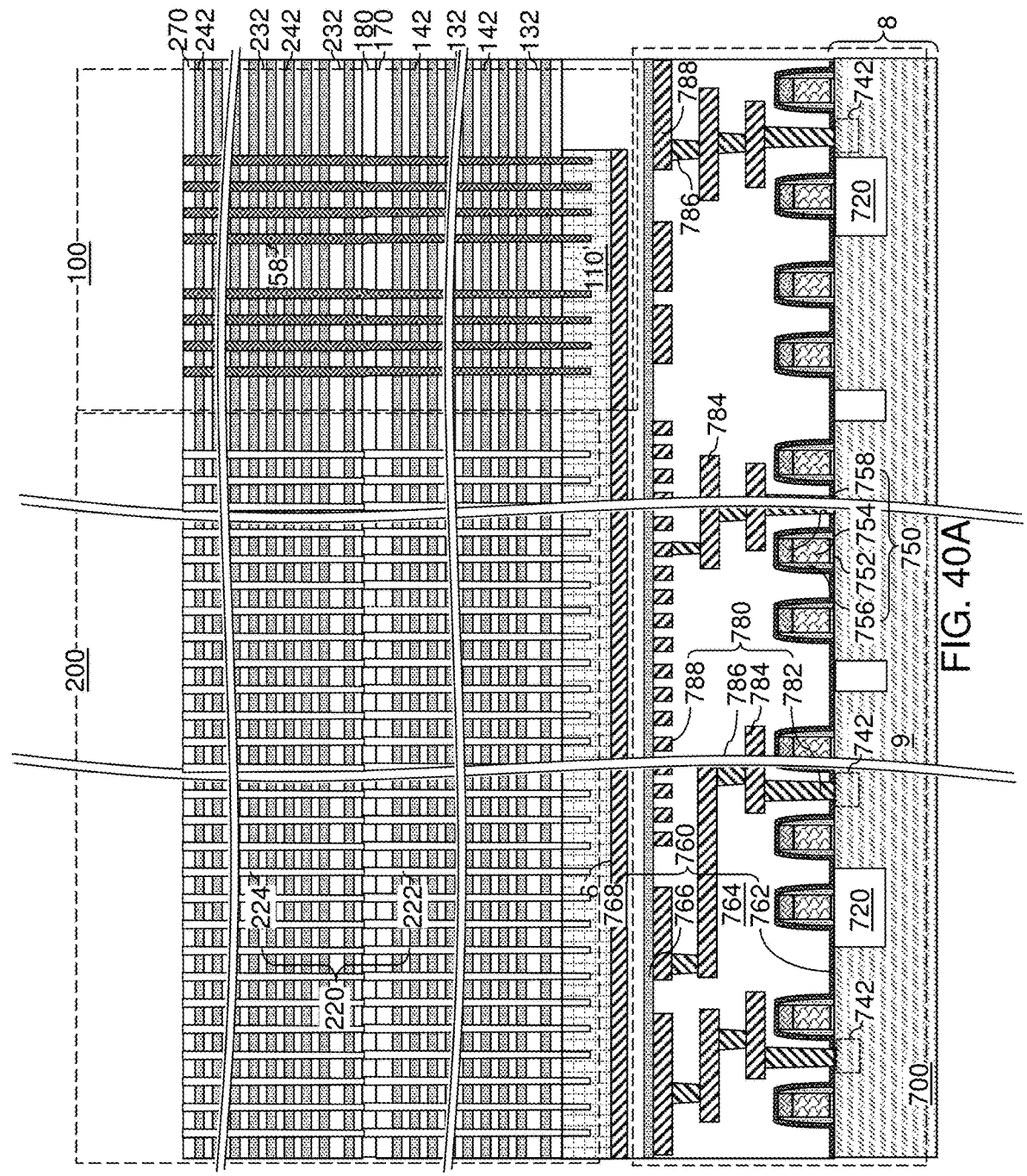
FIG. 40A is a vertical cross-sectional view of the second exemplary structure after formation of second-tier support pillar structures according to the second embodiment of the present disclosure.
Figure 40B:
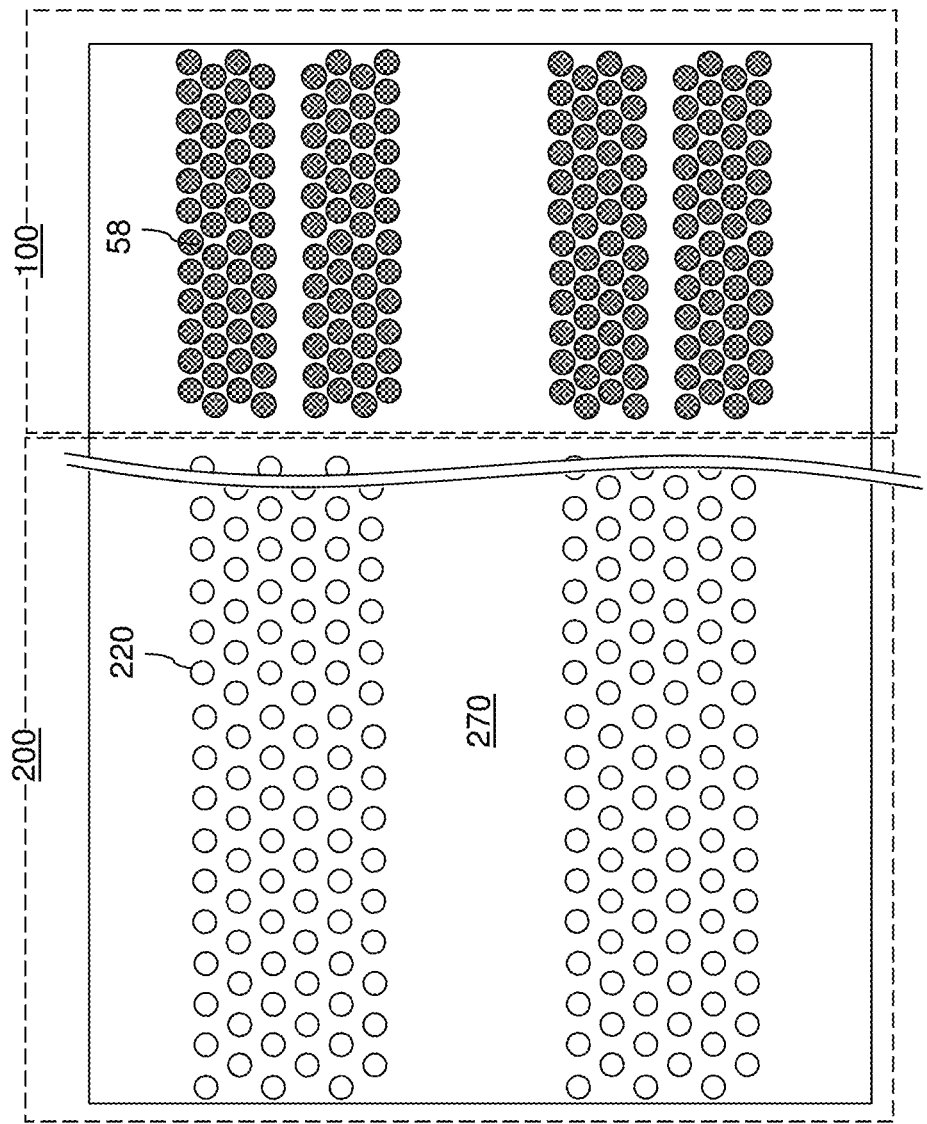
FIG. 40B is a top-down view of the second exemplary structure of FIG. 40A.

Referring to FIGS. 40A and 40B, a photoresist layer (not shown) can be applied over the second exemplary structure, and can be lithographically patterned to form openings within the areas of the contact region 200. The areas of the openings in the photoresist layer can overlap with the areas of the first-tier support pillar structures 222. An anisotropic etch process can be performed to form second-tier support openings through the second-tier alternating stack (232, 242). A top surface of a first-tier support pillar structure 222 can be physically exposed at the bottom of each second-tier support opening. In one embodiment, the second-tier support openings can be arranged in periodic two-dimensional arrays.

A dielectric fill material such as silicon oxide can be deposited in the second-tier support openings by a conformal deposition process such as chemical vapor deposition. Excess portions of the dielectric fill material can be removed from above the horizontal plane including the top surface of the second insulating cap layer 270. Remaining portions of the dielectric fill material in the second-tier support openings comprise second-tier support pillar structures 224. Each contiguous combination of a first-tier support pillar structure 222 and a second-tier support pillar structure 224 constitutes an inter-tier support pillar structure 220, which is also referred to as a support pillar structure 220.

In an alternative embodiment, the inter-tier memory openings 49 and the memory opening fill structures 58 are formed after forming the second-tier support pillar structures 224 in the second-tier support openings.

Figure 41A:
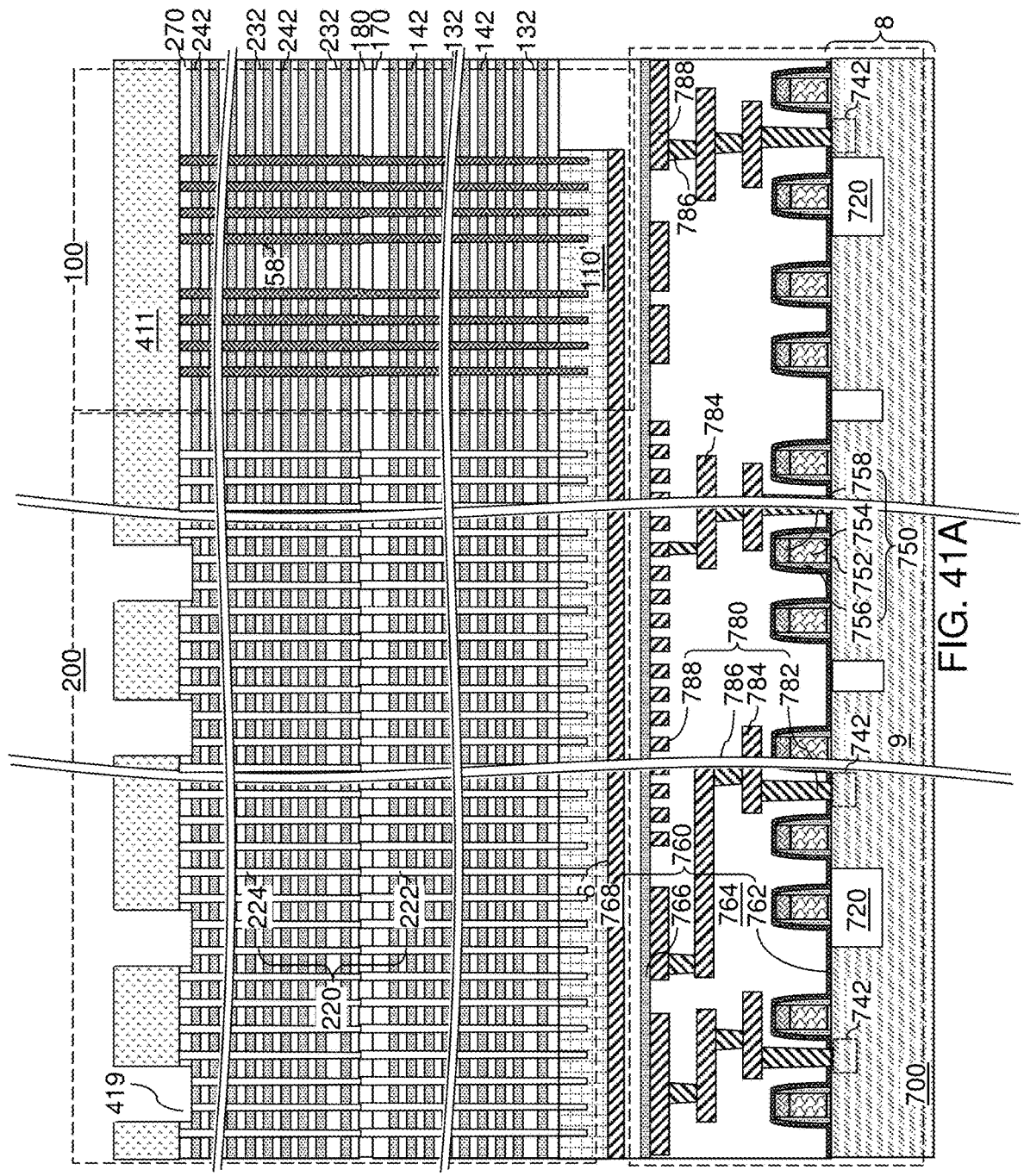
FIG. 41A is a vertical cross-sectional view of the second exemplary structure after a first anisotropic etch process for forming via cavities according to the second embodiment of the present disclosure.
Figure 41B:
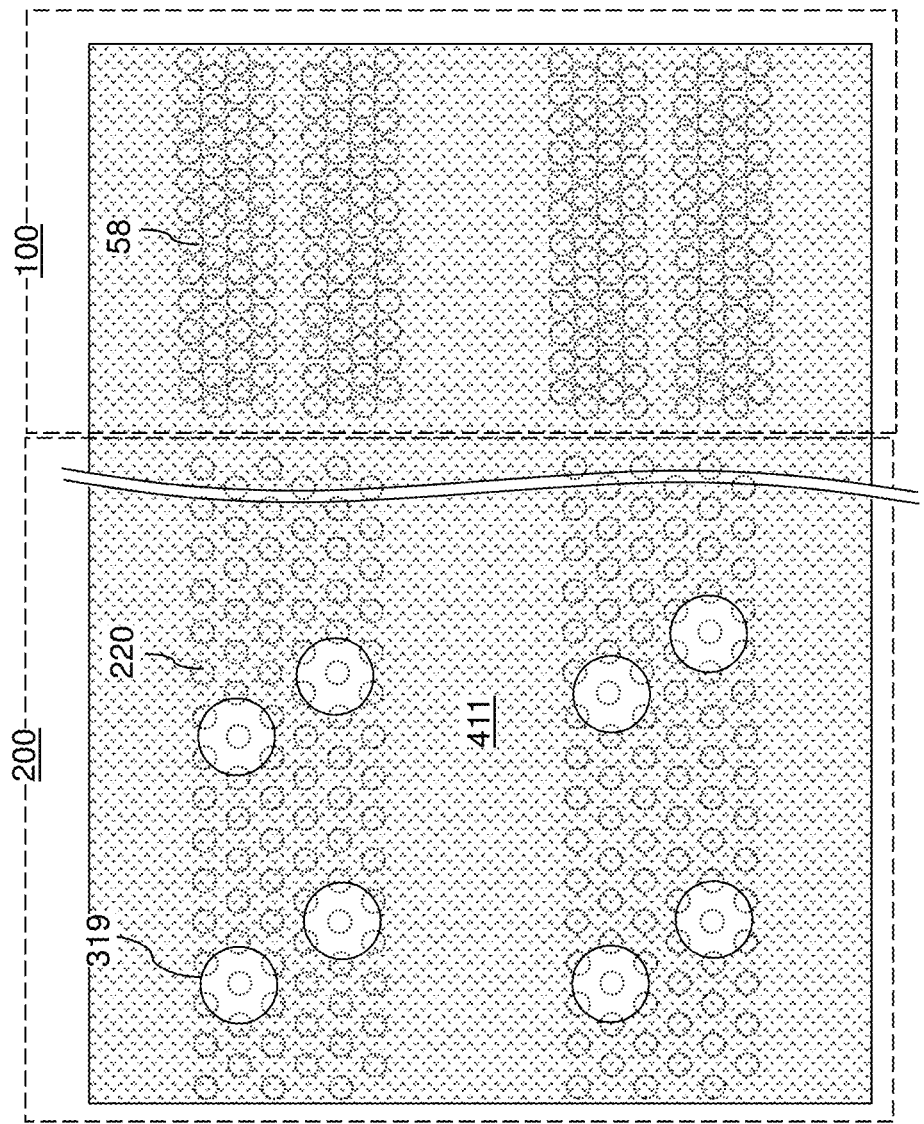
FIG. 41B is a top-down view of the second exemplary structure of FIG. 41A.

Referring to FIGS. 41A and 41B, a first masking layer 411 (e.g., photoresist and/or hard mask layer) can be applied over the second exemplary structure, and can be lithographically patterned to form openings within the contact region 200. According to an aspect of the present disclosure, the areas of the openings in the first masking layer 411 can overlap with the areas of the support pillar structures 220. In one embodiment, one or more of the openings in the first masking layer 411 can have a respective area that overlaps with the entire areas of at least one of the support pillar structures 220. In one embodiment, each opening in the first masking layer 411 can have a respective area that includes the entire area of at least one support pillar structure 220. In one embodiment, one or more of the openings in the first masking layer 411 can have a respective periphery that intersects areas of an underlying subset of the support pillar structures 220. In one embodiment, each opening in the first masking layer 411 can have a respective periphery that intersects areas of an underlying subset of the support pillar structures 220.

A first anisotropic etch process can be performed to transfer the pattern of the openings in the first masking layer 411 through the second insulating cap layer 270. In one embodiment, the insulating layers (132, 232), the insulating cap layers (170, 270), and the inter-tier insulating layer 180 can include silicon oxide, and the sacrificial material layers (142, 242) can include silicon nitride. In this case, the first anisotropic etch process can include an anisotropic etch step that etches silicon oxide selective to silicon nitride. Via cavities 419 are formed underneath the openings in the first masking layer 411. The first masking layer 411 can be subsequently removed, for example, by ashing and/or selective etching. The set of processing steps of FIGS. 41A and 41B is referred to as a first set of via formation processing steps.

Figure 42:
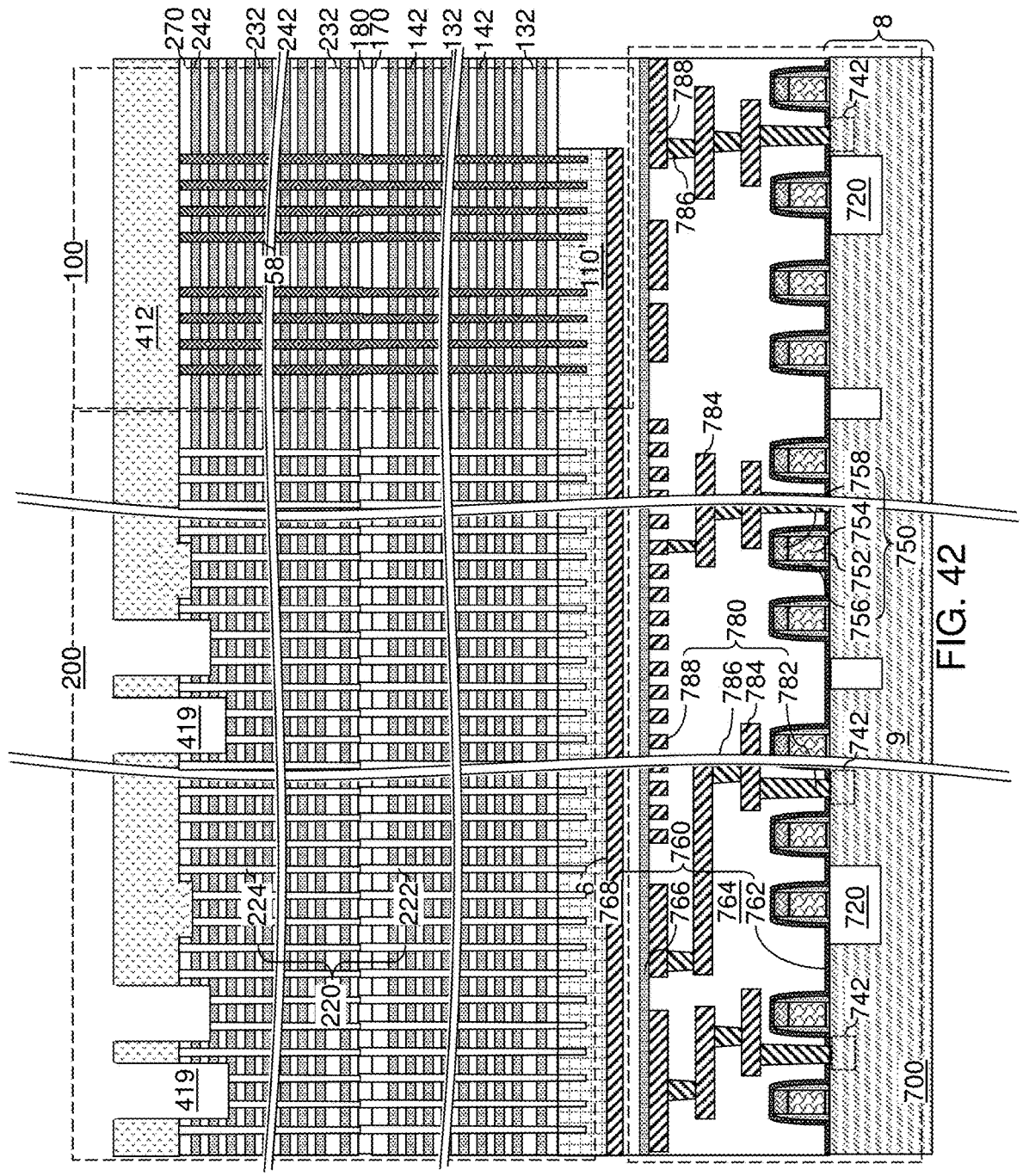
FIG. 42 is a vertical cross-sectional view of the second exemplary structure after a second anisotropic etch process for forming via cavities according to the second embodiment of the present disclosure.

Referring to FIG. 42, a second masking layer 412 (e.g., photoresist and/or hard mask layer) can be applied over the second exemplary structure, and can be lithographically patterned to form openings therethrough. The pattern of the openings in the second masking layer 412 includes a first subset of openings that overlaps with the areas of the previously formed first via cavities 419, and a second subset of openings that do not overlap with the areas of the previously formed first via cavities 419. A second anisotropic etch process can be performed to transfer the pattern of the openings in the second masking layer 412 through underlying portions of the second insulating cap layer 270 (in case previously formed first via cavities 419 are not present under the respective openings), and through two second sacrificial material layers 242 and a second insulating layers 232. In one embodiment, the insulating layers (132, 232), the insulating cap layers (170, 270), and the inter-tier insulating layer 180 can include silicon oxide, and the sacrificial material layers (142, 242) can include silicon nitride. In this case, the second anisotropic etch process can include an alternating sequence of three anisotropic etch steps that etch silicon oxide and two anisotropic etch steps that etch silicon nitride. Via cavities 419 are formed underneath the openings in the second masking layer 412. The second masking layer 412 can be subsequently removed, for example, by ashing and/or selective etching. The set of processing steps of FIG. 42 is referred to as a second set of via formation processing steps.

Figure 43:
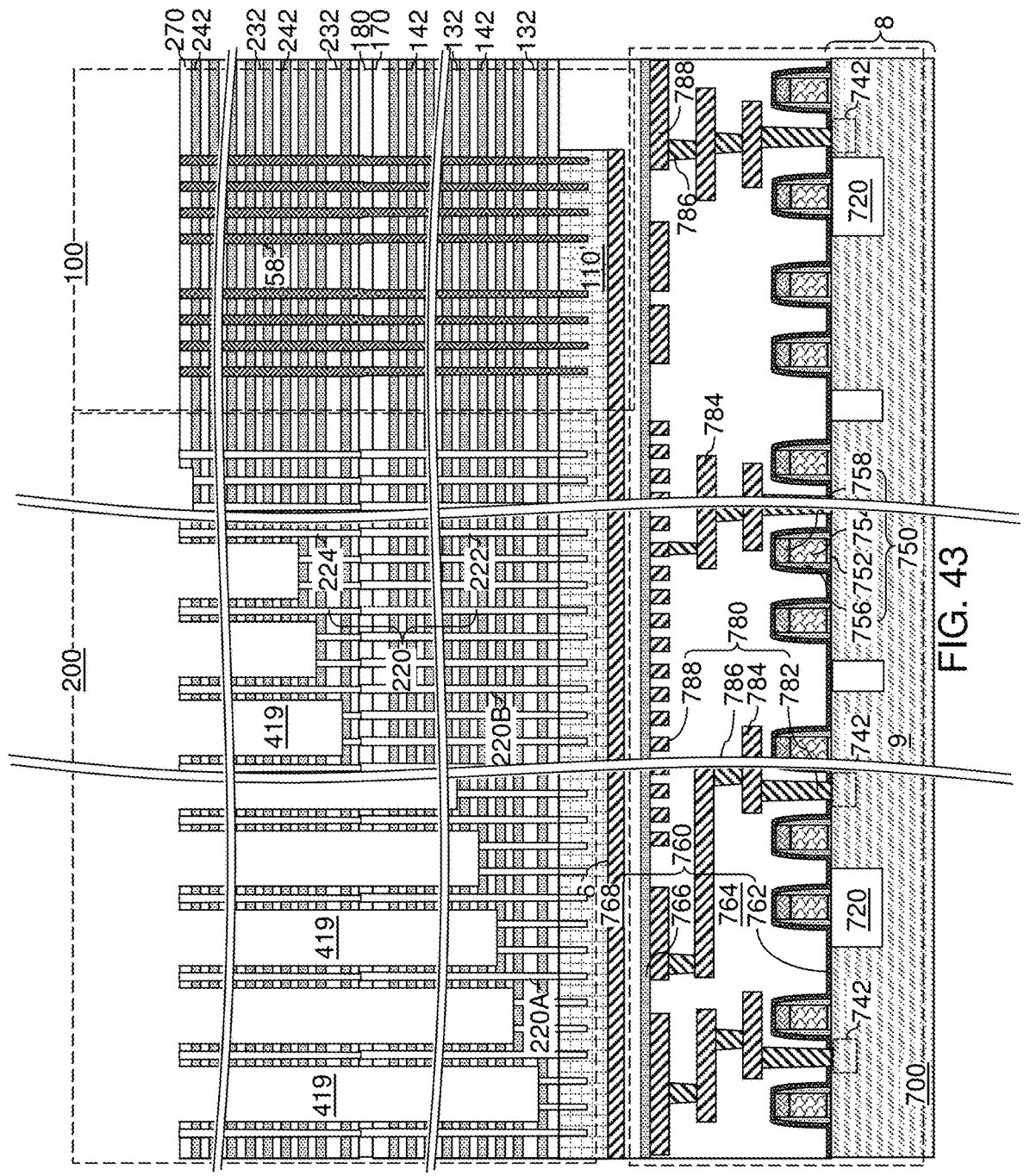
FIG. 43 is a vertical cross-sectional view of the second exemplary structure after formation of via cavities according to the second embodiment of the present disclosure.

Referring to FIG. 43, via cavities vertically extending to each sacrificial material layer (142, 242) can be formed by sequentially performing N sets of via formation processing steps in which N is an integer greater than 1. For example, N can be an integer in a range from 2 to 12, such as from 3 to 10. For each positive integer i not greater than N (i.e., for any integer i between 0 and N+1), each i-th set of via formation processing steps comprises an i-th etch mask patterning step in which an i-th etch mask layer (such as a masking layer) is formed over the alternating stacks {(132, 142), (232, 242)} and is lithographically patterned to form openings therethrough, an i-th anisotropic etch step in which at least one pair of an insulating layer (132, 232) and a sacrificial material layer (142, 242) is etched underneath the openings in the i-th etch mask layer, and an i-th etch mask removal step in which the i-th etch mask layer is removed.

In one embodiment, a j-th etch mask layer includes a respective first subset of openings having an areal overlap with opening in a k-th etch mask layer and a respective second subset of openings that does not have any areal overlap with the openings in the k-th etch mask layer for any pair of j and k that are different from each other and selected from integers in a range between 0 and N+1. In other words, some openings in any selected etch mask layer overlaps with openings in any other etch mask layer, while some other openings in the selected etch mask layer do not overlap with the complement of the openings in the other etch mask layer.

In one embodiment, an anisotropic etch step within the N sets of via formation processing steps can etch a single pair of an insulating layer (132, 232) and a sacrificial material layer (142, 242) underneath each opening in a respective etch mask layer. Another anisotropic etch step within the N sets of via formation processing steps can etch two pairs of an insulating layer (132, 232) and a sacrificial material layer (142, 242) underneath each opening in a respective etch mask layer. Yet another anisotropic etch step within the N sets of via formation processing steps can etch four pairs of an insulating layer (132, 232) and a sacrificial material layer (142, 242) underneath each opening in a respective etch mask layer. Additional anisotropic etch steps can be performed to provide via cavities 419 having up to $2^N-1$ different depths.

In one embodiment, the integer N may be in a range from 4 to 8, and the total number of the sacrificial material layers (142, 242) that are physically exposed to the via cavities 419 after the N sets of via formation processing steps is in a range from $2^{N-1}$ to $2^N-1$. For example, if N is 6, the total number of the sacrificial material layers (142, 242) that are physically exposed to the via cavities 419 after six sets of via formation processing steps is in a range from 32 to 63.

Each of the sacrificial material layers (142, 242) can comprise a respective portion of a top surface that is physically exposed to a respective one of the via cavities 419 upon formation of the via cavities 419. No stepped surfaces are formed in the alternating stacks {(132, 142), (232, 242)} before, or during, formation of the via cavities 419. According to an aspect of the present disclosure, via cavities 419 vertically extending through the alternating stacks {(132, 142), (232, 242)} can be formed without forming any stepped surfaces in the alternating stacks {(132, 142), (232, 242)}.

According to an aspect of the present disclosure, support pillar structures 220 can be etched during formation of the via cavities 419. In one embodiment, at least one of the via cavities 419 can have an areal overlap with a respective subset of the support pillar structures 220. In one embodiment, each of the via cavities 419 can have an areal overlap with a respective subset of the support pillar structures 220. Generally, the via cavities 419 can be formed in the contact region by performing anisotropic etch processes. First support pillar structures 220A of the support pillar structures 220 are not etched by the anisotropic etch processes, and top portions of the second support pillar structures 220B of the support pillar structures 220 are etched by the anisotropic etch processes. In one embodiment, each of the sacrificial material layers (142, 242) comprises a respective portion of a top surface that is physically exposed to a respective one of the via cavities 419 upon formation of the via cavities 419.

In one embodiment, a horizontal top surface of at least one of the second support pillar structures 220B can be physically exposed at a bottom surface of one of the via cavities 419. In one embodiment, a vertical sidewall or a tapered sidewall surface of one of the second support pillar structures 220B can be physically exposed on a sidewall of one of the via cavities 419.

Figure 44:
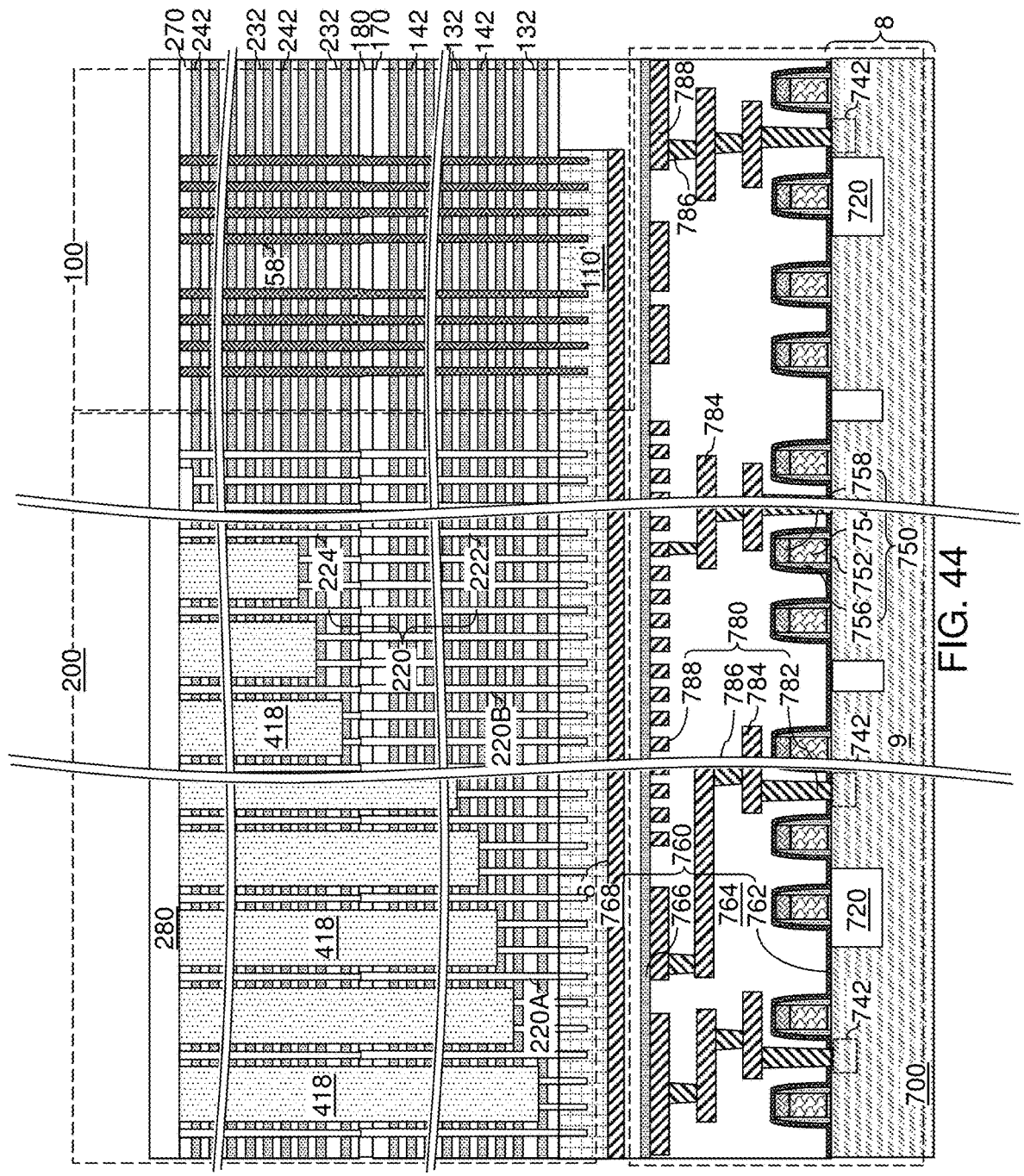
FIG. 44 is a vertical cross-sectional view of the second exemplary structure after formation of sacrificial via fill structures and a contact-level dielectric layer according to the second embodiment of the present disclosure.

Referring to FIG. 44, a sacrificial via fill material can be deposited in the via cavities 419. The sacrificial via fill material includes amorphous silicon, a silicon-germanium alloy, amorphous carbon, diamond-like carbon, or a silicon-based inorganic polymer material. Excess portions of the first sacrificial via fill material can be removed from above the horizontal plane including the top surface of the second insulating cap layer 270 by a planarization process such as a chemical mechanical planarization process. Each remaining portion of the sacrificial via fill material that fills the via cavities 419 comprise sacrificial via fill structures 418.

A contact-level dielectric layer 280 can be deposited over the second insulating cap layer 270. The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

Figure 45:
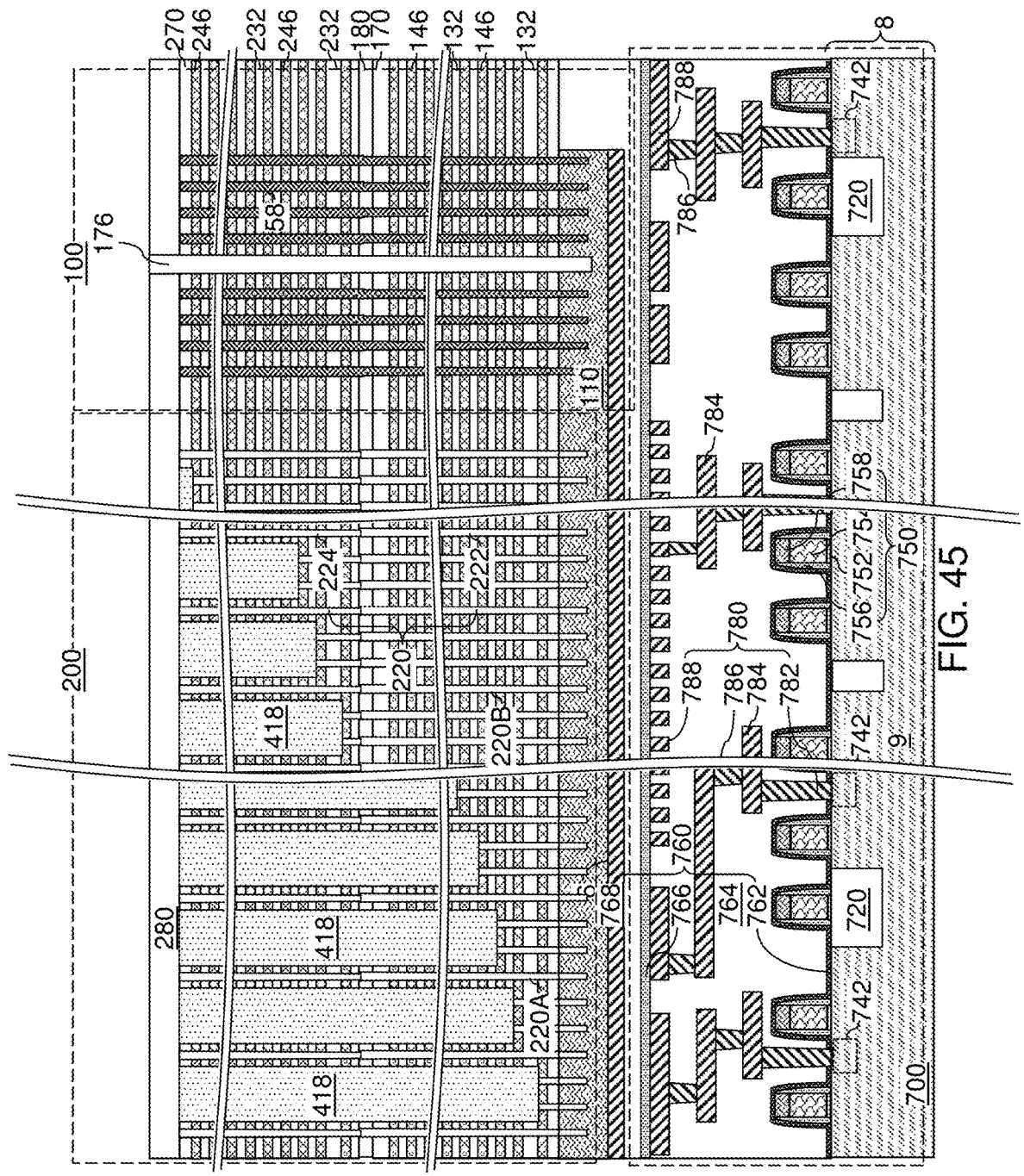
FIG. 45 is a vertical cross-sectional view of the second exemplary structure after replacement of the in-process source-level material layers with source-level material layers, replacement of sacrificial material layers with electrically conductive layers, and formation of backside trench fill structures according to the second embodiment of the present disclosure.

Referring to FIG. 45, the processing steps of FIGS. 20A and 20B can be performed to form backside trenches 79. The processing steps of FIGS. 21, 22A-22E, and 23 can be performed to replace the in-process source-level material layers 110' with source-level material layers 110. The processing steps of FIGS. 24, 25, and 26 can be performed to replace the sacrificial material layers (142, 242) with electrically conductive layers (146, 246) and to form backside trench fill structures 176. In one embodiment, an optional backside blocking dielectric layer 44 can be deposited in each of the backside recesses (143, 243) and on bottom surfaces of the sacrificial via fill structures 418. The electrically conductive layers (146, 246) can be formed in remaining volumes of the backside recesses (143, 243) after depositing the backside blocking dielectric layer 44.

Figure 46:
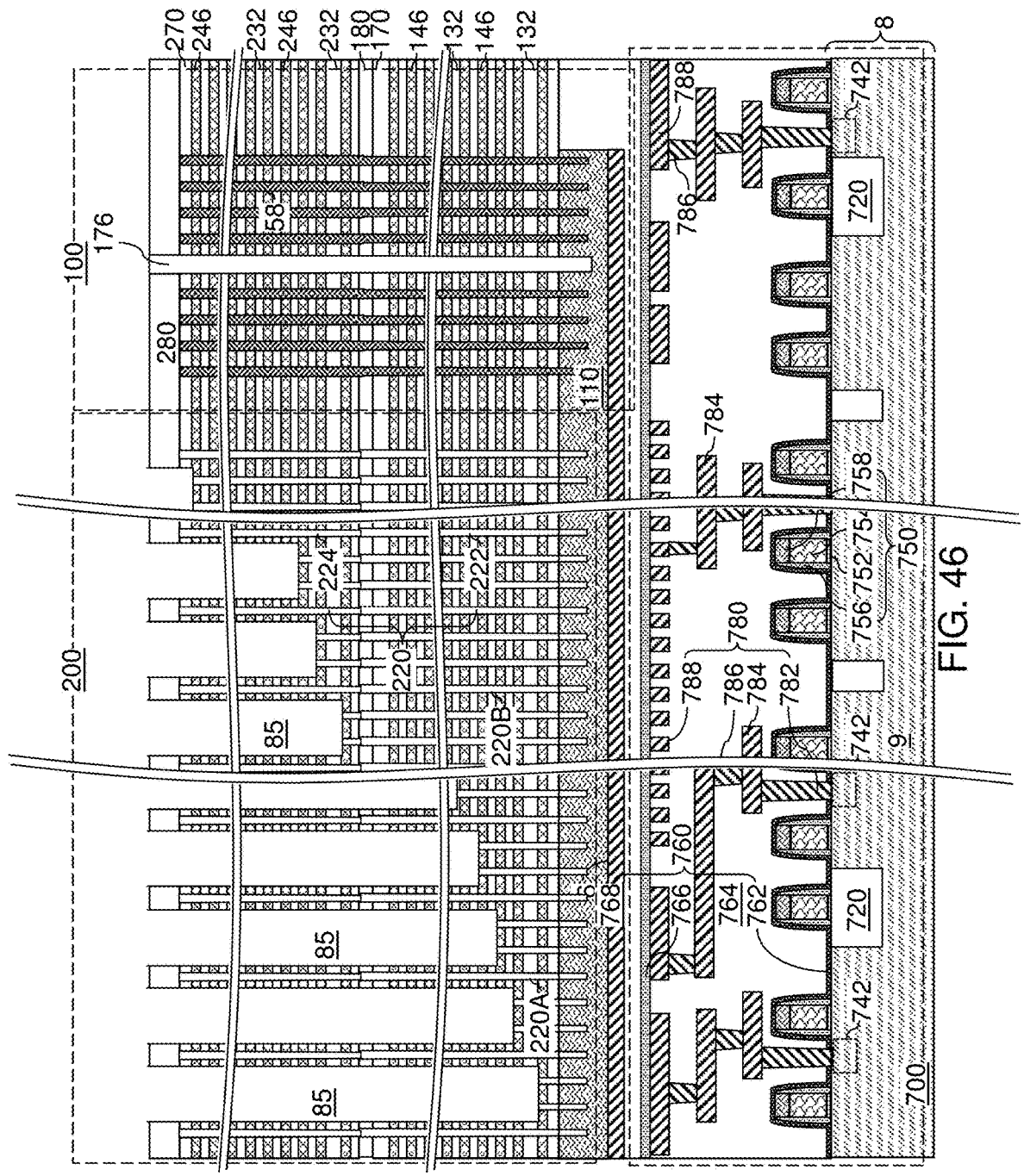
FIG. 46 is a vertical cross-sectional view of the second exemplary structure after formation of via cavities by removal of the sacrificial via fill structures according to the second embodiment of the present disclosure.

Referring to FIG. 46, openings are formed through the contact-level dielectric layer 280, for example, by applying and patterning a photoresist layer (not shown) over the contact-level dielectric layer 280 such that openings are formed in the photoresist layer in each area that overlies the sacrificial via fill structures 418. An anisotropic etch process can be performed to transfer the pattern of the openings in the photoresist layer through the contact-level dielectric layer 280. Top surfaces of the second sacrificial via fill structures 418 are physically exposed after the anisotropic etch process.

The sacrificial via fill structures 418 are removed selective to the materials of the insulating layers (132, 232), the support pillar structures 220, and the backside blocking dielectric layer 44 by an isotropic etch process. For example, a wet etch process that etches the sacrificial materials of the sacrificial via fill structures 418 may be performed to remove the sacrificial via fill structures 418. Contact via cavities 85 are formed in volumes from which the sacrificial via fill structures 418 are removed. The contact via cavities 85 comprise voids that are formed in the volumes of the via cavities 419. As such, the volumes of the contact via cavities 85 can be the same as the union of the volumes of the via cavities 419. Generally, the contact via cavities 85 can be formed by removing the sacrificial via fill structures 418. Optionally, the horizontal portions of the backside blocking dielectric layer 44 exposed at the bottoms of the via cavities 419 can be etched through to expose the respective underlying electrically conductive layer (146, 246) and portion of at least one support pillar structure 220.

Figure 47A:
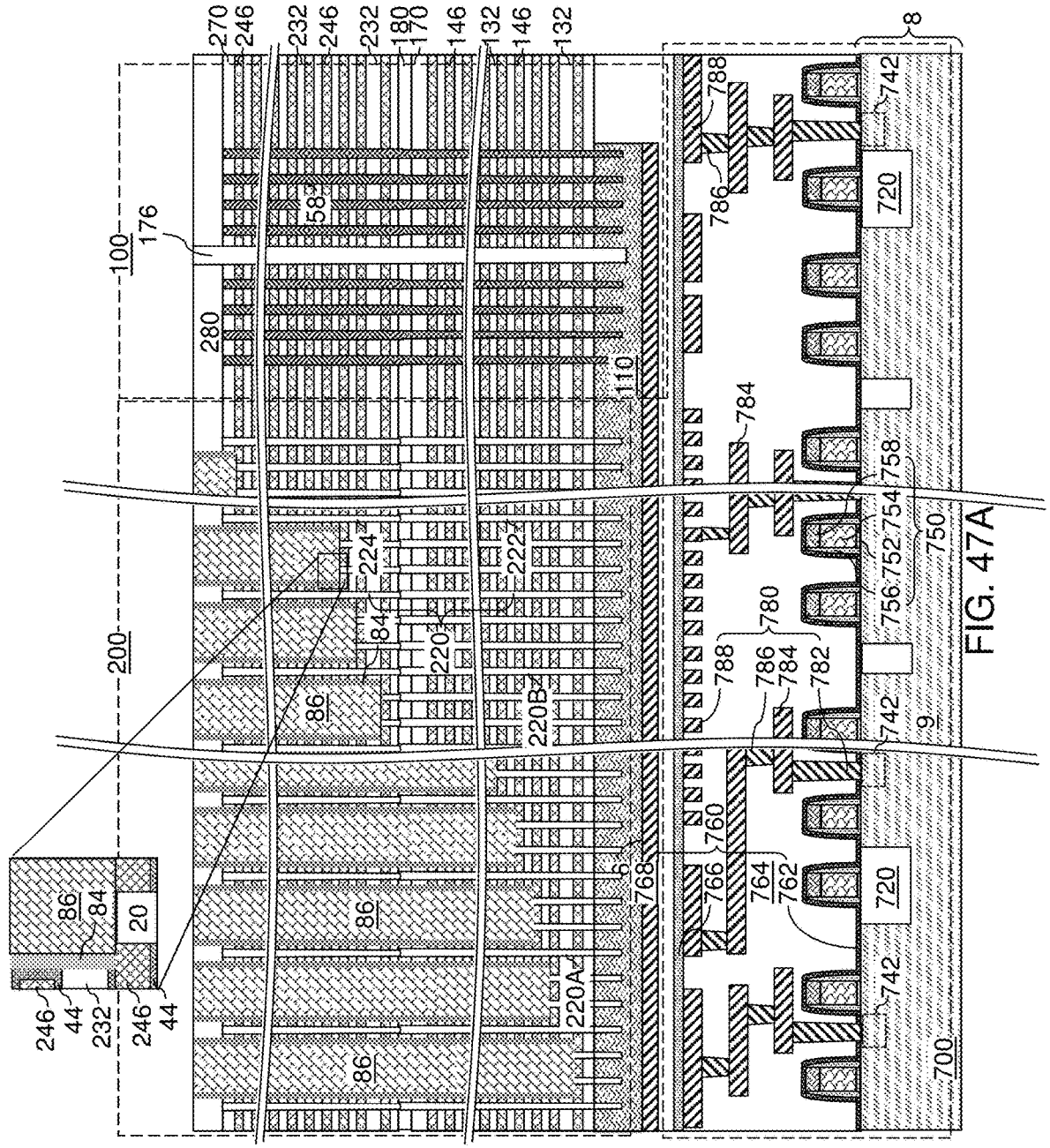
FIG. 47A is a vertical cross-sectional view of the second exemplary structure after formation of laterally-isolated contact via assemblies according to the second embodiment of the present disclosure.
Figure 47B:
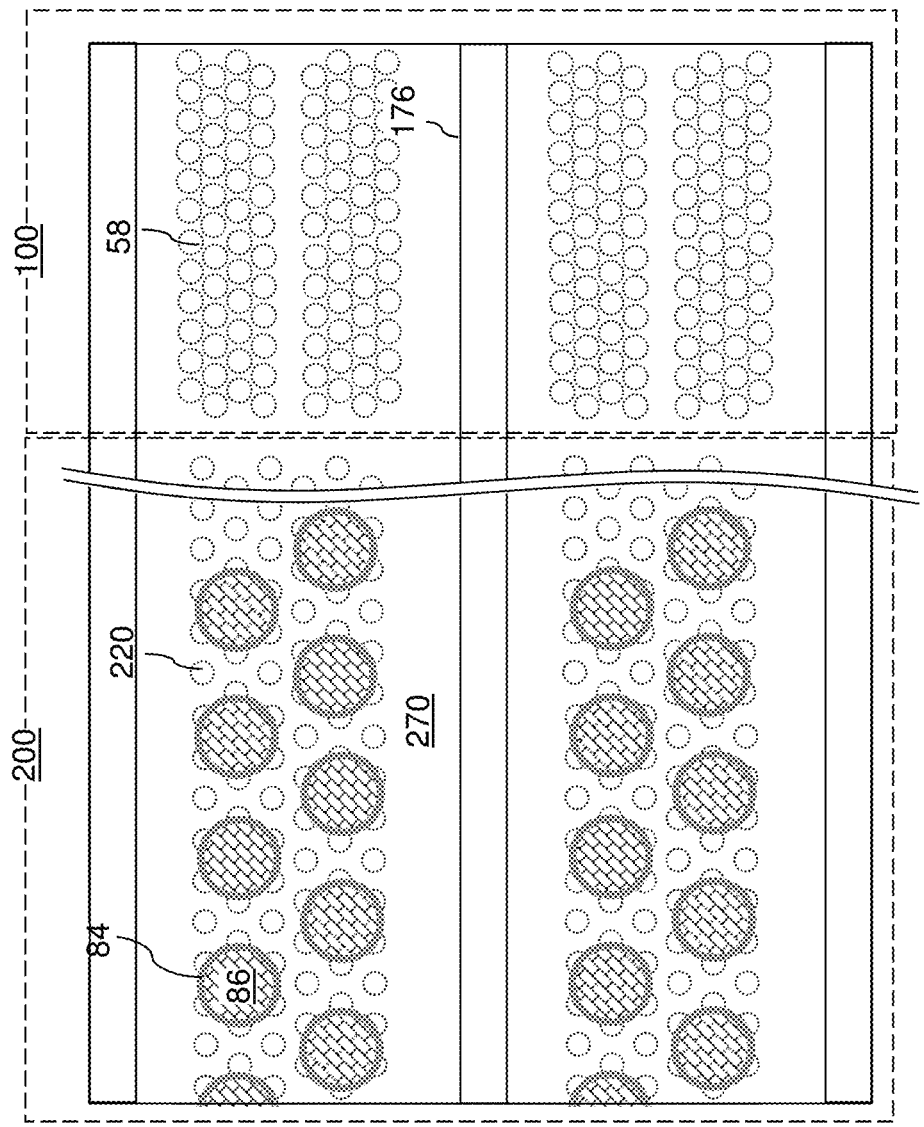
FIG. 47B is a top-down view of the second exemplary structure of FIG. 47A.

Referring to FIGS. 47A and 47B, a dielectric material layer can be conformally deposited in the contact via cavities 85. The dielectric material includes a dielectric material such as silicon oxide, and can be deposited by a conformal deposition process such as a chemical vapor deposition process. The thickness of the dielectric material layer may be in a range from 5 nm to 100 nm, such as from 10 nm to 50 nm, although lesser and greater thicknesses may also be employed. An anisotropic etch process can be performed to remove horizontal portions of the dielectric material layer. Each remaining tubular portion of the dielectric material layer located at peripheral regions of the contact via cavities 85 comprises a tubular dielectric spacer 84. The anisotropic etch process can optionally include an overetch step that etches through physically exposed horizontal portions of the backside blocking dielectric layers 44 at the bottom of each contact via cavity 85 (if this step is not performed at the step shown in FIG. 46). A top surface of at least one support pillar structure 220 and a top surface of an electrically conductive layer (146, 246) can be physically exposed at the bottom of each contact via cavity 85.

At least one conductive material can be deposited in the contact via cavities 85. The at least one conductive material can include, for example, a conductive metallic liner material and a conductive fill material. The conductive metallic liner material can include a conductive metallic nitride material such as TiN, TaN, and/or WN. The conductive metallic liner material can be deposited, for example, by a chemical mechanical deposition process. The conductive fill material can include, for example, W, Ru, Co, Mo, Ti, Ta, and/or Cu. The conductive fill material can be deposited by physical vapor deposition, chemical vapor deposition, electroplating, and/or electroless plating. Excess portions of the at least one conductive material can be removed from above the horizontal plane including the top surface of the contact-level dielectric layer 280.

Each remaining portion of the at least one conductive material that fills a respective contact via cavity 85 constitutes a contact via structure 86. The contact via structures 86 may be formed directly on the cylindrical surfaces of the backside blocking dielectric layers 44. Thus, the contact via structures 86 are formed in remaining volumes of the contact via cavities 85 on an inner sidewall of a respective one of the tubular dielectric spacers 84, and directly on a top surface of a respective one of the electrically conductive layers (146, 246). In one embodiment, one of the contact via structures 86 can be formed directly on a top surface of at least one support pillar structure 220. In one embodiment, each of the contact via structures 86 can be formed directly on a top surface of a respective set of at least one support pillar structure 220. Each contiguous combination of a tubular dielectric spacer 84 and a contact via structure 86 constitutes a laterally-isolated contact via assembly (84, 86).

Subsequently, drain contact via structures (not shown) can be formed through the contact-level dielectric layer 280 on top surfaces of the drain regions 63, which are located within the memory opening fill structures 58.

Figure 48A:
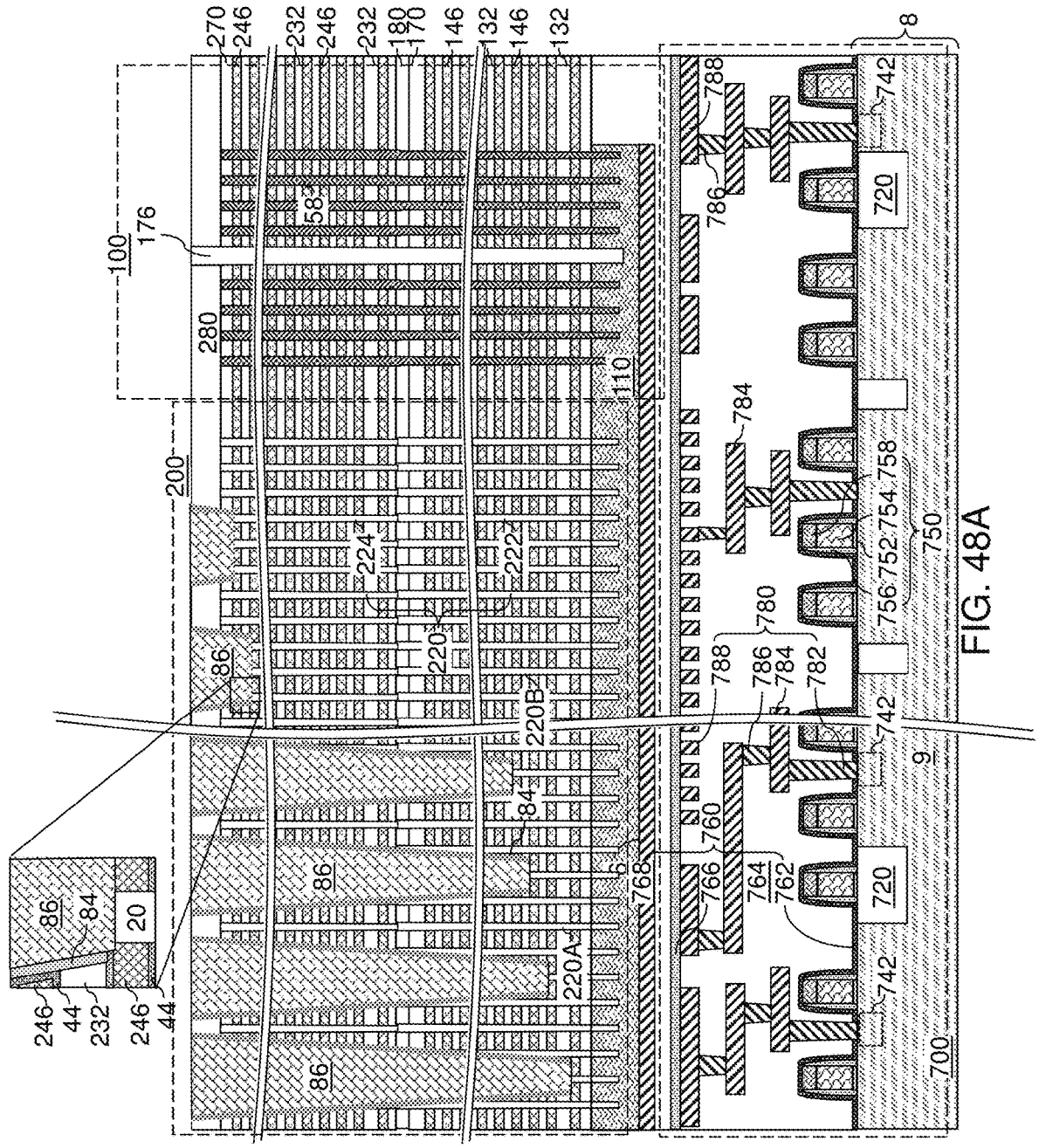
FIG. 48A is a vertical cross-sectional view of a first alternative configuration of the second exemplary structure after formation of laterally-isolated contact via assemblies according to the second embodiment of the present disclosure.
Figure 48B:
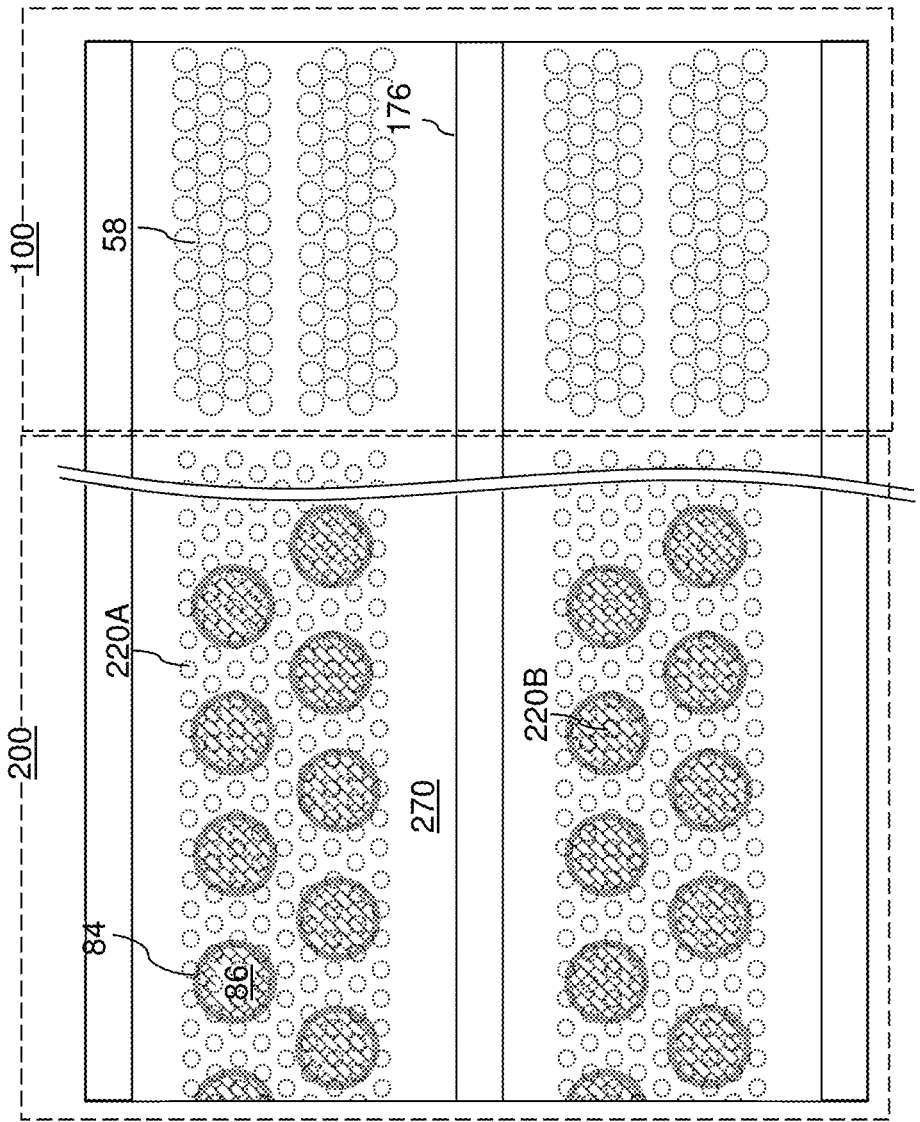
FIG. 48B is a see-through top-down view of the second exemplary structure of FIG. 48A.

Referring to FIGS. 48A and 48B, a first alternative configuration of the second exemplary structure can be derived from the second exemplary structure by forming via cavities 419 with a taper angle in a range from 1 degree to 20 degrees. In this case, at least one of the laterally-isolated contact via assembly (84, 86) can contact a tapered sidewall of at least one second support pillar structure 220B. In one embodiment, each of the laterally-isolated contact via assembly (84, 86) can contact a tapered sidewall of at least one second support pillar structure 220B.

Referring to FIG. 49, a contact via structure 86 and support pillar structures 220 in a second alternative configuration of the second exemplary structure is illustrated in a see-through top-down view. In this case, at least one of the laterally-isolated contact via assembly (84, 86) can contact tapered sidewalls of a plurality of second support pillar structures 220B without contacting top surfaces of the first support pillar structures 220A. In one embodiment, each of the laterally-isolated contact via assembly (84, 86) can contact tapered sidewalls of a plurality of second support pillar structures 220B.

Referring to FIGS. 31-49 and according to various embodiments of the present disclosure, a three-dimensional memory device is provided, which comprises: an alternating stack of insulating layers (132, 232) and electrically conductive layers (146, 246) located over a substrate 8; memory openings 49 located in a memory array region 100 and vertically extending through the alternating stack {(132, 146), (232, 246)}; memory opening fill structures 58 located in the memory openings; support pillar structures 220 located in a contact region 200, vertically extending through the alternating stack {(132, 146), (232, 246)}, and comprising a dielectric material; and laterally-isolated contact via assemblies (84, 86) located in the contact region 200, wherein each of the laterally-isolated contact via assemblies (84, 86) comprises a contact via structure 86 contacting a top surface of a respective one of the electrically conductive layers (146, 246) and a tubular dielectric spacer 84 laterally surrounding the contact via structure 86, wherein the support pillar structures 220 comprise: first support pillar structures 220A that vertically extend through each layer within the alternating stack {(132, 146), (232, 246)}; and second support pillar structures 220B that are shorter (i.e., having a lesser maximum vertical dimension) than the first support pillar structures 220A and contacting a respective one of the laterally-isolated contact via assemblies (84, 86).

In one embodiment, the alternating stack {(132, 146), (232, 246)} is free of stepped surfaces within the contact region 200. In one embodiment, a subset of the second support pillar structures 220A contacts a horizontal bottom surface of a respective one of the contact via structures 86. In one embodiment, one of the contact via structures 86 contacts horizontal top surfaces of at least two of the second support pillar structures 220B. In one embodiment, one of the contact via structures 86 contacts an entirety of a horizontal top surface of at least one of the second support pillar structures 220B. In one embodiment, one of the contact via structures 86 contacts an entirety of horizontal top surfaces of a plurality of second support pillar structures 220.

In one embodiment, one of the laterally-isolated contact via assemblies (84, 86) contacts at least two of the second support pillar structures 220B, and does not contact, and is laterally surrounded by, a subset of the first support pillar structures 220A. In one embodiment, outer sidewalls of the tubular dielectric spacers 84 have a taper angle; and a subset of the second support pillar structures 220B contacts a tapered outer sidewall of a respective one of the tubular dielectric spacers 84. In one embodiment, top surfaces of the contact via structures 86 and the tubular dielectric spacers 84 can be located within a same horizontal plane.

In one embodiment, the three-dimensional memory device can comprise backside blocking dielectric layers 44 located between each vertically neighboring pair of an insulating layer (132, 232) and an electrically conductive layer (146, 246) within the alternating stack {(132, 146), (232, 246)}, wherein each contact via structure 86 contacts, and extends through, a respective one of the backside blocking dielectric layers 44. In one embodiment, each tubular dielectric spacer 84 comprises an annular bottom surface that contacts a top surface of a respective one of the backside blocking dielectric layers 44. In one embodiment, each tubular dielectric spacer 84 that vertically extends through a topmost one of the electrically conductive layers (146, 246) contacts a respective cylindrical sidewall of one of the backside blocking dielectric layers 44 that contacts the topmost one of the electrically conductive layers (146, 246).

In one embodiment, each of the memory opening fill structures 58 comprises a vertical semiconductor channel 60 and a memory film 50.

The embodiments of the present disclosure simplify the device fabrication method by omitting formation of stepped surfaces (i.e., a staircase region) in the contact region of the alternating stack. This reduces the dimension of the contact region and the need for high aspect ratio via cavities. The large area deposition and planarization of a retro-stepped dielectric layer over the staircase region is also omitted. The process thermal budget and device speed may also be improved. Furthermore, dielectric breakdown at the stepped surfaces may be omitted, which reduces short circuits between vertically adjacent word lines in the staircase region. Likewise, the reactive ion etch process used to form contact vias may smooth out protrusions in the alternating stack due to ion sputtering, which further reduces word line short circuits. Still further, word line bending and collapse in the contact region may be reduced by controlling the oxide to nitride etch selectivity and over etch amount to provide a flat surface at the bottom of the via cavities.

Figure 50:
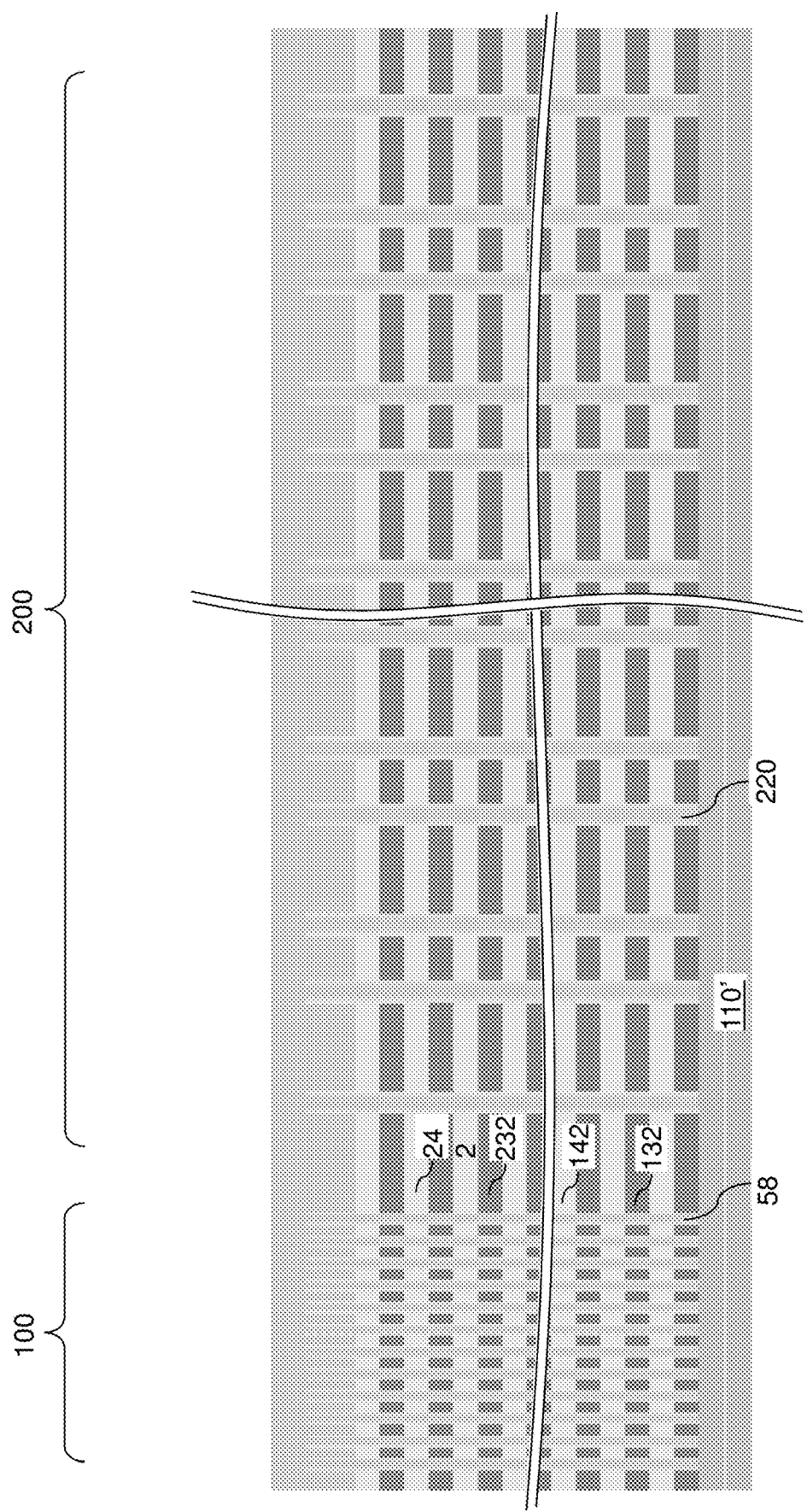
FIGS. 50 to 58 are vertical cross-sectional views of steps in a method of making a third exemplary according to the third embodiment of the present disclosure.

Referring to FIG. 50, an in-process third exemplary structure according to a third embodiment of the present disclosure may comprise the same structure as the in-process second exemplary structure shown in FIG. 40A.

Figure 51:
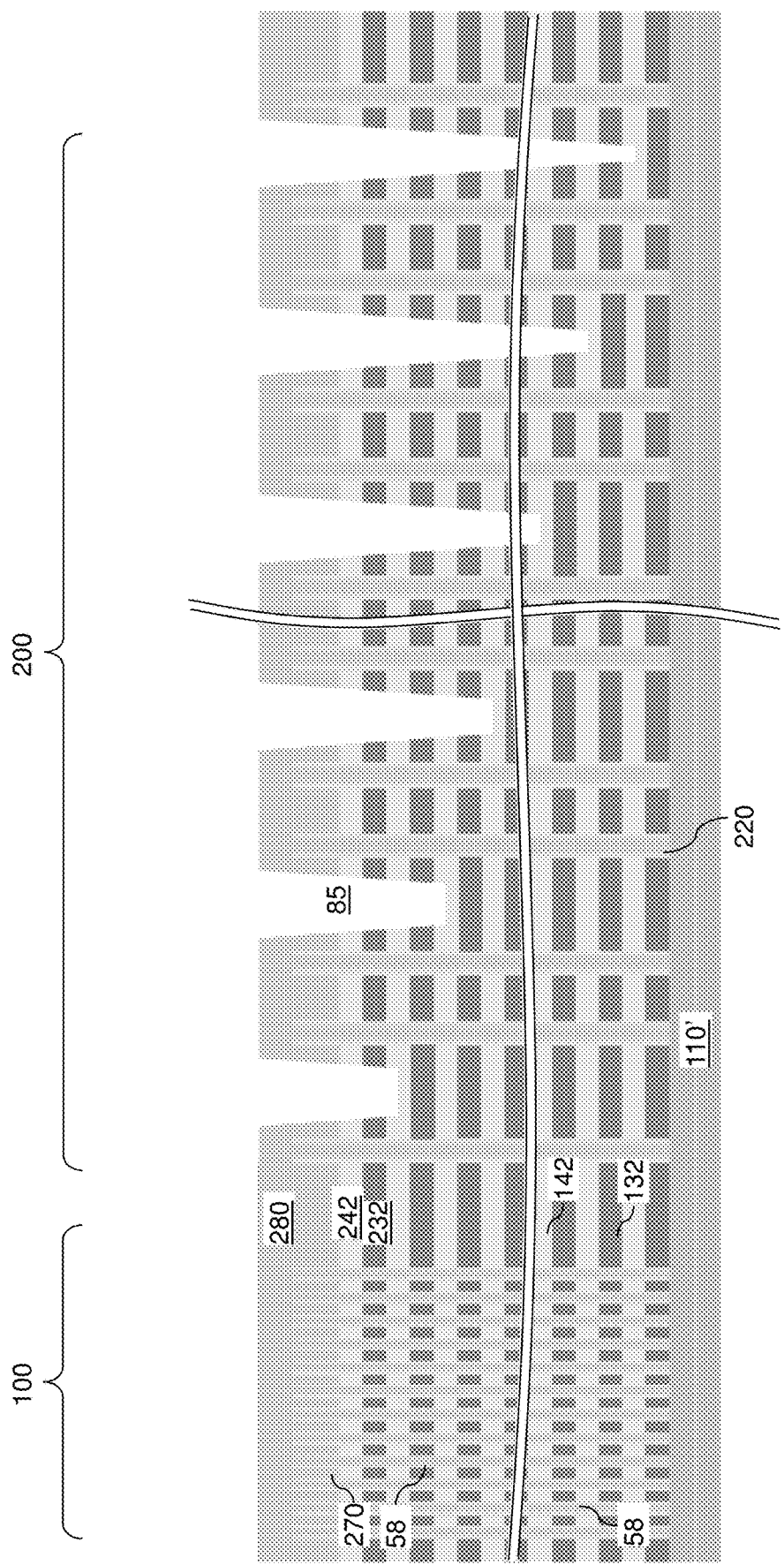

Referring to FIG. 51, the above described contact via cavities 85 can be formed in the contact region 200. Each of the contact via cavities 85 can be formed through a respective subset of layers within the alternating stacks {(132, 142), (232, 242)} by performing anisotropic etch processes employing multiple etch masks, as described above.

Figure 52:
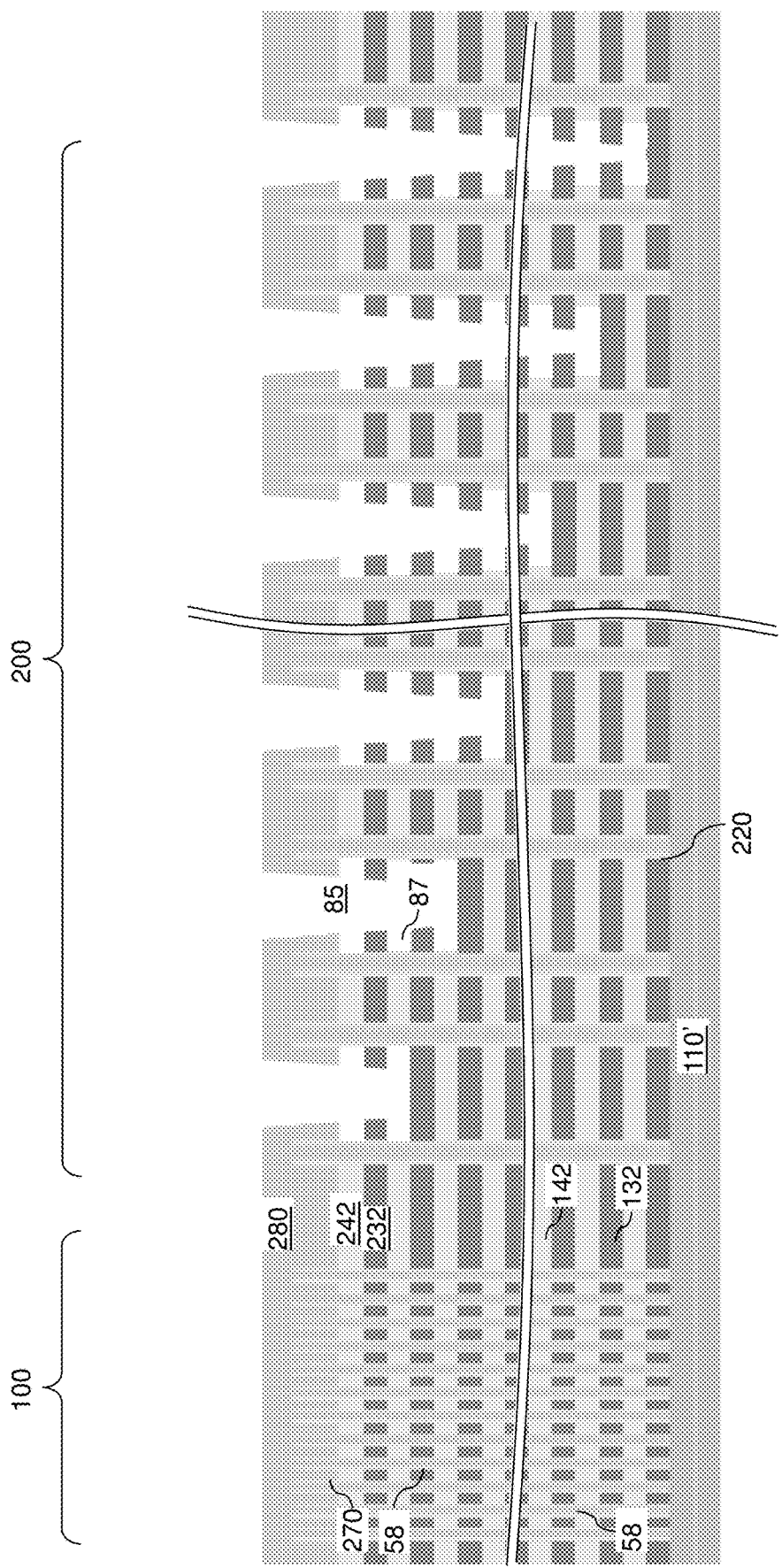

Referring to FIG. 52, a first selective isotropic etch process can be performed to laterally recess physically exposed sidewalls of the sacrificial material layers (142, 242) selective to the materials of the insulating layers (132, 232), the memory opening fill structures 58 and the support pillar structures 220. For example, if the sacrificial material layers (142, 242) comprise silicon nitride, a wet etch process employing hot phosphoric acid can be performed to laterally recess physically exposed sidewalls of the sacrificial material layers (142, 242). Annular recess cavities 87 are formed in volumes from which the material of the sacrificial material layers (142, 242) is removed. The lateral recess distance of the first selective isotropic etch process (i.e., the lateral distance by which each physically exposed sidewall of the sacrificial material layers (142, 242) shifts) may in a range from 10% to 400%, such as from 50% to 200%, of the thickness of the sacrificial material layers (142, 242). For example, the lateral recess distance may be in a range from 5 nm to 200 nm, such as from 20 nm to 100 nm, although lesser and greater lateral recess distances may also be employed. Generally, the annular recess cavities 87 can be formed by laterally expanding the contact via cavities 85 at levels of the sacrificial material layers employing a selective isotropic etch process that etches the material of the sacrificial material layers (142, 242) selective to the material of the insulating layers (132, 232). Each contact via cavity 85 may comprise at least one annular recess cavity 87. Some contact via cavities 85 may comprise a respective vertical stack of annular recess cavities 87.

In one embodiment, each of the contact via cavies 85 may have a respective corrugated vertical cross-sectional profile in which each sidewall segment of the respective contact via cavity 85 located at levels of the sacrificial material layers (142, 242) laterally protrudes outward relative to sidewall segments of the respective contact via cavity 85 located at levels of the insulating layers (132, 232) by a lateral offset distance, which can be the same as the lateral recess distance. As used herein, a "corrugated" element refers to an element having at least one groove or having at least one indentation. Each annular recess cavity 87 may be laterally bounded by a sidewall of a respective one of the sacrificial material layers (142, 242) and may be vertically bounded by an annular bottom surface segment of an respective overlying insulating layer (132, 232) and by an annular top surface segment of a respective underlying insulating layer (132, 232).

Figure 53:
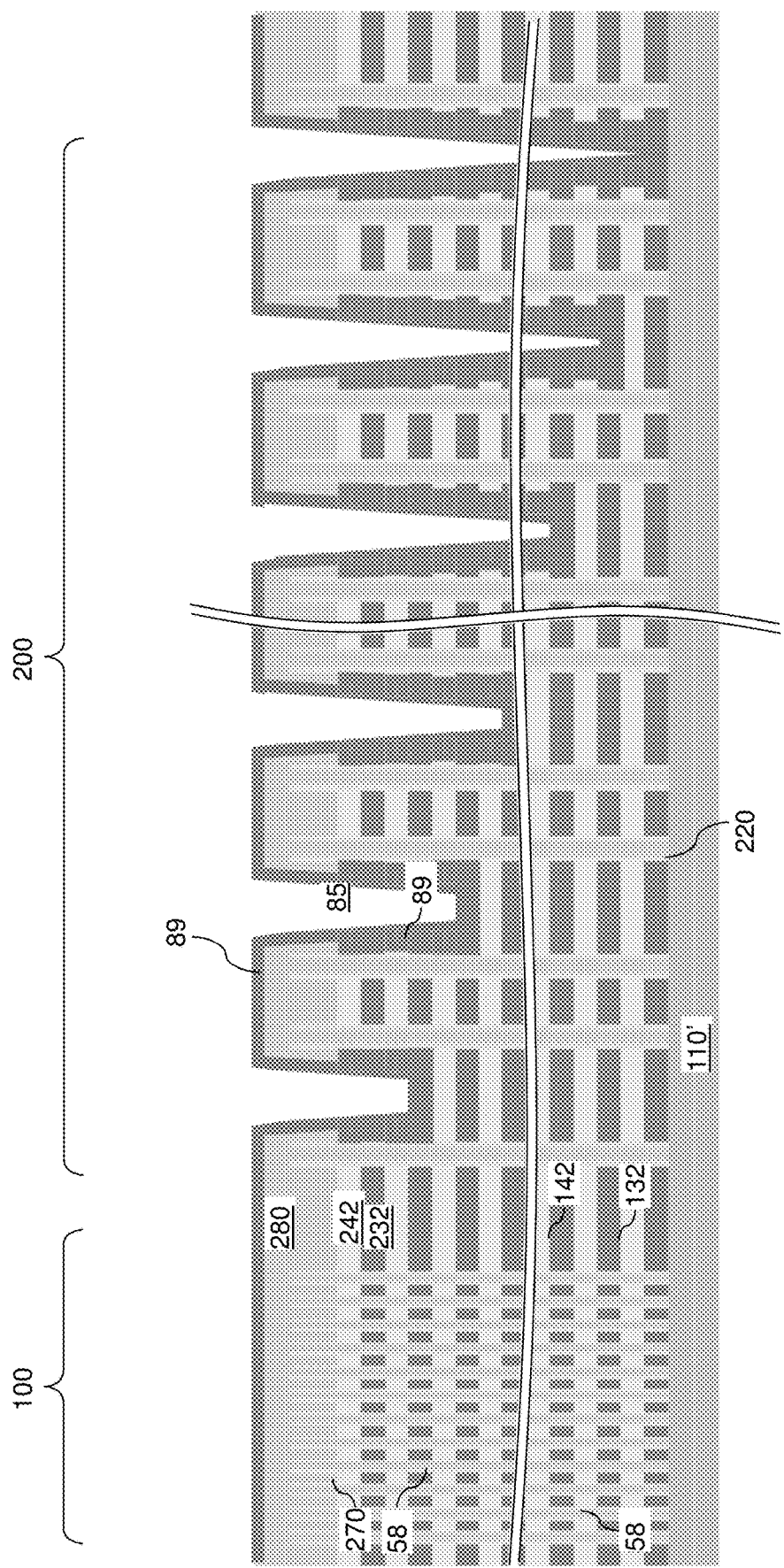

Referring to FIG. 53, an insulating spacer material layer 89 is deposited in peripheral regions of the contact via cavities 85 including the first annular recess cavities 87 and over the stacks {(132, 142), (232, 242)} by a conformal deposition process. The insulating spacer material layer 89 comprises a dielectric material, such as silicon oxide. The insulating spacer material layer 89 may be deposited by a chemical vapor deposition process. The thickness of the insulating spacer material layer 89 is greater than one half of the thickness of each sacrificial material layer (142, 242) and is less than one half of the minimum of diameters of the various portions of the contact via cavities 85 at levels of the insulating layers (132, 232). Thus, a vertical or tapered cylindrical void can vertically extend inside each of the contact via cavities 85 after formation of the insulating spacer material layer 89. If the insulating spacer material layer 89 and the contact-level dielectric layer 280 comprise the same material (e.g., silicon oxide), then portions of the insulating spacer material layer 89 located on the contact-level dielectric layer 280 are merged into the contact-level dielectric layer 280. Alternatively, the insulating spacer material layer 89 may be removed from above the top surface of the contact-level dielectric layer 280 after deposition or after the step described below with regard to FIG. 54.

Figure 54:
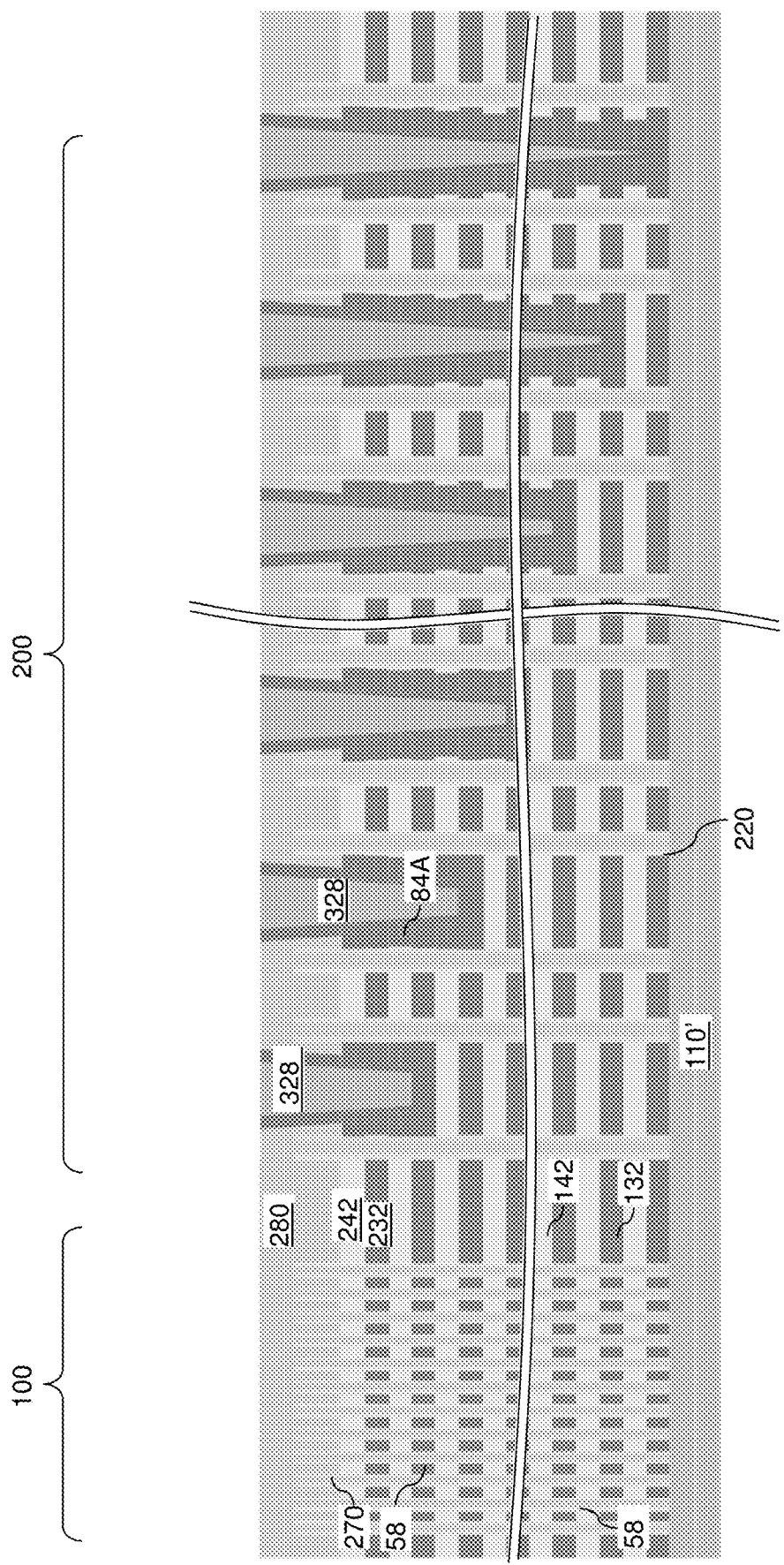

Referring to FIG. 54, a sacrificial via fill material is deposited in remaining unfilled volumes of the contact via cavities 85 (e.g., deposited on the insulating spacer material layer 89). The first sacrificial via fill material may comprise a semiconductor material, such as amorphous silicon, polysilicon, or a silicon-germanium alloy, or may comprise amorphous carbon, diamond-like carbon (DLC), borosilicate glass, organosilicate glass, or a polymer material. The sacrificial via fill material may be deposited by a conformal or non-conformal deposition process, or by spin-coating.

Excess portions of the sacrificial via fill material and the first insulating spacer material layer 89 located over the horizontal plane including the top surface of the contact-level dielectric layer 280 may be removed by a planarization process. The planarization process may be a chemical mechanical polishing (CMP) process and/or a recess etch process. Each remaining portion of the sacrificial via fill material constitutes a sacrificial via fill material portion 328. Portions of the insulating spacer material layer 89 may be removed from above the top surface of the contact-level dielectric layer 280 during the planarization step. Each remaining portion of the insulating spacer material layer 89 constitutes an insulating spacer 84A. Each contiguous combination of the sacrificial via fill material portion 328 and the insulating spacer 84A constitutes a via cavity fill structure (84A, 328). The sacrificial via fill material portion 328 is embedded within the insulating spacer 84A in each of the via cavity fill structures (84A, 328). The top surfaces of the sacrificial via fill material portion 328 and the top surfaces of the insulating spacers 84A can be located within a same horizontal plane as the top surface of the contact-level dielectric layer 280. The via cavity fill structure (84A, 328) completely fills the respective contact via cavity 85 without leaving any voids or gaps in the contact via cavity.

In one embodiment, each insulating spacer 84A comprises a straight cylindrical sidewall contacting a respective one of the sacrificial via fill material portions 328. Each insulating spacer 84A has an outer surface having a corrugated vertical cross-sectional profile in which first portions of the first insulating spacer 84A located at levels of the sacrificial material layers (142, 242) laterally protrude outward relative to second portions of the insulating spacer 84A located at levels of the insulating layers (132, 232).

In one embodiment, each of the first portions of the first insulating spacer 84A located at the levels of the sacrificial material layers comprises a respective outer sidewall segment that is laterally offset outward from an outer sidewall of a respective most proximate portion among the second portions of the insulating spacer 84A located at levels of the insulating layers 132 by a uniform lateral offset distance. One, and/or a plurality, and/or each, of the first portions of the insulating spacer 84 located at the levels of the first sacrificial material layers comprises an annular bottom surface that contacts a respective underlying insulating layer, and an annular top surface that contacts a respective overlying insulating layer (132, 232). In one embodiment, an outer periphery of the annular bottom surface is laterally offset outward from an inner periphery of the annular bottom surface by a uniform lateral offset distance, and an outer periphery of the annular top surface is laterally offset outward from an inner periphery of the annular top surface by the uniform lateral offset distance. In one embodiment, each of the first portions of the insulating spacer 84A may comprise an annular seam having an inner periphery that contacts a sidewall of the sacrificial via fill material portions 328 in each first via cavity fill structure (84A, 328).

Figure 55:
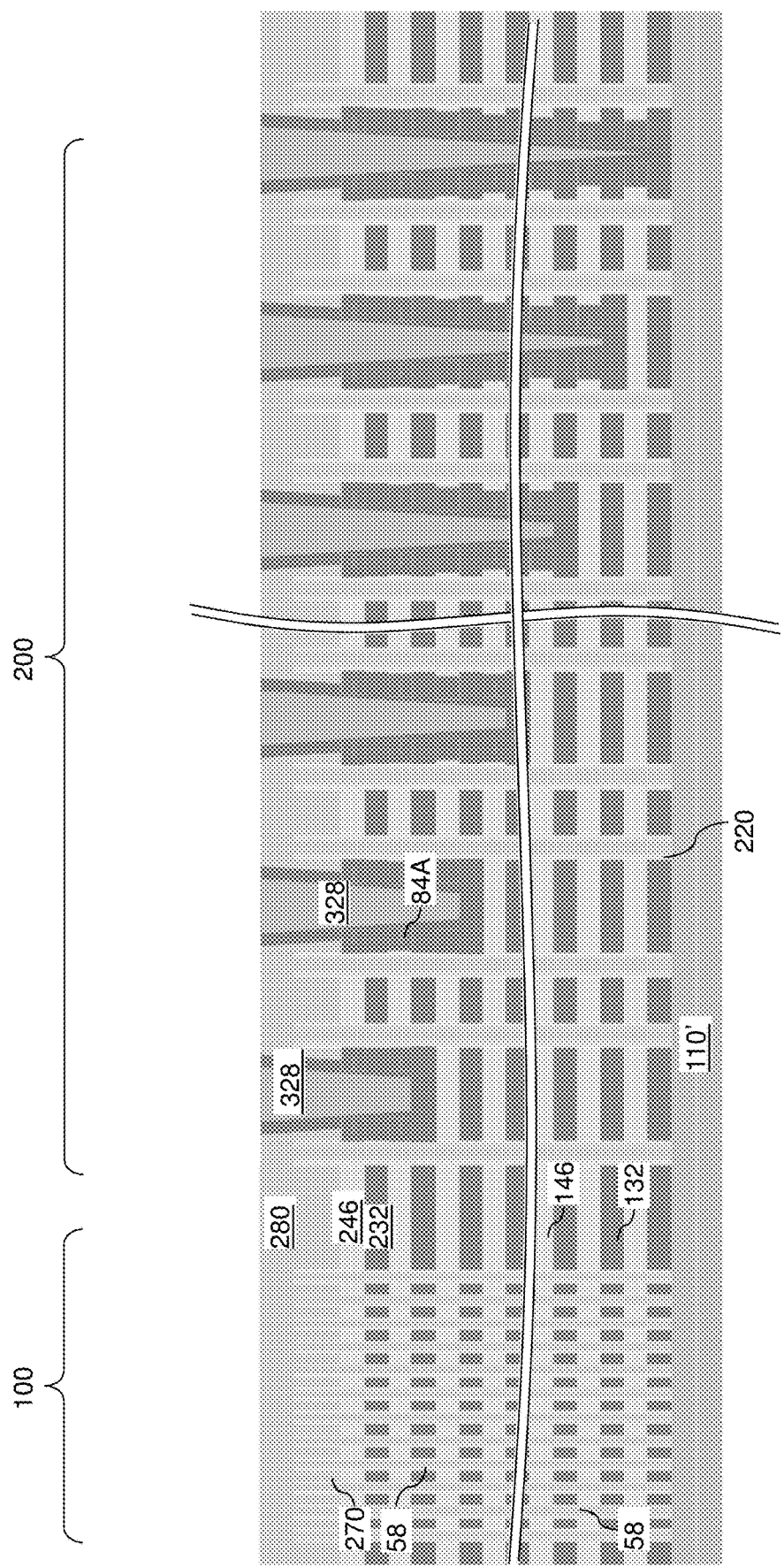

Referring to FIG. 55, the sacrificial material layers (142, 242) are replaced with the electrically conductive layers (146, 246), as described above with respect to FIG. 45 of the second embodiment.

Figure 56:
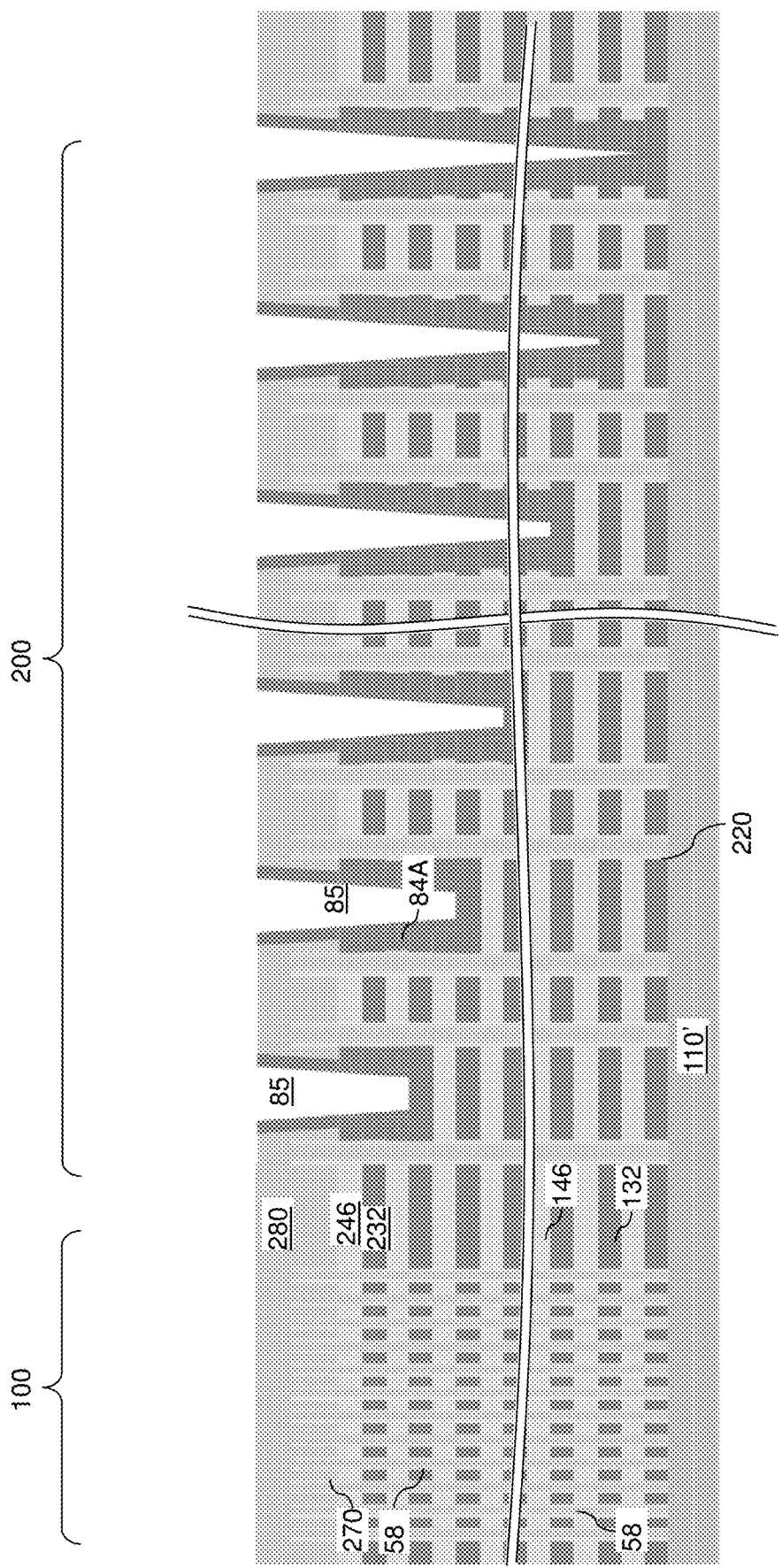

Referring to FIG. 56, the sacrificial via fill material portions 328 are removed selective to the materials of the first-tier alternating stack (132, 146), the second-tier alternating stack (232, 246), and the insulating spacers 84A by performing a selective etch process. The selective etch process may comprise an isotropic etch process or an anisotropic etch process.

For example, if the sacrificial via fill material portions 328 comprise polysilicon or amorphous silicon, then a wet etch process employing hot trimethyl-2 hydroxyethyl ammonium hydroxide ("hot TMY") or tetramethyl ammonium hydroxide (TMAH) may be performed to selectively remove the sacrificial via fill material portions 328. If the sacrificial via fill material portions 328 comprise amorphous carbon or diamond-like carbon (DLC), then an ashing process may be performed to remove the sacrificial via fill material portions 328.

Figure 57:
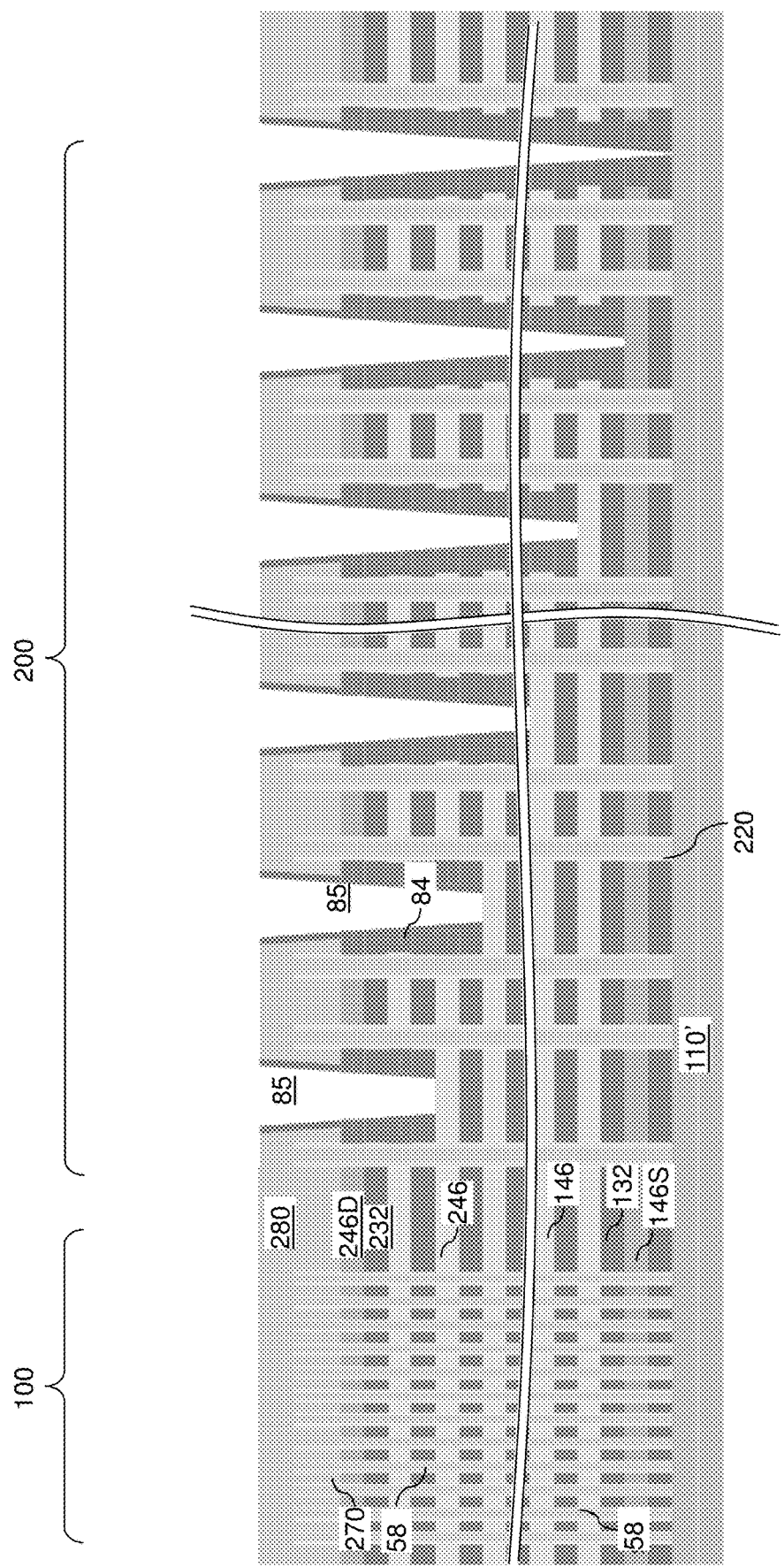

Referring to FIG. 57, an anisotropic etch process can be performed to etch a horizontal bottom portion of each of the insulating spacers 84A and portions of the insulating layer (132, 232) that underlies each of the insulating spacers 84A. The bottom surface of each insulating spacer 84A is etched through, to expose a top surface of a respective underlying insulating layer (132, 232). The etch process is then continued to etch through the respective underlying insulating layer (132, 232) to expose a top surface of a respective underlying electrically conductive layer (146, 246) to reform the contact via cavities 85. The remaining portions of the insulating spacers 84A comprise the above described tubular insulating spacers 84.

One or more bottommost electrically conductive layers 146S may function as source side select gate electrode(s). One or more topmost electrically conductive layers 246D may function as drain side select gate electrode(s). The remaining electrically conductive layers (146, 246) located between the select gate electrodes (146S, 246D) may function as word lines.

Figure 58:
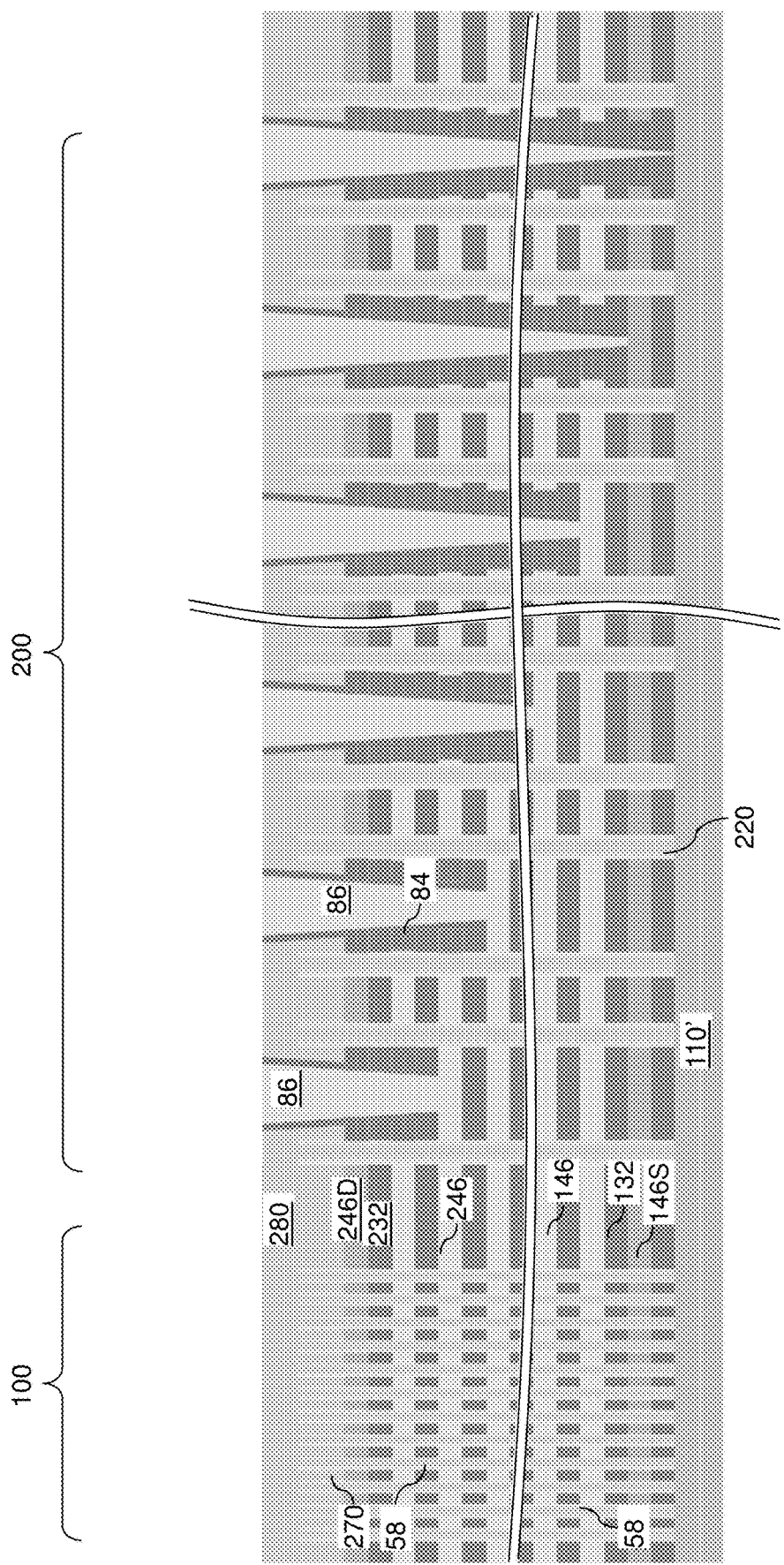

Referring to FIG. 58, at least one conductive material can be deposited in the contact via cavities 85. The at least one conductive material may comprise at least one metallic material such as a combination of a metallic nitride barrier material (such as TiN, TaN, WN, and/or MoN) and a metallic fill material (such as Cu, W, Ru, Mo, Co, etc.). Excess portions of the at least one conductive material can be removed from above the horizontal plane including the top surface of the contact-level dielectric layer 280 by a planarization process, which may comprise a chemical mechanical polishing (CMP) process or a recess etch process. Each remaining portion of the at least one conductive material that fills a respective contact via cavity 85 constitutes a contact via structure 86 contacting a respective one of the electrically conductive layers (146, 246) or a material layer within the source-level material layers 110.

Figure 59:
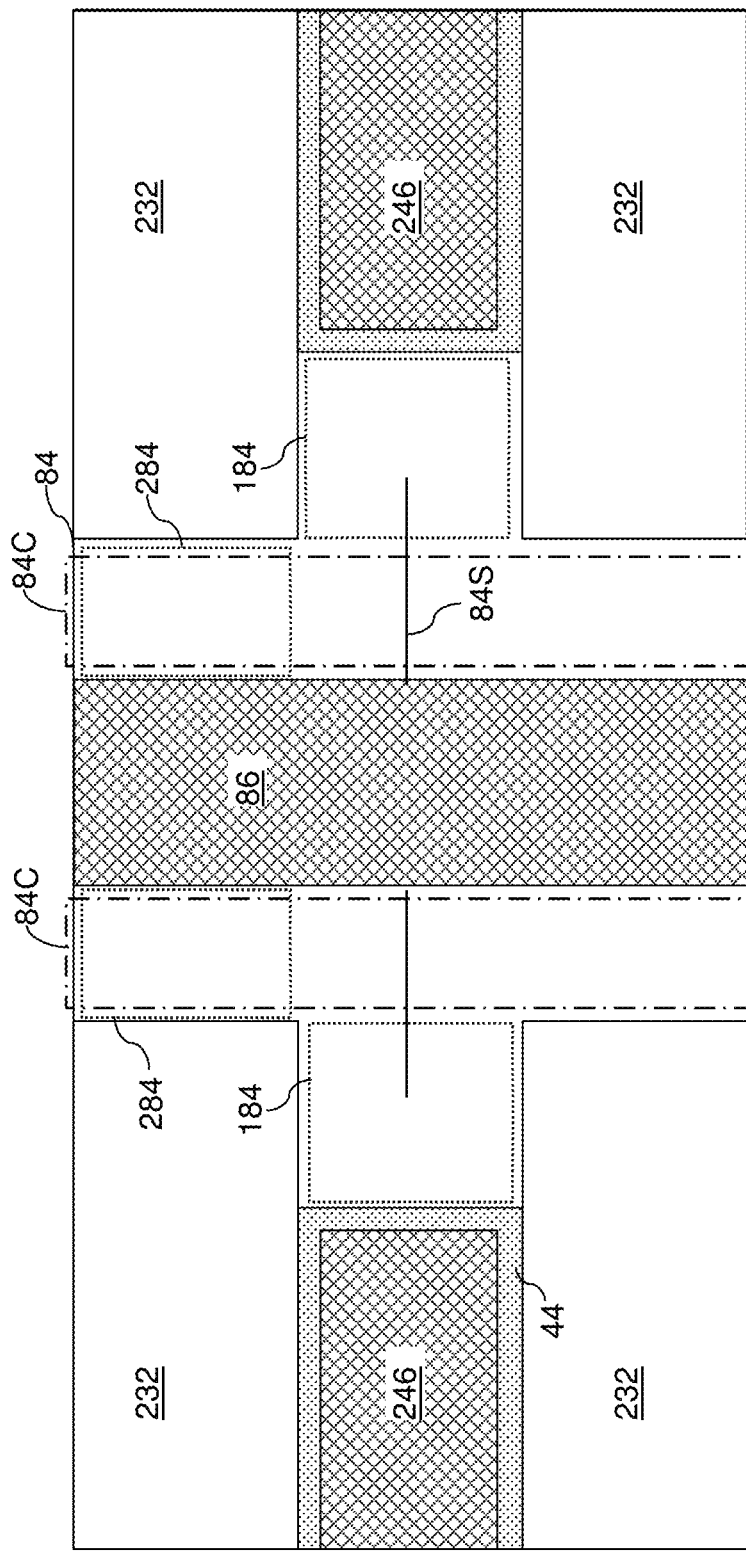
FIG. 59 is a magnified view of a region around a contact via structure in the third exemplary structure of FIG. 58.

Referring to FIG. 59, each contiguous combination of the contact via structure 86 and the tubular insulating spacer 84 comprises a laterally-isolated contact via assembly (84, 86). The tubular insulating spacer 84 within each of the laterally-isolated contact via assemblies has an outer surface having a corrugated vertical cross-sectional profile in which first portions 184 of the tubular insulating spacer 84 located at levels of the electrically conductive layers (146, 246) laterally protrude outward relative to second portions 284 of the tubular insulating spacer 84 located at levels of the insulating layers (132, 232). Thus, each tubular insulating spacer 84 comprises first portions shaped as laterally protruding fins 184 which protrude from a cylindrical central core 84C towards the electrically conductive layers (146, 246). The central core 84C surrounds the respective contact via structure 86.

In one embodiment, each of the first portions 184 of the tubular insulating spacers 84 in a given laterally-isolated via assembly comprises an annular seam 84S having an inner periphery that contacts the contact via structure 86 of the same laterally-isolated via assembly. A plurality of contact via structures 86 vertically extends through a bottom portion of a respective one of the tubular insulating spacers 84 directly on a top surface of a respective underlying one of the electrically conductive layers (146, 246).

Figure 60:
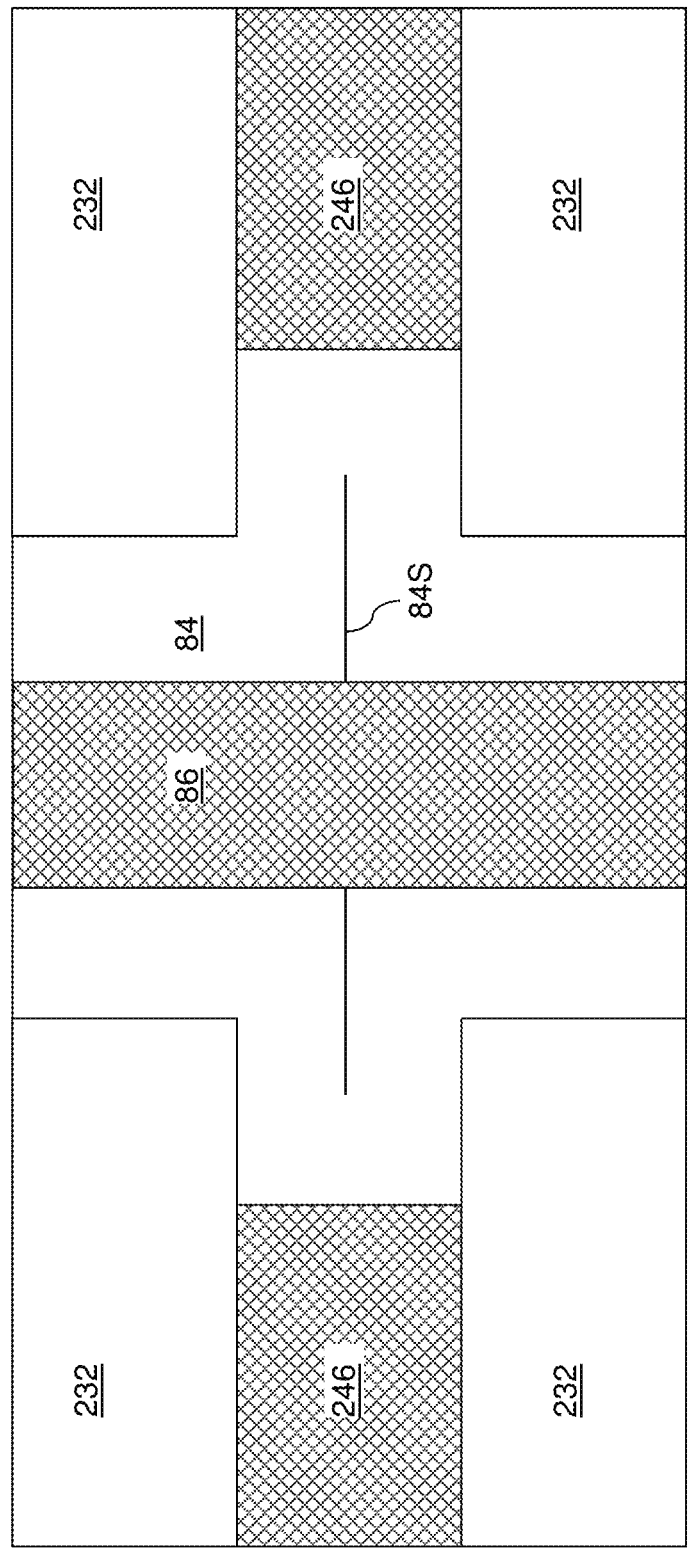
FIG. 60 is a magnified view a region around a contact via structure in an alternative configuration of the third exemplary structure according to an embodiment of the present disclosure.

Referring to FIG. 60, an alternative configuration of the third exemplary structure according to an embodiment of the present disclosure may be derived from the third exemplary structure illustrated in FIGS. 58 and 59 by omitting formation of the backside blocking dielectric layers 44.

Referring to FIGS. 50-60 and according to various embodiments of the present disclosure, a three-dimensional memory device comprises: an alternating stack of insulating layers (132, 232) and electrically conductive layers (146, 246) located over a substrate 8; memory openings 49 located in a memory array region 100 and vertically extending through the alternating stack {(132, 146), (232, 246)]; memory opening fill structures 58 located in the memory openings 49; and laterally-isolated contact via assemblies (84, 86) located in a contact region 200, wherein each of the laterally-isolated contact via assemblies (84, 86) comprises a contact via structure 86 contacting a top surface of a respective one of the electrically conductive layers (146, 246) and an insulating spacer 84 laterally surrounding the contact via structure 86 and having an outer surface having a corrugated vertical cross-sectional profile in which first portions 184 of the insulating spacer 84 located at levels of the electrically conductive layers (146, 246) laterally protrude outward relative to second portions 284 of the insulating spacer 84 located at levels of the insulating layers (132, 232).

In one embodiment, the insulating spacer 84 of each of the laterally-isolated contact via assemblies (84, 86) comprises a straight cylindrical inner sidewall that vertically extends from a bottom surface of the insulating spacer 84 to a top surface of the insulating spacer 84.

In one embodiment, the insulating spacer 84 of each of the laterally-isolated contact via assemblies (84, 86) comprises an annular bottom surface that contacts the top surface of the respective one of the insulating layers (132, 232) contacting the top surface of the respective one of the electrically conductive layers (146, 246).

In one embodiment, the insulating spacer 84 of each of the laterally-isolated contact via assemblies (84, 86) comprises an annular top surface located within a horizontal plane including top surfaces of the contact via structures 86 of the laterally-isolated contact via assemblies (84, 86).

In one embodiment, each of the first portions 184 of the insulating spacer 84 located at the levels of the electrically conductive layers (146, 246) comprises a respective outer sidewall segment that is laterally offset outward from an outer sidewall of the second portions 284 of the insulating spacer 84 located at the levels of the insulating layers (132, 232).

In one embodiment, one, and/or a plurality, and/or each, of the first portions 184 of the insulating spacer 84 located at the levels of the electrically conductive layers (146, 246) comprises: an annular bottom surface that contacts a respective underlying insulating layer (132, 232) of the insulating layers (132, 232) of the alternating stack {(132, 146), (232, 246)}; and an annular top surface that contacts a respective overlying insulating layer (132, 232) of the insulating layers (132, 232) of the alternating stack {(132, 146), (232, 246)}. In one embodiment, the first portions 184 of the insulating spacer comprise fins which laterally extend from a central core 84C of the insulating spacer 84 which surrounds the contact via structure 86.

In one embodiment, one of the laterally-isolated contact via assemblies (84, 86) vertically extends through each layer within the alternating stack {(132, 146), (232, 246)} and contacts a top surface of a semiconductor material layer (which may be, for example, an upper source-level semiconductor layer 116 or a source-select-level conductive layer 118) underlying the alternating stack {(132, 146), (232, 246)}.

In one embodiment, each of the memory opening fill structures 58 comprises a respective vertical semiconductor channel 60 and a respective memory film 50. Support pillar structures 220 may be located in the contact region 200, and may vertically extend through each layer within the alternating stack {(132, 146), (232, 246)}.

In one embodiment, each of the laterally-isolated contact via assemblies (84, 86) vertically extends through a respective set of openings through and is entirely laterally surrounded by a respective subset of the electrically conductive layers (146, 246) in the alternating stack {(132, 146), (232, 246)} and a respective subset of the insulating layers (132, 232) within the alternating stack {(132, 146), (232, 246)}. In one embodiment, the contact region 200 lacks a staircase in which the length of the electrically conductive layers (146, 246) decreases with increasing height from the substrate 8.

In one embodiment, the three-dimensional memory device comprises backside blocking dielectric layers 44 located between each vertically neighboring pair of an insulating layer (132, 232) and an electrically conductive layer (146, 246) within the alternating stack {(132, 146), (232, 246)}, wherein each of the laterally-isolated contact via assemblies (84, 86) contacts and extends through a respective subset of the backside blocking dielectric layers 44.

In one embodiment, each of the laterally-isolated contact via assemblies (84, 86) contacts and extends through at least one cylindrical sidewall of a respective subset of the electrically conductive layers (146, 246).

In one embodiment, each of the first portions 184 of the insulating spacer 84 of each of the laterally-isolated contact via assemblies (84, 86) comprises an annular seam 84S having an inner periphery that contacts the contact via structure 86 of a respective one of the laterally-isolated via assemblies (84, 86).

The corrugated vertical cross-sectional profile of the outer sidewalls of the insulating spacers 84 of the third embodiment can increase the lateral distance between the electrically conductive layers (146, 246) of the alternating stack {(132, 146), (232, 246)} and a respective contact via structure 86, and decreases the probability of electrical shorts between the electrically conductive layers (146, 246) and the contact via structures 86, thereby increasing the device reliability and yield.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and electrically conductive layers located over a substrate;
    memory openings located in a memory array region and vertically extending through the alternating stack;
    memory opening fill structures located in the memory openings; and
    laterally-isolated contact via assemblies located in a contact region, wherein each of the laterally-isolated contact via assemblies comprises a contact via structure contacting a top surface of a respective one of the electrically conductive layers and an insulating spacer laterally surrounding the contact via structure and having an outer surface having a corrugated vertical cross-sectional profile in which first portions of the insulating spacer located at levels of the electrically conductive layers laterally protrude outward relative to second portions of the insulating spacer located at levels of the insulating layers.

2. The three-dimensional memory device of claim 1, wherein the insulating spacer of each of the laterally-isolated contact via assemblies comprises a straight cylindrical inner sidewall that vertically extends from a bottom surface of the insulating spacer to a top surface of the insulating spacer.

3. The three-dimensional memory device of claim 1, wherein the insulating spacer of each of the laterally-isolated contact via assemblies comprises an annular bottom surface that contacts the top surface of the respective one of the insulating layers contacting the top surface of the respective one of the electrically conductive layers.

4. The three-dimensional memory device of claim 1, wherein the insulating spacer of each of the laterally-isolated contact via assemblies comprises an annular top surface located within a horizontal plane including top surfaces of the contact via structures of the laterally-isolated contact via assemblies.

5. The three-dimensional memory device of claim 1, wherein each of the first portions of the insulating spacer comprises a respective outer sidewall segment that is laterally offset outward from an outer sidewall of the second portions of the insulating spacer.

6. The three-dimensional memory device of claim 1, wherein one of the first portions of the insulating spacer comprises:
an annular bottom surface that contacts a respective underlying insulating layer of the insulating layers of the alternating stack; and
an annular top surface that contacts a respective overlying insulating layer of the insulating layers of the alternating stack.

7. The three-dimensional memory device of claim 6, wherein the first portions of the insulating spacer comprise fins which laterally extend from a central core of the insulating spacer which surrounds the contact via structure.

8. The three-dimensional memory device of claim 1, wherein one of the laterally-isolated contact via assemblies vertically extends through each layer within the alternating stack and contacts a top surface of a semiconductor material layer underlying the alternating stack.

9. The three-dimensional memory device of claim 1, further comprising support pillar structures located in the contact region and vertically extending through each layer within the alternating stack.

10. The three-dimensional memory device of claim 1, wherein the contact region lacks a staircase in which the length of the electrically conductive layers decreases with increasing height from the substrate.

11. The three-dimensional memory device of claim 1, wherein each of the laterally-isolated contact via assemblies vertically extends through a respective set of openings through and is entirely laterally surrounded by a respective subset of the electrically conductive layers in the alternating stack and a respective subset of the insulating layers within the alternating stack.

12. The three-dimensional memory device of claim 11, further comprising backside blocking dielectric layers located between each vertically neighboring pair of an insulating layer and an electrically conductive layer within the alternating stack, wherein each of the laterally-isolated contact via assemblies contacts and extends through a respective subset of the backside blocking dielectric layers.

13. The three-dimensional memory device of claim 1, wherein each of the laterally-isolated contact via assemblies contacts and extends through at least one cylindrical sidewall of a respective subset of the electrically conductive layers.

14. The three-dimensional memory device of claim 1, wherein each of the first portions of the insulating spacer of each of the laterally-isolated contact via assemblies comprises an annular seam having an inner periphery that contacts the contact via structure of a respective one of the laterally-isolated via assemblies.

15. A method of forming a three-dimensional memory device, comprising:
forming an alternating stack of insulating layers and sacrificial material layers over a substrate;
forming memory openings through the alternating stack in a memory array region;
forming memory opening fill structures comprising a memory film and a vertical semiconductor channel in the memory openings;
forming via cavities in a contact region through a respective subset of layers within the alternating stack by performing anisotropic etch processes;
forming via cavity fill structures in the via cavities, wherein each of the via cavity fill structures comprises an insulating spacer and a sacrificial via fill material portion embedded within the insulating spacer which completely fill the via cavities;
replacing the sacrificial material layers with electrically conductive layers while the via cavities are completely filled with the via cavity fill structures;
removing the sacrificial via fill material portions selective to the insulating spacers; and
forming contact via structures vertically extending through a bottom portion of a respective one of the insulating spacers to a top surface of a respective underlying one of the electrically conductive layers.

16. The method of claim 15, further comprising forming annular recess cavities by laterally expanding the via cavities at levels of the sacrificial material layers using a selective isotropic etch process that etches a material of the sacrificial material layers selective to a material of the insulating layers.

17. The method of claim 16, further comprising anisotropically etching the insulating spacers after removing the sacrificial via fill material portions to extend a volume of each void laterally enclosed by a respective one of the insulating spacers through a respective underlying insulating layer of the insulating layers to expose a top surface of a respective underlying electrically conductive layer of the electrically conductive layers.

18. The method of claim 16, wherein the via cavity fill structures are formed by:
conformally depositing an insulating spacer material layer in the annular recess cavities and peripheral regions of the via cavities;
depositing a sacrificial via fill material layer in remaining volumes of the via cavities over the insulating spacer material layer; and
removing portions of the sacrificial via fill material layer and the insulating spacer material layer from above the memory opening fill structures.

19. The method of claim 16, wherein each contiguous combination of a contact via structure and an insulating spacer comprises a laterally-isolated contact via assembly.

20. The method of claim 19, wherein the insulating spacer within each of the laterally-isolated contact via assemblies has an outer surface having a corrugated vertical cross-sectional profile in which first portions of the insulating spacer located at levels of the electrically conductive layers laterally protrude outward relative to second portions of the insulating spacer located at levels of the insulating layers.

* * * * *